United States Patent
Yoshida

(10) Patent No.: US 12,174,132 B2
(45) Date of Patent: Dec. 24, 2024

(54) NITRIDE SEMICONDUCTOR SUBSTRATE, LAMINATED STRUCTURE, AND METHOD FOR MANUFACTURING NITRIDE SEMICONDUCTOR SUBSTRATE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/768,464

(22) PCT Filed: Oct. 9, 2020

(86) PCT No.: PCT/JP2020/038269
§ 371 (c)(1),
(2) Date: Apr. 12, 2022

(87) PCT Pub. No.: WO2021/075369
PCT Pub. Date: Apr. 22, 2021

(65) Prior Publication Data
US 2024/0302302 A1    Sep. 12, 2024

(30) Foreign Application Priority Data
Oct. 18, 2019 (JP) ................. 2019-190785

(51) Int. Cl.
*G01N 23/207* (2018.01)
*G01N 23/20008* (2018.01)
*H01L 21/304* (2006.01)

(52) U.S. Cl.
CPC ..... *G01N 23/207* (2013.01); *G01N 23/20008* (2013.01); *H01L 21/304* (2013.01); *G01N 2223/1016* (2013.01)

(58) Field of Classification Search
CPC ........... G01N 23/207; G01N 23/20008; H01L 21/304
See application file for complete search history.

(56) References Cited

U.S. PATENT DOCUMENTS 10,978,296 B2 *  4/2021  Yoshida .......... H01L 21/02005
2001/0000733 A1   5/2001  Tomioka
(Continued)

FOREIGN PATENT DOCUMENTS

JP    2001-168045 A    6/2001
JP    2013-060349 A    4/2013
(Continued)

OTHER PUBLICATIONS

International Searching Authority, "International Search Report," issued in connection with International Patent Application No. PCT/JP2020/038269, dated Jan. 12, 2021.
(Continued)

*Primary Examiner* — David P Porta
*Assistant Examiner* — Meenakshi S Sahu
(74) *Attorney, Agent, or Firm* — Foley & Lardner LLP

(57) ABSTRACT

A nitride semiconductor substrate that has a diameter of 2 inches or more and includes a main surface for which the closest low index crystal plane is a (0001) plane. The ratio of $FWHM1_{\{10\text{-}12\}}$ to $FWHM2_{\{10\text{-}12\}}$ is 80% or more.

9 Claims, 24 Drawing Sheets

(56) References Cited

U.S. PATENT DOCUMENTS

2013/0072005 A1    3/2013  Fujikura
2019/0198312 A1    6/2019  Yoshida et al.
2021/0355601 A1   11/2021  Yoshida

FOREIGN PATENT DOCUMENTS

JP      2019-112266 A      7/2019
JP         6595731 B1     10/2019
WO   WO-2020/158571 A1    8/2020

OTHER PUBLICATIONS

International Searching Authority, "Written Opinion," issued in connection with International Patent Application No. PCT/JP2020/038269, dated Jan. 12, 2021.

International Preliminary Report on Patentability received in PCT Application No. PCT/JP2020/038269 dated Apr. 28, 2022, translated.

\* cited by examiner

Sample 2

Sample 3

FIG. 21 (a) Sample 1
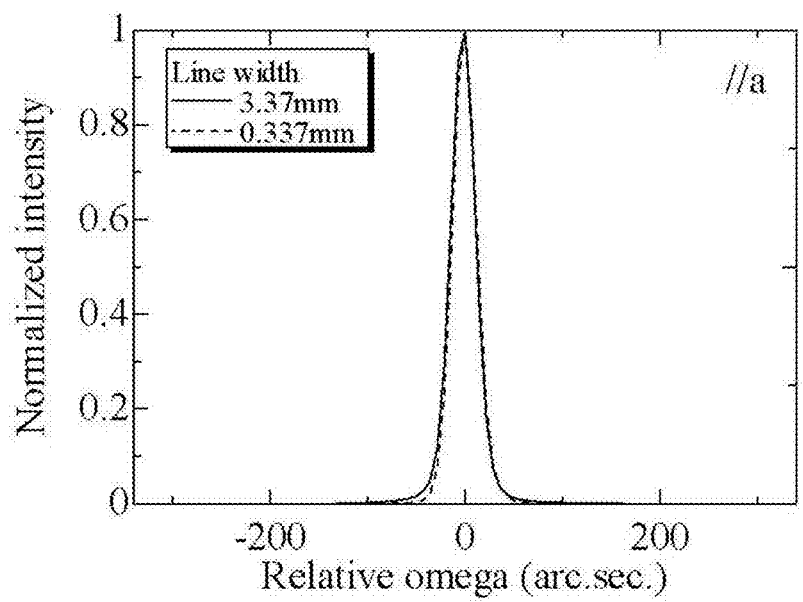
FIG. 21 (b) Sample 4 : Equivalent of base substrate
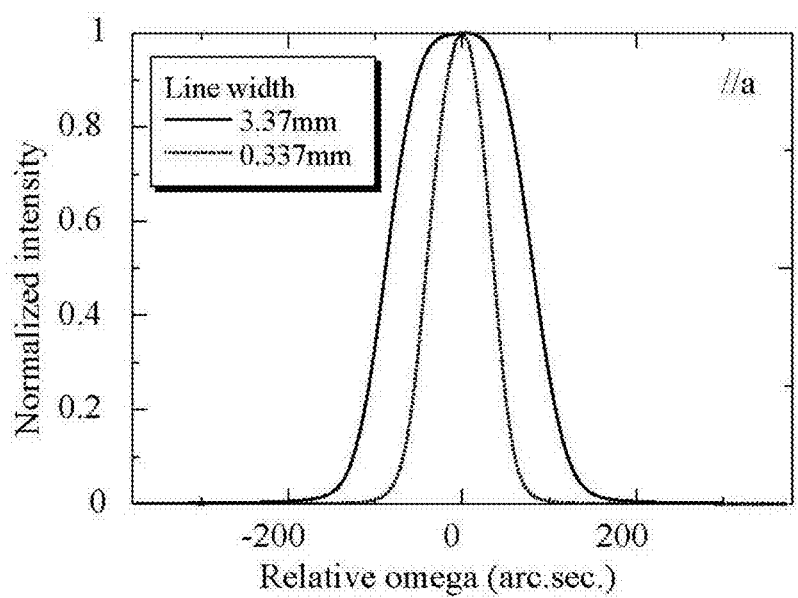

Sample 1 a = Wide measurement region
b = Narrow measurement region

Sample 3 a = Wide measurement region
b = Narrow measurement region

Sample 4 (Equivalent of base substrate)

a = Wide measurement region
b = Narrow measurement region

NITRIDE SEMICONDUCTOR SUBSTRATE, LAMINATED STRUCTURE, AND METHOD FOR MANUFACTURING NITRIDE SEMICONDUCTOR SUBSTRATE

CROSS-REFERENCE TO RELATED APPLICATIONS

The present application claims priority under 37 U.S.C. § 371 to International Patent Application No. PCT/JP2020/038269, filed Oct. 9, 2020, which claims priority to and the benefit of Japanese Patent Application No. 2019-190785, filed on Oct. 18, 2019. The contents of these applications are hereby incorporated by reference in their entireties.

TECHNICAL FIELD

The present disclosure relates to a nitride semiconductor substrate, a laminated structure, and a method for manufacturing a nitride semiconductor substrate.

BACKGROUND ART

In a conventionally known technique, a substrate that is constituted by a single crystal of a group III nitride semiconductor is used as a base substrate (seed substrate), and a crystal layer that is constituted by a single crystal of a group III nitride semiconductor is further grown on a main surface of the base substrate for which the closest low index crystal plane is a (0001) plane. According to this technique, at least one nitride semiconductor substrate can be obtained by slicing the crystal layer grown to a predetermined thickness (for example, Patent Document 1).

CITATION LIST

Patent Documents

Patent Document 1: Japanese Patent Application Laid-Open Publication No. 2013-60349

SUMMARY OF INVENTION

Technical Problem

An object of the present disclosure is to improve crystal quality of a nitride semiconductor substrate.

Solution to Problem

According to an aspect of the present disclosure,
provided is a nitride semiconductor substrate that has a diameter of 2 inches or more and includes a main surface for which the closest low index crystal plane is a (0001) plane,
wherein the ratio of $FWHM2_{\{10\text{-}12\}}$ to $FWHM1_{\{10\text{-}12\}}$ is 80% or more,
$FWHM1_{\{10\text{-}12\}}$ and $FWHM2_{\{10\text{-}12\}}$ each representing a full width at half maximum of{10-12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis,
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction,
$FWHM2_{\{10\text{-}12\}}$ being measured under the same incident conditions as those in the measurement of $FWHM1_{\{10\text{-}12\}}$, and
$FWHM2_{\{10\text{-}12\}}$ being measured under the following beam receiving conditions: X-rays are received by the detector via a 3-bounce Ge (220) analyzer crystal that includes an inlet aperture having a width of 6.54 mm in the ω direction.

According to another aspect of the present disclosure,
provided is a nitride semiconductor substrate that has a diameter of 2 inches or more and includes a main surface for which the closest low index crystal plane is a (0001) plane, wherein, when diffractions are measured with respect to equivalent crystal planes that are represented as {10-12} planes from three directions rotated by 60° from each other in a circumferential direction about the normal at the center of the main surface, a difference between the largest value of $FWHM1_{\{10\text{-}12\}}$ and the smallest value of $FWHM1_{\{10\text{-}12\}}$ is 9 arcsecs or less.

According to another aspect of the present disclosure,
provided is a nitride semiconductor substrate that has a diameter of 2 inches or more and includes a main surface for which the closest low index crystal plane is a (0001) plane,
wherein $FWHM1_{\{10\text{-}12\}}$ is 50 arcsecs or less.

According to another aspect of the present disclosure,
provided is a laminated structure including:
a base substrate that is constituted by a single crystal of a group III nitride semiconductor, has a mirror-finished main surface, and in which a low index crystal plane closest to the main surface is a (0001) plane;
a laminated unit that includes a low oxygen concentration region and a high oxygen concentration region, the low oxygen concentration region being provided above the main surface of the base substrate and constituted by a single crystal of a group III nitride semiconductor, the high oxygen concentration region being provided on the low oxygen concentration region and constituted by a single crystal of a group III nitride semiconductor; and
a top low oxygen concentration region that is provided above the laminated unit and is constituted by a single crystal of a group III nitride semiconductor,
wherein the oxygen concentration in the high oxygen concentration region is higher than oxygen concentrations in the low oxygen concentration region and the top low oxygen concentration region, and a plurality of the laminated units are provided repeatedly in a thickness direction between the base substrate and the top low oxygen concentration region.

According to another aspect of the present disclosure,
provided is a method for manufacturing a nitride semiconductor substrate using a vapor phase growth method, the method including:
a step (a) of preparing a base substrate that is constituted by a single crystal of a group III nitride semiconductor, has a mirror-finished main surface, and in which a low index crystal plane closest to the main surface is a (0001) plane;

a step (b) of homoepitaxially growing a single crystal of a group III nitride semiconductor above the main surface such that the crystal becomes flat;

a step (c) of growing a three-dimensional growth layer by generating a plurality of recessed portions formed by inclined interfaces other than a (0001) plane in a surface of the homoepitaxially grown flat crystal, and gradually expanding the inclined interfaces as the crystal growth progresses to make the (0001) plane disappear at least once from crystal growth interfaces; and a step (d) of growing a flattening layer that includes a mirror-finished surface constituted by a (0001) plane by further epitaxially growing a single crystal of a group III nitride semiconductor on the three-dimensional growth layer to make inclined interfaces disappear, wherein a cycle that includes the step (c) and the step (d) is performed a plurality of times.

Advantageous Effects of Invention

According to the present disclosure, crystal quality of a nitride semiconductor substrate can be improved.

BRIEF DESCRIPTION OF DRAWINGS

FIGS. 21(a) and (b) are diagrams showing normalized X-ray diffraction patterns of nitride semiconductor substrates of samples 1 and 4, respectively, obtained through X-ray rocking curve measurement of (0002) plane diffraction in which an incident side slit was varied.

DESCRIPTION OF EMBODIMENTS

Embodiment of the Present Disclosure

Hereinafter, an embodiment of the present disclosure will be described with reference to the drawings.

(1) Method for Manufacturing a Nitride Semiconductor Substrate

Figure 1:
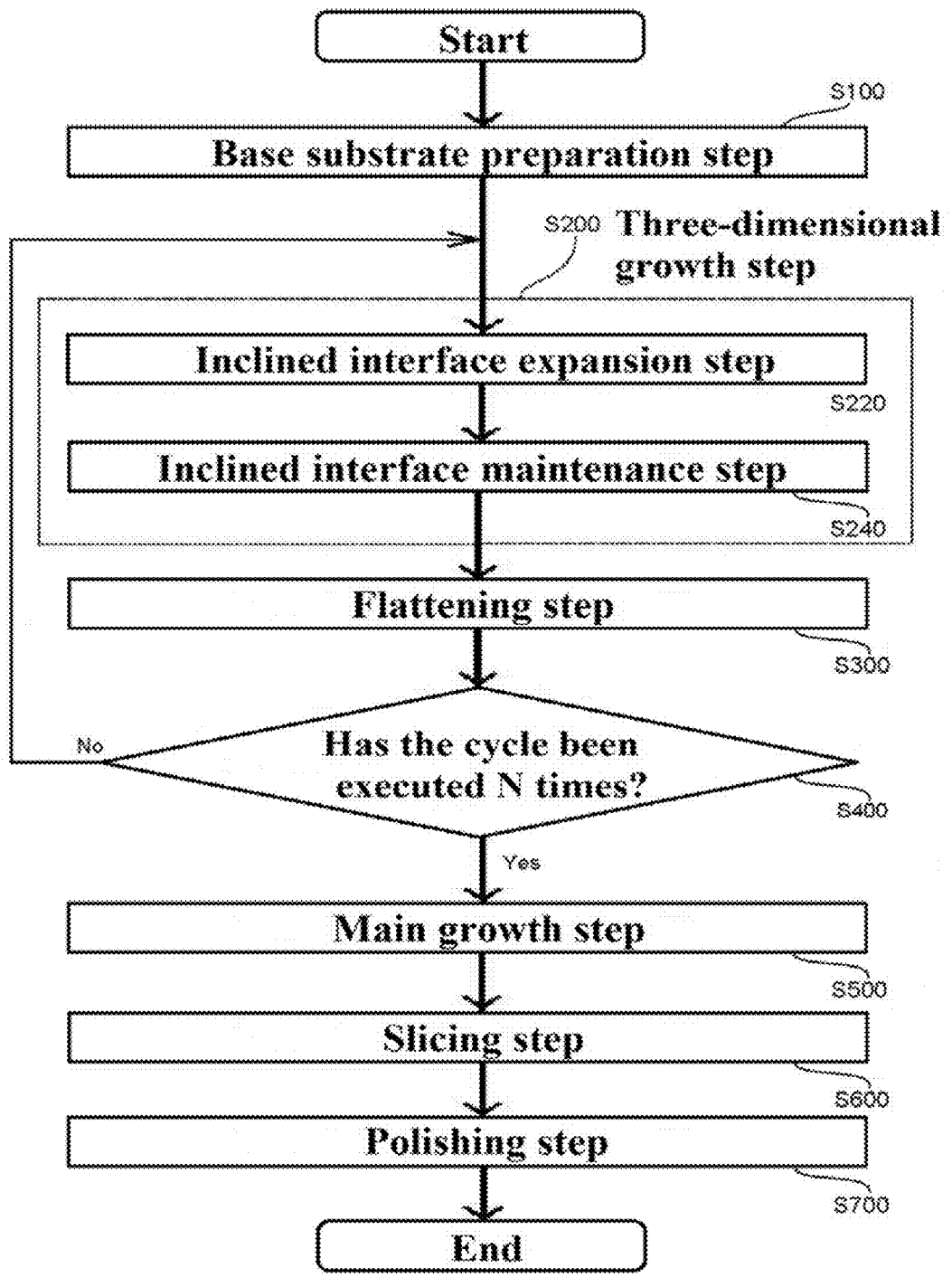
FIG. 1 is a flowchart illustrating a method for manufacturing a nitride semiconductor substrate according to an embodiment of the present disclosure.
Figure 2:
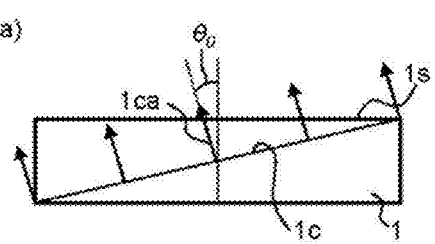
FIGS. 2(a) to 2(g) are schematic cross-sectional views illustrating a part of the method for manufacturing a nitride semiconductor substrate according to the embodiment of the present disclosure.
Figure 2E:
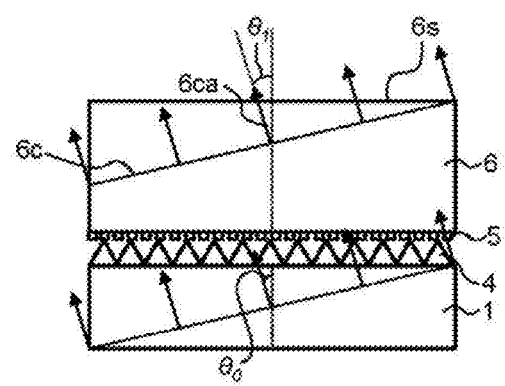
Figure 2:
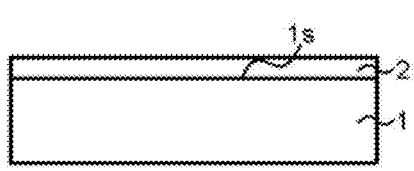
Figure 2:
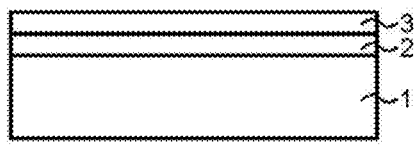
Figure 2:
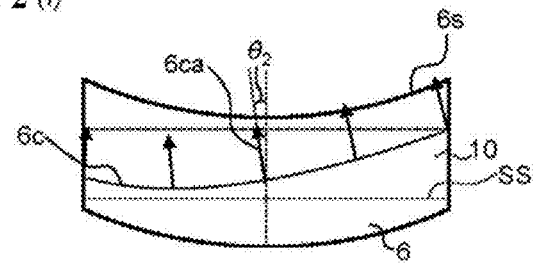
Figure 2:
Figure 2:
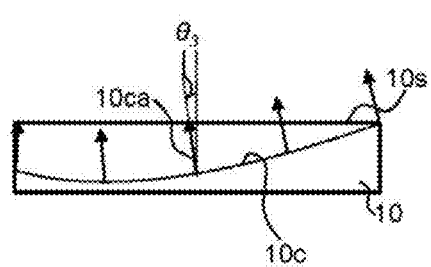
Figure 4:
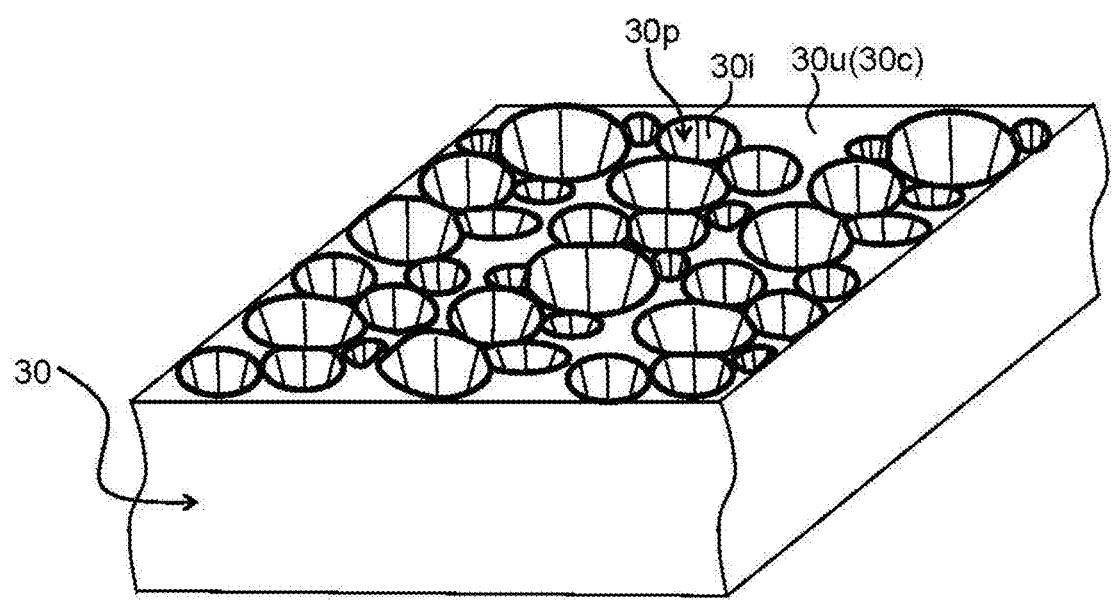
FIG. 4 is a schematic perspective view illustrating a part of the method for manufacturing a nitride semiconductor substrate according to the embodiment of the present disclosure.
Figure 5A:
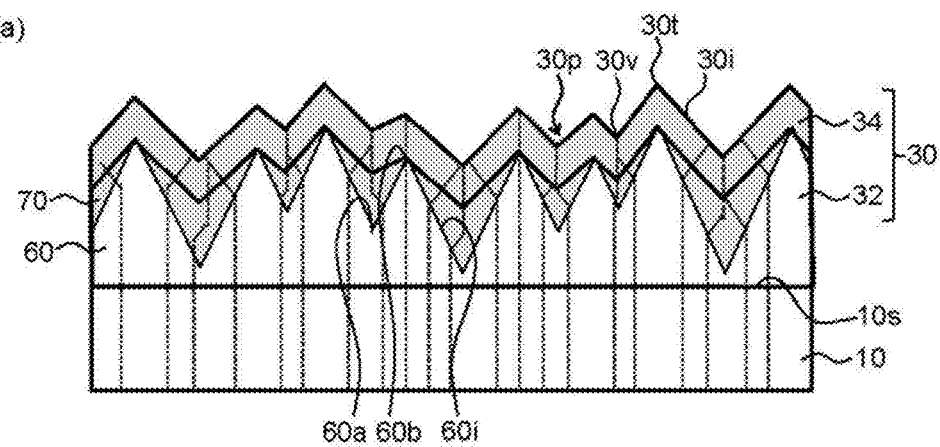
FIGS. 5(a) and 5(b) are schematic cross-sectional views illustrating a part of the method for manufacturing a nitride semiconductor substrate according to the embodiment of the present disclosure.
Figure 5B:
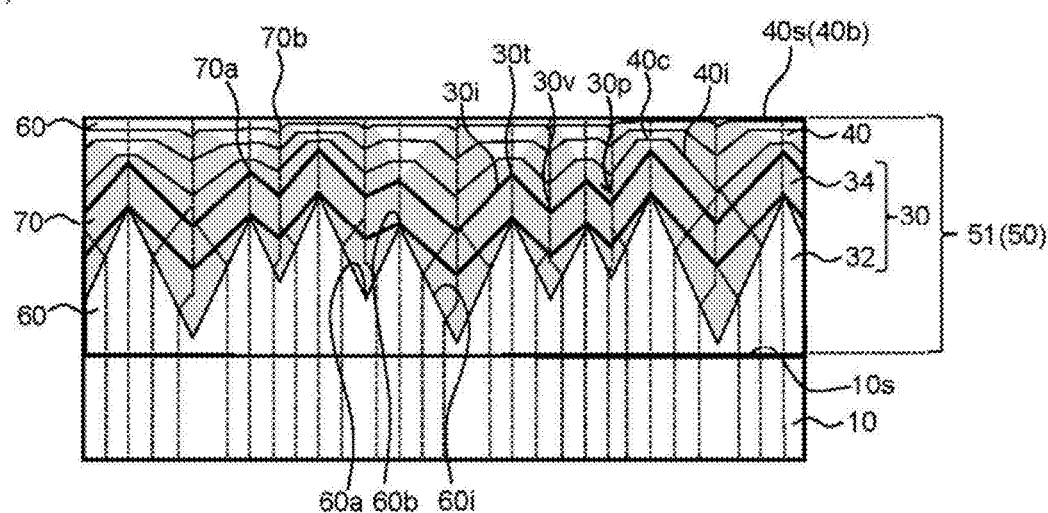

A method for manufacturing a nitride semiconductor substrate according to the present embodiment will be described with reference to FIGS. 1 to 9. FIG. 1 is a flowchart illustrating the method for manufacturing a nitride semiconductor substrate according to the present embodiment. FIGS. 2(a) to 2(g), FIGS. 3(a) to 3(c), FIGS. 5(a) to 6(b), and FIGS. 7 to 9 are schematic cross-sectional views each illustrating a part of the method for manufacturing a nitride semiconductor substrate according to the present embodiment. FIG. 4 is a schematic perspective view illustrating a part of the method for manufacturing a nitride semiconductor substrate according to the present embodiment. FIG. 4 corresponds to a perspective view at a time point of FIG. 3(b), and illustrates a part of a three-dimensional growth layer 30 grown on a base substrate 10. In FIG. 5(b), a thin solid line shows a crystal plane in a process of growth, and in FIGS. 3(c) to 6(b) and FIGS. 7 to 9, a dotted line shows a dislocation.

The method for manufacturing a nitride semiconductor substrate according to the present embodiment is
a method for manufacturing a nitride semiconductor substrate using a vapor phase growth method, the method including:
a step (a) of preparing a base substrate that is constituted by a single crystal of a group III nitride semiconductor, has a mirror-finished main surface, and in which a low index crystal plane closest to the main surface is a (0001) plane;
a step (b) of growing a three-dimensional growth layer by epitaxially growing a single crystal of a group III nitride semiconductor that has a top surface at which a (0001) plane is exposed, above the main surface of the base substrate, generating a plurality of recessed portions formed by inclined interfaces other than the (0001) plane in the top surface, and gradually expanding the inclined interfaces toward an upper side of the main surface of the base substrate to make the (0001) plane disappear from the top surface at least once; and
a step (c) of growing a flattening layer that has a mirror-finished surface by epitaxially growing a single crystal of a group III nitride semiconductor on the three-dimensional growth layer to make the inclined interfaces disappear,
wherein a cycle including the steps (b) and (c) are performed a plurality of times.

Specifically, as illustrated in FIG. 1, the method for manufacturing a nitride semiconductor substrate according to the present embodiment includes, for example, a base substrate preparation step S100, a three-dimensional growth step S200, a flattening step S300, an execution count determination step S400, a main growth step S500, a slicing step S600, and a polishing step S700.

S100: Base Substrate Preparation Step

First, in the base substrate preparation step S100, a base substrate 10 that is constituted by a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, a <0001> axis (for example, [0001] axis) is referred to as a "c-axis", and a (0001) plane is referred to as a "c-plane". The (0001) plane may be referred to as a "+c plane (group III element polar plane)", and a (000–1) plane may be referred to as a "–c plane (nitrogen (N) polar plane)". Further, a <1–100> axis (for example, [1–100] axis) is referred to as an "m-axis", and a {1–100} plane is referred to as an "m-plane". The m-axis may be expressed as a <10–10> axis. Further, a <11–20> axis (for example, [11-20] axis) is referred to as an "a-axis", and a {11–20} plane is referred to as an "a-plane".

In the base substrate preparation step S100 of the present embodiment, for example, the base substrate 10 is prepared by a VAS (Void-Assisted Separation) method.

Specifically, the base substrate preparation step S100 includes, for example, a crystal growth substrate preparation step S110, a first crystal layer forming step S120, a metal layer forming step S130, a void forming step S140, a second crystal layer forming step S150, a peeling step S160, a slicing step S170, and a polishing step S180.

S110: Crystal Growth Substrate Preparation Step

First, as illustrated in FIG. 2(a), a crystal growth substrate 1 (hereinafter may be abbreviated as a "substrate 1") is prepared. The substrate 1 is, for example, a sapphire substrate. Also, the substrate 1 may be, for example, a Si substrate or a gallium arsenide (GaAs) substrate. The substrate 1 has, for example, a main surface 1s which serves as a growth surface. A low index crystal plane that is closest to the main surface 1s is, for example, a c-plane 1c.

In the present embodiment, the c-plane 1c of the substrate 1 is inclined with respect to the main surface 1s. A c-axis 1ca of the substrate 1 is inclined at a predetermined off-angle $\theta_0$ with respect to the normal of the main surface 1s. The off-angle $\theta_0$ in the main surface 1s of the substrate 1 is uniform over the entire main surface 1s. The off-angle $\theta_0$ in the main surface 1s of the substrate 1 affects an off-angle $\theta_3$ at the center of a main surface 10s of the base substrate 10, which will be described later.

S120: First Crystal Layer Forming Step

Next, as illustrated in FIG. 2(b), for example, a low-temperature growth GaN buffer layer and a Si-doped GaN layer are grown in this order as a first crystal layer (underground growth layer) 2 on the main surface 1s of the substrate 1, by supplying trimethylgallium (TMG) gas as a group III source gas, ammonia gas ($NH_3$) as a nitrogen source gas, and monosilane ($SiH_4$) gas as an n-type dopant gas, to the substrate 1 that is heated to a predetermined growth temperature, by a metalorganic vapor phase growth (MOVPE) method. At this time, the thickness of the low-temperature growth GaN buffer layer and the thickness of the Si-doped GaN layer are, for example, 20 nm and 0.5 μm, respectively.

S130: Metal Layer Forming Step

Next, as illustrated in FIG. 2(c), a metal layer 3 is deposited on the first crystal layer 2. The metal layer 3 is, for example, a titanium (Ti) layer. Further, the thickness of the metal layer 3 is, for example, 20 nm.

S140: Void Forming Step

Next, the above-described substrate 1 is put into an electric furnace, and the substrate 1 is placed on a susceptor having a predetermined heater. After the substrate 1 is placed on the susceptor, the substrate 1 is heated by the heater and heat treatment is performed thereto in an atmosphere containing hydrogen gas or hydride gas. Specifically, for example, the heat treatment is performed at a predetermined temperature for 20 minutes in a hydrogen ($H_2$) gas stream containing 20% $NH_3$ gas. The heat treatment temperature is, for example, 850° C. or higher and 1,100° C. or lower. By performing such a heat treatment, the metal layer 3 is nitrided to form a metal nitride layer 5 having high-density fine holes on the surface. Further, by performing the above-described heat treatment, a part of the first crystal layer 2 is etched through the holes of the metal nitride layer 5 to form high-density voids in the first crystal layer 2.

Thereby, as illustrated in FIG. 2(d), a void-containing first crystal layer 4 is formed.

S150: Second Crystal Layer Forming Step

Next, for example, a Si-doped GaN layer is epitaxially grown as a second crystal layer (main growth layer) 6 over the void-containing first crystal layer 4 and the metal nitride layer 5 by supplying gallium chloride (GaCl) gas, $NH_3$ gas, and dichlorosilane ($SiH_2Cl_2$) gas as an n-type dopant gas, to the substrate 1 that is heated to a predetermined growth temperature by a hydride vapor deposition (HVPE) method. A Ge-doped GaN layer may be epitaxially grown as the second crystal layer 6 by supplying tetrachlorogermane ($GeCl_4$) gas or the like instead of $SiH_2Cl_2$ gas, as an n-type dopant gas.

At this time, the second crystal layer 6 grows from the void-containing first crystal layer 4 over the void-containing first crystal layer 4 and the metal nitride layer 5 through the holes in the metal nitride layer 5. Some of the voids in the void-containing first crystal layer 4 are filled with the second crystal layer 6, but the other voids in the void-containing first crystal layer 4 remain. A flat gap is formed between the second crystal layer 6 and the metal nitride layer 5 due to the voids remaining in the void-containing first crystal layer 4. This gap causes peeling of the second crystal layer 6 in a peeling step S160 described later.

Further, at this time, the second crystal layer 6 grows by inheriting an orientation of the substrate 1. That is, an off-angle $\theta_1$ in the main surface of the second crystal layer 6 is uniform over the entire main surface, similarly to the off-angle $\theta_0$ in the main surface is of the substrate 1.

Further, at this time, the thickness of the second crystal layer 6 is, for example, 600 μm or more, and preferably 1 mm or more. The upper limit of the thickness of the second crystal layer 6 is not particularly limited, but is preferably 50 mm or less from the standpoint of improving productivity.

S160: Peeling Step

After the growth of the second crystal layer 6 is complete, the second crystal layer 6 naturally peels off from the substrate 1 by separating from the void-containing first crystal layer 4 and the metal nitride layer 5 in a process of cooling an HVPE apparatus used to grow the second crystal layer 6.

At this time, tensile stress is introduced into the second crystal layer 6 as a result of initial nuclei, which are generated in the growth process, attracting each other. Therefore, due to the tensile stress generated in the second crystal layer 6, an internal stress acts on the second crystal layer 6 such that a front surface side thereof becomes concave. Further, a dislocation density on the main surface (front surface) side of the second crystal layer 6 is low, while a dislocation density on a back surface side of the second crystal layer 6 is high. Therefore, due to the difference in the dislocation density in a thickness direction of the second crystal layer 6 as well, an internal stress acts on the second crystal layer 6 such that the front surface side thereof becomes concave.

As a result, as illustrated in FIG. 2(f), after the second crystal layer 6 is peeled off from the substrate 1, the front surface side thereof is warped so as to be concave. Therefore, a c-plane 6c of the second crystal layer 6 is curved in a concave spherical shape with respect to a plane perpendicular to a normal direction of the center of the main surface 6s of the second crystal layer 6. An off-angle $\theta_2$ formed by a c-axis 6ca with respect to the normal of the center of the main surface 6s of the second crystal layer 6 has a predetermined distribution.

S170: Slicing Step

Next, as illustrated in FIG. 2(f), for example, the second crystal layer 6 is sliced using a wire saw along a cut surface SS substantially perpendicular to the normal direction of the center of the main surface 6s of the second crystal layer 6.

Thereby, as illustrated in FIG. 2(g), the base substrate 10 as an as-sliced substrate is formed. At this time, the thickness of the base substrate 10 is, for example, 450 μm. The off-angle $\theta_3$ of the base substrate 10 may change from the off-angle $\theta_2$ of the second crystal layer 6 due to dependence on the slice direction.

S180: Polishing Step

Next, both sides of the base substrate 10 are polished by a polishing device. Thereby, the main surface 10s of the base substrate 10 is mirror-finished.

By the above-described base substrate preparation step S100, the base substrate 10 constituted by a single crystal of GaN is obtained.

The base substrate 10 has a diameter of, for example, 2 inches or more. The base substrate 10 has a thickness of, for example, 300 μm or more and 1 mm or less.

The main surface 10s of the base substrate 10 has, for example, a main surface (base surface) 10s which serves as an epitaxial growth surface. In the present embodiment, a low index crystal plane that is closest to the main surface 10s is, for example, a c-plane (+c plane) 10c.

The c-plane 10c of the base substrate 10 is curved in a concave spherical shape with respect to the main surface 10s. The term "spherical" as used herein means a curved surface that approximates to a spherical surface. Further, "approximates to a spherical surface" as used herein means approximating to a surface of a perfect circular sphere or an elliptical sphere within a predetermined range of error.

In the present embodiment, the c-plane 10f of the base substrate 10 has, for example, a curved surface that approximates to a spherical surface in each of a cross section taken along the m-axis and a cross section taken along the a-axis. A radius of curvature of the c-plane 10c of the base substrate 10 is, for example, 1 μm or more and less than 10 μm.

The off-angle $\theta_3$ formed by a c-axis 10ca with respect to the normal of the center of the main surface 10s of the base substrate 10 has a predetermined distribution.

In the present embodiment, the size of the off-angle $\theta_3$ at the center of the main surface 10s of the base substrate 10 is, for example, 1° or less, and preferably 0.4° or less. If the size of the off-angle $\theta_3$ at the center of the main surface 10s is more than 1°, it may be difficult to cause three-dimensional growth of a three-dimensional growth layer 30 depending on a first growth condition in the three-dimensional growth step S200, which will be described later. Accordingly, it becomes difficult to make a c-plane 30c disappear. In contrast, in the present embodiment, the size of the off-angle $\theta_3$ at the center of the main surface 10s is 1° or less, and therefore, the three-dimensional growth layer 30 can be easily grown three-dimensionally in the three-dimensional growth step S200 described later. Accordingly, it is easy to make the c-plane 30c disappear. Moreover, when the size of the off-angle $\theta_3$ at the center of the main surface 10s is 0.4° or less, the three-dimensional growth layer 30 can be grown three-dimensionally in a relatively wide range of growth conditions, and it is possible to stably make the c-plane 30c disappear.

From the standpoint of the three-dimensional growth of the three-dimensional growth layer 30, the smaller the off-angle $\theta_3$ at the center of the main surface 10s is, the better. However, if the size of the off-angle $\theta_3$ at the center of the main surface 10s is too close to 0°, there is a possibility that the surface of the three-dimensional growth layer 30 will be excessively rough. Therefore, the size of the off-angle $\theta_3$ at the center of the main surface 10s is preferably 0.1° or more, for example.

The size and a direction of the off-angle $\theta_3$ at the center of the main surface 10s of the base substrate 10 can be adjusted, for example, by adjusting a size and a direction of the off-angle $\theta_0$ of the crystal growth substrate 1 used in the above-described VAS method, and a slice angle and the slice direction in the slicing step S170.

Further, in the present embodiment, a root mean square roughness RMS of the main surface 10s of the base substrate 10 is, for example, less than 1 nm.

Further, in the present embodiment, since the base substrate 10 is manufactured by the above-described VAS method, the dislocation density in the main surface 10s of the base substrate 10 is low. Specifically, the dislocation density in the main surface 10s of the base substrate 10 is, for example, $3 \times 10^6$ cm$^{-2}$ or more and less than $1 \times 10^7$ cm$^{-2}$.

S200: Three-Dimensional Growth Step

Figure 3:
FIGS. 3(a) to 3(c) are schematic cross-sectional views illustrating a part of the method for manufacturing a nitride semiconductor substrate according to the embodiment of the present disclosure.
Figure 3:
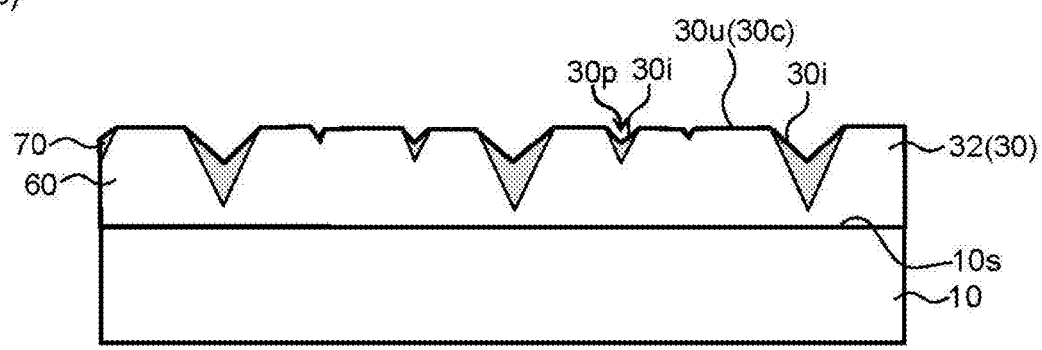
Figure 3:
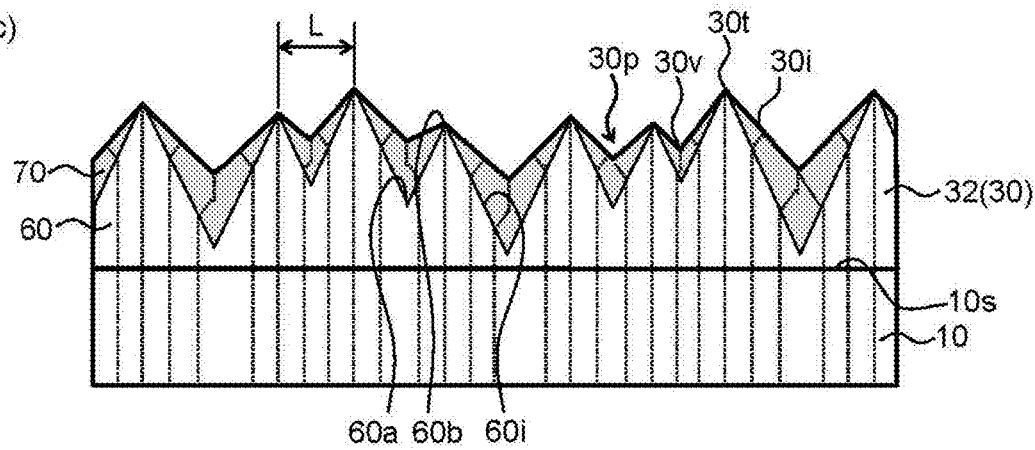

After the base substrate 10 is prepared as illustrated in FIG. 3(*a*), a single crystal of a group III nitride semiconductor that has a top surface 30u at which a c-plane 30c is exposed is epitaxially grown above the main surface 10s of the base substrate 10 as illustrated in FIGS. 3(*b*), 3(*c*), and 4. Thus, the three-dimensional growth layer 30 is grown.

At this time, a plurality of recessed portions 30p surrounded by inclined interfaces 30i other than the c-plane are generated in the top surface 30u of the single crystal, and the inclined interfaces 30i are gradually expanded and the c-plane 30c is gradually contracted toward an upper side of the main surface 10s of the base substrate 10. Thereby, the c-plane 30c disappears from the top surface 30u at least once. As a result, the three-dimensional growth layer 30 in which the inclined interfaces 30i are present in a wide region of the surface is formed.

At this time, in the three-dimensional growth step S200 of the first cycle, the base substrate 10 that has not been subjected to processing for forming a mask layer on the main surface 10s and processing for forming an uneven pattern on the main surface 10s is used as illustrated in FIG. 3(*a*). The "mask layer" as used herein means a mask layer that has predetermined openings and is used in a so-called ELO (Epitaxial Lateral Overgrowth) method, for example. Also, the "uneven pattern" as used herein means at least either of a trench and a ridge that are formed by performing patterning directly on the main surface of the base substrate and are used in a so-called pendeo-epitaxy method, for example. The uneven pattern referred to here has a difference in the height of 100 nm or more, for example. In the three-dimensional growth step S200 of the first cycle, the single crystal of a group III nitride semiconductor is epitaxially grown directly on the main surface 10s of the base substrate 10 that does not have the structures described above.

At this time, in the three-dimensional growth step S200 of the first cycle, the three-dimensional growth layer 30 is three-dimensionally grown so as to intentionally roughen the main surface 10s of the base substrate 10. Even though the three-dimensional growth layer 30 is grown in such a manner, the three-dimensional growth layer 30 is grown as a single crystal as described above. In this respect, the three-dimensional growth layer 30 differs from a so-called low temperature growth buffer layer that is formed as an amorphous layer or a polycrystal on a dissimilar substrate such as sapphire before a group III nitride semiconductor is epitaxially grown on the dissimilar substrate.

Also, at this time, an inclined interface growth region 70 (gray part in the drawings) grown with the inclined interfaces 30i other than the c-plane serving as growth surfaces is formed in the three-dimensional growth layer 30. Also, in a cross section of the three-dimensional growth layer 30 taken along the main surface 10s of the base substrate 10, an area occupied by the inclined interface growth region 70 is 80% or more, for example, as described later.

In the present embodiment, for example, a layer that is constituted by the same group III nitride semiconductor as the group III nitride semiconductor constituting the base substrate 10 is epitaxially grown as the three-dimensional growth layer 30. Specifically, for example, a GaN layer is epitaxially grown as the three-dimensional growth layer 30 by heating the base substrate 10 and supplying GaCl gas and NH$_3$ gas to the heated base substrate 10 by the HVPE method.

Here, in order to realize the above-described growth process, for example, the three-dimensional growth layer 30 is grown under a predetermined first growth condition in the three-dimensional growth step S200.

Figure 10:
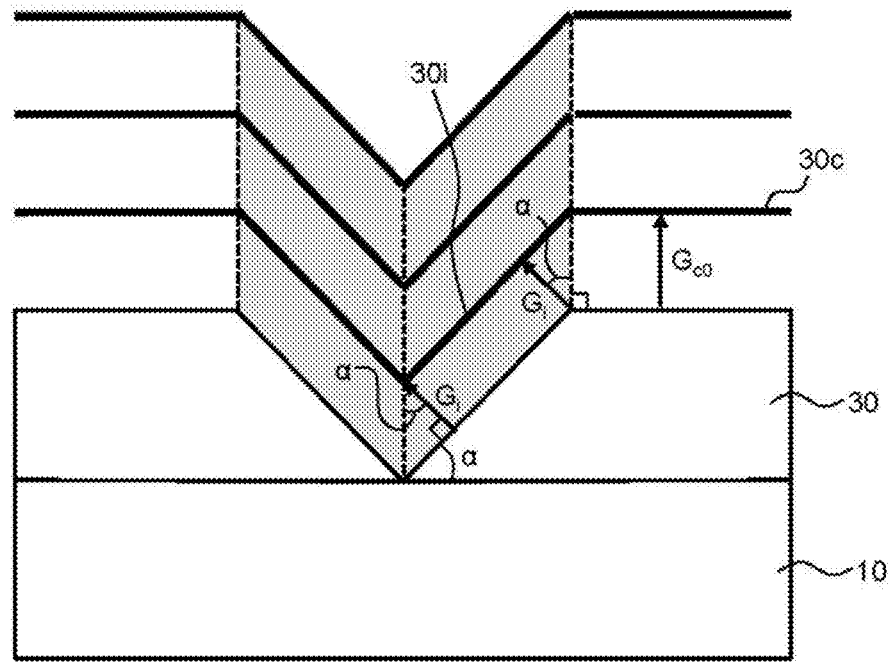
FIG. 10(a) is a schematic cross-sectional view illustrating a growth process under a reference growth condition under which an inclined interface and a c-plane are neither expanded nor contracted.
FIG. 10(b) is a schematic cross-sectional view illustrating a growth process under a first growth condition under which the inclined interface is expanded and the c-plane is contracted.
Figure 10:
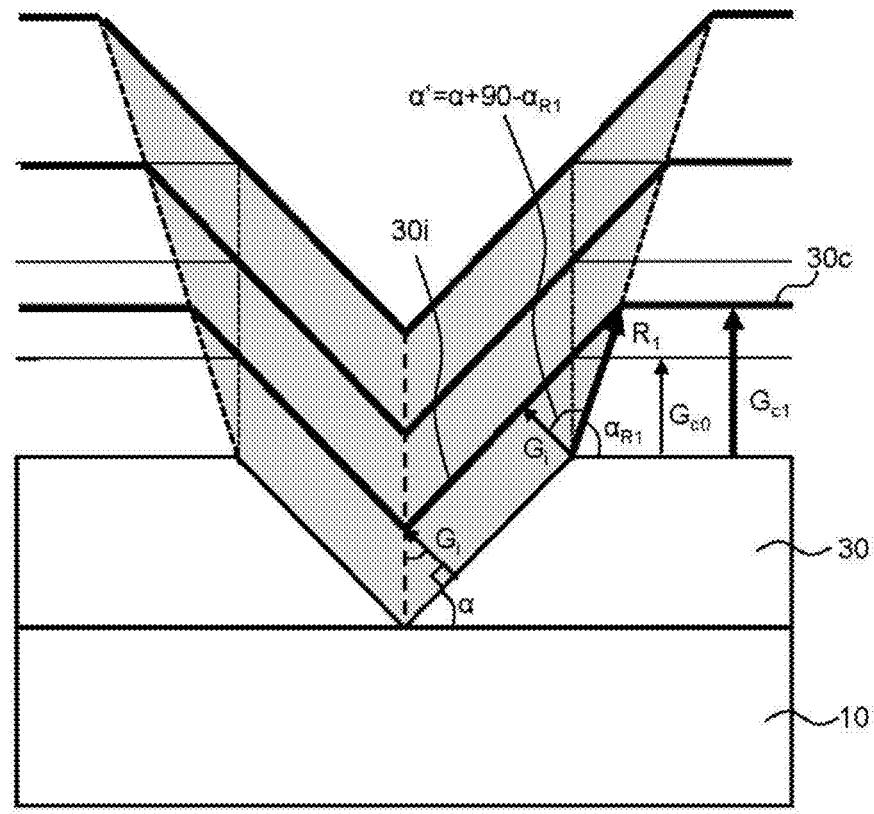

First, a reference growth condition under which the inclined interface 30i and the c-plane 30c are neither expanded nor contracted will be described with reference to FIG. 10(*a*). FIG. 10(*a*) is a schematic cross-sectional view illustrating a growth process under the reference growth condition under which the inclined interface and the c-plane are neither expanded nor contracted.

In FIG. 10(*a*), a thick solid line indicates the surface of the three-dimensional growth layer 30 for each unit time. The inclined interface 30i illustrated in FIG. 10(*a*) is the inclined interface that is most inclined with respect to the c-plane 30c. Further, in FIG. 10(*a*), $G_{c0}$ represents a growth rate of the c-plane 30c of the three-dimensional growth layer 30, $G_i$ represents a growth rate of the inclined interface 30i of the three-dimensional growth layer 30, and $\alpha$ represents an angle formed by the c-plane 30c and the inclined interface 30i in the three-dimensional growth layer 30. Also, in FIG. 10(*a*), the three-dimensional growth layer 30 grows while maintaining the angle $\alpha$ formed by the c-plane 30c and the inclined interface 30i. The off-angle of the c-plane 30c of the three-dimensional growth layer 30 is negligible as compared with the angle $\alpha$ formed by the c-plane 30c and the inclined interface 30i.

As illustrated in FIG. 10(*a*), when each of the inclined interface 30i and the c-plane 30c is neither expanded nor contracted, a locus of an intersection between the inclined interface 30i and the c-plane 30c is perpendicular to the c-plane 30c. Therefore, the reference growth condition under which each of the inclined interface 30i and the c-plane 30c is neither expanded nor contracted satisfies the following formula (a).

$$G_{c0} = G_i/\cos\alpha \quad (a)$$

Next, the first growth condition under which the inclined interface 30i is expanded and the c-plane 30c is contracted will be described with reference to FIG. 10(b). FIG. 10(b) is a schematic cross-sectional view illustrating a growth process under the first growth condition under which the inclined interface is expanded and the c-plane is contracted.

In FIG. 10(b), as in FIG. 10(a), a thick solid line indicates the surface of the three-dimensional growth layer 30 for each unit time. Further, the inclined interface 30i illustrated in FIG. 10(b) is also the inclined interface most inclined with respect to the c-plane 30c. Also, in FIG. 10(b), $G_{c1}$ represents a growth rate of the c-plane 30c of the three-dimensional growth layer 30, and $R_1$ represents a progress rate of the locus of the intersection between the inclined interface 30i and the c-plane 30c of the three-dimensional growth layer 30. Further, $\alpha_{R1}$ represents a narrower angle of angles formed by the c-plane 30c and the locus of the intersection between the inclined interface 30i and the c-plane 30c. When $\alpha'$ represents an angle formed by $R_1$ direction and $G_i$ direction, $\alpha'=\alpha+90-\alpha_{R1}$ is satisfied. The off-angle of the c-plane 30c of the three-dimensional growth layer 30 is negligible as compared with the angle $\alpha$ formed by the c-plane 30c and the inclined interface 30i.

As illustrated in FIG. 10(b), the progress rate $R_1$ of the locus of the intersection between the inclined interface 30i and the c-plane 30c is represented by the following formula (b).

$$R_1 = G_i/\cos\alpha' \tag{b}$$

Further, the growth rate $G_{c1}$ of the c-plane 30c of the three-dimensional growth layer 30 is represented by the following formula (c).

$$G_{c1}=R_1 \sin \alpha_{R1} \tag{c}$$

By substituting the formula (b) into the formula (c), $G_{c1}$ is represented by the following formula (d) using $G_i$.

$$G_{c1} = G_i \sin\alpha_{R1}/\cos(\alpha + 90 - \alpha_{R1}) \tag{d}$$

In order for the inclined interface 30i to expand and the c-plane 30c to contract, it is preferable that the following relationship be satisfied: $\alpha_{R1}<90°$. Accordingly, the first growth condition under which the inclined interface 30i is expanded and the c-plane 30c is contracted preferably satisfies the following formula (1), due to satisfying formula (d) and $\alpha_{R1}<90°$, $$G_{c1} > G_i/\cos\alpha \tag{1}$$

wherein, as described above, $G_i$ represents the growth rate of the inclined interface 30i most inclined with respect to the c-plane 30c, and $\alpha$ represents the angle formed by the c-plane 30c and the inclined interface 30i most inclined with respect to the c-plane 30c.

Alternatively, it can be considered that $G_{c1}$ under the first growth condition is preferably larger than $G_{c0}$ under the reference growth condition. In this respect as well, the formula (1) can be derived by substituting the formula (a) into $G_{c1}>G_{c0}$.

Since the growth condition for expanding the inclined interface 30i most inclined with respect to the c-plane 30c is the strictest condition, when the first growth condition satisfies the formula (1), the other inclined interfaces 30i can also be expanded.

Specifically, for example, when the inclined interface 30i most inclined with respect to the c-plane 30c is a {10–11} plane, $\alpha=61.95°$. Accordingly, the first growth condition preferably satisfies, for example, the following formula (1').

$$G_{c1}>2.13G_i \tag{1'}$$

Alternatively, for example, when inclined interfaces 30i are {11–2 µm} planes satisfying m>3 as described later, the inclined interface 30i most inclined with respect to the c-plane 30c is a {11–23} plane, and therefore, $\alpha=47.3°$. Accordingly, the first growth condition preferably satisfies, for example, the following formula (1").

$$G_{c1}>1.47G_i \tag{1"}$$

As the first growth condition of the present embodiment, for example, the growth temperature in the three-dimensional growth step S200 is set to be lower than the growth temperature in the flattening step S300, which will be described later. Specifically, the growth temperature in the three-dimensional growth step S200 is set to, for example, 980° C. or higher and 1,020° C. or lower, and preferably 1,000° C. or higher and 1,020° C. or lower.

Alternatively, as the first growth condition of the present embodiment, for example, the ratio (hereinafter also referred to as the "V/III ratio") of a partial pressure of the flow rate of $NH_3$ gas serving as a nitrogen source gas to a partial pressure of GaCl gas serving as a group III source gas in the three-dimensional growth step S200 may be made greater than the V/III ratio in the flattening step S300 described later. Specifically, the V/III ratio in the three-dimensional growth step S200 is set to, for example, 2 or more and 20 or less, and preferably 2 or more and 15 or less.

In practice, at least either the growth temperature or the V/III ratio is adjusted as the first growth condition within the above-described ranges so as to satisfy the formula (1).

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the three-dimensional growth step S200 of the present embodiment is classified into two steps based on the form of the three-dimensional growth layer 30 while growing, for example. Specifically, the three-dimensional growth step S200 of the present embodiment includes, for example, an inclined interface expansion step S220 and an inclined interface maintenance step S240. Through these steps, for example, an expanded inclined interface layer 32 and an inclined interface maintaining layer 34 are formed as the three-dimensional growth layer 30.

S220: Inclined Interface Expansion Step

First, as illustrated in FIGS. 3(b) and 4, the expanded inclined interface layer 32 of the three-dimensional growth layer 30 constituted by a single crystal of a group III nitride semiconductor is epitaxially grown directly on the main surface 10s of the base substrate 10 under the first growth condition described above.

In an initial stage of the growth of the expanded inclined interface layer 32, the expanded inclined interface layer 32 undergoes step-flow growth (two-dimensional growth) to a predetermined thickness in the normal direction (a direction extending along the c-axis) of the main surface 10s of the base substrate 10, with the c-plane 30*c* serving as the growth surface. Namely, the expanded inclined interface layer 32, which is a single crystal, is homoepitaxially grown to be flat. Here, the portion of the expanded inclined interface layer 32 grown with the c-plane 30*c* serving as the growth surface will also be referred to as an "initial layer". Through this growth, the initial layer that has a mirror-finished surface is formed with the predetermined thickness. At this time, the initial layer is grown continuously in a direction extending along the main surface 10*s* of the base substrate 10, i.e., over the entire main surface 10*s* of the base substrate 10, for example. At this time, the thickness of the initial layer is, for example, 1 μm or more and 100 μm or less, and preferably 1 μm or more and 20 μm or less.

Thereafter, by gradually growing the expanded inclined interface layer 32 under the first growth condition, a plurality of recessed portions 30*p* formed by the inclined interfaces 30*i* other than the c-plane are generated in the top surface 30*u* of the expanded inclined interface layer 32 at which the c-plane 30*c* is exposed as illustrated in FIG. 3(*b*) and FIG. 4. The plurality of recessed portions 30*p* formed by the inclined interfaces 30*i* other than the c-plane are randomly formed in the top surface 30*u*. Thus, the expanded inclined interface layer 32 in which the c-plane 30*c* and the inclined interfaces 30*i* other than the c-plane coexist at the surface is formed.

The term "inclined interface 30*i*" as used herein means a growth interface inclined with respect to the c-plane 30*c*, and includes low index facets other than the c-plane, high index facets other than the c-plane, or inclined faces that cannot be represented by indices of crystal plane (Miller indices). Facets other than the c-plane are, for example, {11-2 μm}, {1-10n}, and the like. Wherein m and n are integers other than 0.

In the present embodiment, since the base substrate 10 described above is used and the first growth condition is adjusted so as to satisfy the formula (1), for example, a {11-2 μm} plane satisfying m>3 can be generated as the inclined interface 30*i*. Thereby, an inclination angle of the {11-2 μm} plane with respect to the c-plane 30*c* can be made moderate. Specifically, the inclination angle can be 47.3° or less.

By further growing the expanded inclined interface layer 32 under the first growth condition, as illustrated in FIGS. 3(*b*) and 3(*c*), the inclined interfaces 30*i* other than the c-plane are gradually expanded and the c-plane 30*c* is gradually contracted in the expanded inclined interface layer 32 toward the upper side of the main surface 10*s* of the base substrate 10. At this time, the inclination angle formed by the inclined interfaces 30*i* with respect to the main surface 10*s* of the base substrate 10 gradually decreases toward the upper side of the base substrate 10. Thereby, most of the inclined interfaces 30*i* finally become {11-2 μm} planes satisfying m>3 as described above.

When the expanded inclined interface layer 32 is further grown, the c-plane 30*c* of the expanded inclined interface layer 32 disappears from the top surface 30*u*, and the outermost surface (uppermost surface) of the expanded inclined interface layer 32 is constituted only by the inclined interfaces 30*i*.

In this way, by forming the plurality of recessed portions 30*p* by the inclined interfaces 30*i* other than the c-plane in the top surface 30*u* of the expanded inclined interface layer 32 and making the c-plane 30*c* disappear, a plurality of valleys 30*v* and a plurality of peaks 30*t* are formed at the surface of the expanded inclined interface layer 32 as illustrated in FIG. 3(*c*). The plurality of valleys 30*v* are each an inflection point that is convex downward in the surface of the expanded inclined interface layer 320, and are formed above positions at which the inclined interfaces 30*i* other than the c-plane are generated. On the other hand, the plurality of peaks 30*t* are each an inflection point that is convex upward in the surface of the expanded inclined interface layer 320, and are formed at or above positions at which the c-plane 30*c* (finally) disappears, with a pair of inclined interfaces 30*i* that expand in opposite directions sandwiched between the positions. The valleys 30*v* and the peaks 30*t* are formed alternately in a direction extending along the main surface 10*s* of the base substrate 10.

In the present embodiment, in the initial stage of the growth of the expanded inclined interface layer 32, the expanded inclined interface layer 32 is grown so as to have the predetermined thickness on the main surface 10*s* of the base substrate 10 with the c-plane 30*c* serving as the growth surface without the inclined interfaces 30*i* being generated, and thereafter the inclined interfaces 30*i* other than the c-plane are generated in the surface of the expanded inclined interface layer 32. Therefore, the plurality of valleys 30*v* are formed at positions that are spaced upward from the main surface 10*s* of the base substrate 10.

Due to the growth process of the expanded inclined interface layer 32 described above, dislocations bend and propagate as follows. Specifically, as illustrated in FIG. 3(*c*), the plurality of dislocations extending along the c-axis in the base substrate 10 propagate from the base substrate 10 in a direction extending along the c-axis of the expanded inclined interface layer 32. In a region of the expanded inclined interface layer 32 that has grown with the c-plane 30*c* serving as the growth surface, the dislocations propagate from the base substrate 10 in the direction extending along the c-axis of the expanded inclined interface layer 32. However, when a growth interface at which the dislocations are exposed changes from the c-plane 30*c* to an inclined interface 30*i* in the expanded inclined interface layer 32, the dislocations bend and propagate in a direction that is substantially perpendicular to the inclined interface 30*i*. That is, the dislocations bend and propagate in a direction that is inclined with respect to the c-axis. Thereby, in the steps after the inclined interface expansion step S220, the dislocations are locally collected above substantially the center between each pair of peaks 30*t*. As a result, a dislocation density in a surface of a flattening layer 40, which will be described later, can be lowered.

At this time, in the present embodiment, when an arbitrary cross section perpendicular to the main surface 10*s* of the base substrate 10 is observed, an average distance (also called "an average distance between closest peaks") L between a pair of peaks 30*t* spaced apart from each other in a direction extending along the main surface 10*s* of the base substrate 10 is, for example, more than 100 μm, the pair of peaks being closest to each other among the plurality of peaks 30*t* with one of the plurality of valleys 30*v* sandwiched between them. Note that the average distance L between closest peaks is a distance in a cross section that is observed when the c-plane 30*c* has disappeared from a crystal growth interface.

When the average distance L between closest peaks is 100 μm or less as in the case where fine hexagonal pyramid-shaped crystal nuclei are generated on the main surface 10*s* of the base substrate 10 from the initial stage of the inclined interface expansion step S220, a distance by which the dislocations bend and propagate in the steps after the inclined interface expansion step S220 becomes short. Therefore, the dislocations are not sufficiently collected above substantially the center between each pair of peaks 30*t* of the expanded inclined interface layer 32. As a result, the dislocation density in the surface of the flattening layer 40, which will be described later, may not be sufficiently lowered. In contrast, in the present embodiment, since the average distance L between closest peaks is more than 100 μm, at least a distance longer than 50 μm can be secured for the dislocations to bend and propagate in the inclined interface expansion step S220 and the following steps. Accordingly, the dislocations can be sufficiently collected above substantially the center between each pair of peaks 30*t* of the expanded inclined interface layer 32. As a result, the dislocation density in the surface of the flattening layer 40 described later can be sufficiently lowered.

On the other hand, in the present embodiment, the average distance L between closest peaks is less than 800 μm. If the average distance L between closest peaks is 800 μm or more, the height from the main surface 10*s* of the base substrate 10 from the valley 30*v* to the peak 30*t* of the expanded inclined interface layer 32 becomes excessively large. Therefore, the thickness of the flattening layer 40 until the flattening layer is mirror-finished in the flattening step S300 described later becomes thick. In contrast, in the present embodiment, since the average distance L between closest peaks is less than 800 μm, the height from the main surface 10*s* of the base substrate 10 from the valley 30*v* to the peak 30*t* of the expanded inclined interface layer 32 can be lowered. Therefore, the flattening layer 40 can be quickly mirror-finished.

Further, at this time, a c-plane growth region 60 that has grown with the c-plane 30*c* serving as the growth surface and an inclined interface growth region 70 (gray region in the drawings) that has grown with the inclined interfaces 30*i* other than the c-plane serving as growth surfaces are formed in the expanded inclined interface layer 320, based on a difference in growth surfaces during the growth process.

Further, at this time, in the c-plane growth region 60, valleys 60*a* are formed at positions where the inclined interfaces 30*i* are generated, and mountains 60*b* are formed at positions where the c-plane 30*c* terminates and disappears. Further, in the c-plane growth region 60, a pair of inclined portions 60*i* are formed on opposite sides of each mountain 60*b* as loci of intersections between the c-plane 30*c* and inclined interfaces 30*i*.

Further, at this time, an angle formed by the pair of inclined portions 60*i* is, for example, 70° or less in a cross section taken along a plane that passes through centers of two adjacent valleys 60*a*, due to the first growth condition satisfying the formula (1).

Details of these regions will be described later.

S240: Inclined Interface Maintenance Step

After the c-plane 30*c* has disappeared from the surface of the expanded inclined interface layer 32, the first growth condition described above is maintained in the inclined interface maintenance step S240, similarly to the inclined interface expansion step S220.

Thus, as illustrated in FIG. 5(*a*), growth of the three-dimensional growth layer 30 is continued over a predetermined thickness while the state in which the inclined interfaces 30*i* occupy a larger area of the surface than the c-plane 30*c* is maintained. As a result, the inclined interface maintaining layer 34 is formed on the expanded inclined interface layer 32.

Here, in order to reliably bend the propagation direction of dislocations in the three-dimensional growth step S200 as described above to lower the dislocation density, it is important that the c-plane 30*c* disappears at least once in a history of a growth interface at an arbitrary position in the three-dimensional growth layer 30. Therefore, it is desirable that the c-plane 30*c* disappears at least once in an early stage of the three-dimensional growth step S200 (e.g., in the inclined interface expansion step S220 described above).

However, the c-plane 30*c* may reappear in a part of the surface of the inclined interface maintaining layer 34 in the inclined interface maintenance step S240 after disappearing at least once. However, it is preferable to mainly expose the inclined interfaces 30*i* at the surface of the inclined interface maintaining layer 34 so that the ratio of an area occupied by the inclined interface growth region 70 in a cross section taken along the main surface 10*s* of the base substrate 10 is 80% or more. The higher the ratio of an area occupied by the inclined interface growth region 70 in the cross section, the better, and it is preferable that the ratio is 100%.

Further, at this time, as a result of the inclined interface maintaining layer 34 being grown under the first growth condition with the inclined interfaces 30*i* serving as growth surfaces, the dislocations that bend and propagate in the direction inclined with respect to the c-axis at positions where the inclined interfaces 30*i* are exposed in the inclined interface expanding layer 32 as described above continue to propagate in the same direction in the inclined interface maintaining layer 34.

Also, at this time, the inclined interface maintaining layer 34 grows with the inclined interfaces 30*i* serving as growth surfaces, and therefore, substantially the entirety of the inclined interface maintaining layer 34 constitutes a portion of the inclined interface growth region 70.

Through the three-dimensional growth step S200 described above, the three-dimensional growth layer 30 including the expanded inclined interface layer 32 and the inclined interface maintaining layer 34 is formed.

In the three-dimensional growth step S200 of the first cycle, the height from the main surface 10*s* of the base substrate 10 to the peak 30*t* of the three-dimensional growth layer 30 (the maximum height of the three-dimensional growth layer 30 in the thickness direction) is, for example, more than 100 μm and less than 1.5 mm.

S300: Flattening Step

After the three-dimensional growth layer 30 in which the c-plane 30*c* has disappeared is grown, a single crystal of a group III nitride semiconductor is further epitaxially grown on the three-dimensional growth layer 30 as illustrated in FIG. 5(*b*).

At this time, inclined interfaces 40*i* are gradually contracted and a c-plane 40*c* is gradually expanded toward the upper side of the main surface 10*s* of the base substrate 10. Thereby, the inclined interfaces 30*i* formed at the surface of the three-dimensional growth layer 30 disappear. As a result, the flattening layer 40 that has a mirror-finished surface is grown. The "mirror-finished surface" as used herein means a surface in which the largest difference in the height between a recessed portion and a raised portion of the surface that are adjacent to each other is no greater than a wavelength of visible light.

In the present embodiment, a layer that is mainly composed of the same group III nitride semiconductor as the group III nitride semiconductor constituting the three-dimensional growth layer 30 is epitaxially grown as the flattening layer 40, for example. In the flattening step S300, a silicon (Si)-doped GaN layer is epitaxially grown as the flattening layer 40 by supplying GaCl gas, $NH_3$ gas, and dichlorosilane ($SiH_2Cl_2$) gas, which serves as an n-type dopant gas, to the base substrate 10 that is heated to a predetermined growth temperature. Instead of the $SiH_2Cl_2$ gas, $GeCl_4$ gas or the like may be supplied as an n-type dopant gas.

Here, in order to realize the above-described growth process, the flattening layer 40 is grown under a predetermined second growth condition in the flattening step S300, for example.

Figure 11:
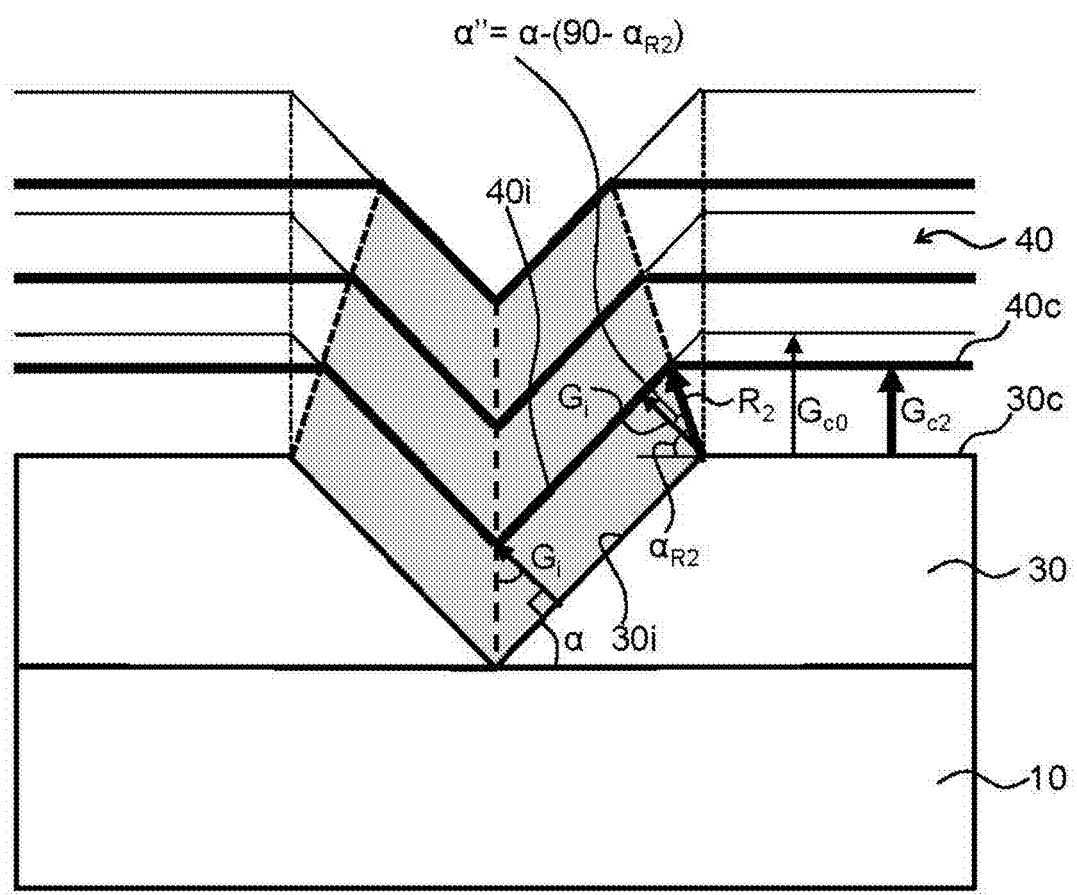
FIG. 11 is a schematic cross-sectional view illustrating a growth process under a second growth condition under which the inclined interface is contracted and the c-plane is expanded.

The second growth condition under which the inclined interface 40i is contracted and the c-plane 40c is expanded will be described with reference to FIG. 11. FIG. 11 is a schematic cross-sectional view illustrating a growth process under the second growth condition under which the inclined interface is contracted and the c-plane is expanded. FIG. 11 illustrates a process of the flattening layer 40 growing on the three-dimensional growth layer 30 where an inclined interface 30i that is most inclined with respect to the c-plane 30c is exposed.

In FIG. 11, as in FIG. 10(a), the thick solid line indicates the surface of the flattening layer 40 for each unit time. Further, in FIG. 11, $G_{c2}$ represents a growth rate of the c-plane 40c of the flattening layer 40, $G_i$ represents a growth rate of the inclined interface 40i of the flattening layer 40, and $R_2$ represents a progress rate of a locus of an intersection between the inclined interface 40i and the c-plane 40c in the flattening layer 40. Further, $\alpha_{R2}$ represents a narrower angle of angles formed by the c-plane 30c and the locus of the intersection between the inclined interface 40i and the c-plane 40c. When $\alpha''$ represents an angle formed by $R_2$ direction and $G_i$ direction, $\alpha'' = \alpha - (90 - \alpha_{R2})$ is satisfied. Further, in FIG. 11, the flattening layer 40 grows while maintaining the angle $\alpha$ formed by the c-plane 30c and the inclined interface 30i in the three-dimensional growth layer 30. The off-angle of the c-plane 40c of the flattening layer 40 is negligible as compared with the angle $\alpha$ formed by the c-plane 30c and the inclined interface 30i.

As illustrated in FIG. 11, the progress rate $R_2$ of the locus of the intersection between the inclined interface 40i and the c-plane 40c is represented by the following formula (e).

$$R_2 = G_i / \cos\alpha'' \tag{e}$$

Further, the growth rate $G_{c2}$ of the c-plane 40c of the flattening layer 40 is represented by the following formula (f).

$$G_{c2} = R_2 \sin\alpha_{R2} \tag{f}$$

By substituting the formula (e) into the formula (f), $G_{c2}$ is represented by the following formula (g) using $G_i$.

$$G_{c2} = G_i \sin\alpha_{R2} / \cos(\alpha + \alpha_{R2} - 90) \tag{g}$$

In order for the inclined interface 40i to contract and the c-plane 40c to expand, it is preferable that the following relationship be satisfied: $\alpha_{R2} < 90°$. Accordingly, the second growth condition under which the inclined interface 40i is contracted and the c-plane 40c is expanded preferably satisfies the following formula (2), due to satisfying the formula (g) and $\alpha_{R2} < 90°$, $$G_{c2} < G_i / \cos\alpha \tag{2}$$

wherein, as described above, $G_i$ represents the growth rate of the inclined interface 40i most inclined with respect to the c-plane 40c, and $\alpha$ represents the angle formed by the c-plane 40c and the inclined interface 40i most inclined with respect to the c-plane 40c.

Alternatively, when the growth rate of the c-plane 30c in the flattening layer 40 under the reference growth condition is represented by $G_{c0}$, it can also be considered that $G_{c2}$ under the second growth condition is preferably smaller than $G_{c0}$ under the reference growth condition. In this respect as well, the formula (2) can be derived by substituting the formula (a) into $G_{c2} < G_{c0}$.

Since the growth condition for contracting the inclined interface 40i most inclined with respect to the c-plane 40c is the strictest condition, when the second growth condition satisfies the formula (2), the other inclined interfaces 40i can also be contracted.

Specifically, when the inclined interface 40i most inclined with respect to the c-plane 40c is the {10-11} plane, the second growth condition preferably satisfies the following formula (2').

$$G_{c2} < 2.13 G_i \tag{2'}$$

Alternatively, for example, when the inclined interfaces 30i are {11-2 μm} planes satisfying m>3, the inclined interface 30i most inclined with respect to the c-plane 30c is the {11-23} plane, and therefore, the second growth condition preferably satisfies, for example, the following formula (2").

$$G_{c2} < 1.47 G_i \tag{2''}$$

As the second growth condition of the present embodiment, the growth temperature in the flattening step S300 is set higher than the growth temperature in the three-dimensional growth step S200, for example. Specifically, the growth temperature in the flattening step S300 is set to 990° C. or higher and 1,120° C. or lower, and preferably 1,020° C. or higher and 1,100° C. or lower, for example.

Also, the V/III ratio in the flattening step S300 may be adjusted as the second growth condition of the present embodiment. For example, the V/III ratio in the flattening step S300 may be set lower than the V/III ratio in the three-dimensional growth step S200. Specifically, the V/III ratio in the flattening step S300 is set to 1 or more and 10 or less, and preferably 1 or more and 5 or less, for example.

In practice, at least either the growth temperature or the V/III ratio is adjusted as the second growth condition within the above-described ranges so as to satisfy the formula (2).

Other conditions of the second growth condition according to the present embodiment are as follows, for example.
  Growth pressure: 90 to 105 kPa, preferably 90 to 95 kPa
  Partial pressure of GaCl gas: 1.5 to 15 kPa
  $N_2$ gas flow rate/$H_2$ gas flow rate: 1 to 20

By epitaxially growing the flattening layer 40 constituted by a single crystal of a group III nitride semiconductor on the three-dimensional growth layer 30 under the second growth condition described above, the c-plane 40c can be expanded and the inclined interfaces 40i other than the c-plane can be contracted toward the upper side of the three-dimensional growth layer 30 as illustrated in FIG. 5(b).

Specifically, due to the growth under the second growth condition, the flattening layer 40 grows from the inclined interfaces 30i of the inclined interface maintaining layer 34 in a direction perpendicular to the c-axis (that is, a direction extending along the main surface or a lateral direction) with the inclined interfaces 40i serving as growth surfaces. When the flattening layer 40 is grown laterally, the c-plane 40c of the flattening layer 40 begins to be exposed again above the peaks 30t of the inclined interface maintaining layer 34. Thus, the flattening layer 40 in which the c-plane 40c and the inclined interfaces 40i other than the c-plane coexist at the surface is formed.

When the flattening layer 40 is further grown laterally, the c-plane 40c gradually expands, and the inclined interfaces 40i of the flattening layer 40 gradually contract. Thus, the recessed portions 30p formed by the plurality of inclined interfaces 30i in the surface of the three-dimensional growth layer 30 are gradually embedded.

Thereafter, when the flattening layer 40 is further grown, the inclined interfaces 40i of the flattening layer 40 completely disappear, and the recessed portions 30p formed by the plurality of inclined interfaces 30i in the surface of the three-dimensional growth layer 30 are completely embedded. Thereby, the surface of the flattening layer 40 becomes a mirror-finished surface (flat surface) that is constituted only by the c-plane 40c.

At this time, the dislocation density can be lowered by locally collecting dislocations during the growth process of the three-dimensional growth layer 30 and the flattening layer 40. Specifically, the dislocations that bend and propagate in the direction inclined with respect to the c-axis in the three-dimensional growth layer 30 continue to propagate in the same direction in the flattening layer 40. Thus, the dislocations are collected locally at a meeting part of adjacent inclined interfaces 40i above substantially the center between each pair of peaks 30t, in the flattening layer 40. Out of a plurality of dislocations collected at meeting parts of adjacent inclined interfaces 40i of the flattening layer 40, dislocations that have Burgers vectors opposite to each other disappear when meeting each other. Further, some of the dislocations collected at the meeting parts of the adjacent inclined interfaces 40i form a loop, and the propagation along the c-axis (that is, toward the surface side of the flattening layer 40) is suppressed. The other dislocations of the plurality of dislocations collected at the meeting parts of the adjacent inclined interfaces 40i of the flattening layer 40 change their propagation direction again from the direction inclined with respect to the c-axis to a direction extending along the c-axis, and propagate to the surface side of the flattening layer 40. In this way, by making some of the plurality of dislocations disappear and suppressing propagation of some of the plurality of dislocations to the surface side of the flattening layer 40, the dislocation density in the surface of the flattening layer 40 can be lowered. Further, by collecting the dislocations locally, a low dislocation density region can be formed above a portion of the flattening layer 40 in which dislocations propagate in the direction inclined with respect to the c-axis.

Further, at this time, since the c-plane 40c gradually expands in the flattening layer 40, a c-plane growth region 60 that grows with the c-plane 40c serving as the growth surface is formed again while gradually expanding toward the upper side in the thickness direction.

On the other hand, in the flattening layer 40, as the inclined interfaces 40i gradually contract, the inclined interface growth region 70 gradually contracts toward the upper side in the thickness direction, and terminates at a predetermined position in the thickness direction. Due to the above-described growth process of the flattening layer 40, valleys 70a of the inclined interface growth region 70 are formed at positions at which the c-plane 40c is generated again, in a cross-sectional view. Further, in the process of recessed portions formed by the inclined interfaces 40i being gradually embedded, mountains 70b of the inclined interface growth region 70 are formed at positions at which the inclined interfaces 40i disappear, in a cross-sectional view.

In the flattening step S300, the surface of the flattening layer 40 becomes a mirror-finished surface that is constituted only by the c-plane 40c, and therefore the height of the flattening layer 40 in the thickness direction (the maximum height in the thickness direction) is, for example, greater than or equal to the height from the valley 30v to the peak 30t of the inclined interface maintaining layer 34.

A laminated unit 50 that includes the three-dimensional growth layer 30 and the flattening layer 40 is formed in a cycle that includes the three-dimensional growth step S200 and the flattening step S300 described above. In the following description, a portion that includes the inclined interface growth region 70 and the c-plane growth region 60 under the inclined interface growth region 70 excluding the c-plane growth region 60 above the inclined interface growth region 70 may be referred to as the laminated unit 50. Also, the laminated unit 50 formed in the first cycle may be referred to as a "first laminated unit 51."

S400: Execution count determination step After the first cycle ends, the number of times the cycle including the three-dimensional growth step S200 and the flattening step S300 was executed is determined.

When the number of times the cycle was executed is less than a predetermined number N (No in step S400), the cycle including the three-dimensional growth step S200 and the flattening step S300 is repeated as follows.

S200: Three-Dimensional Growth Step

Figure 6A:
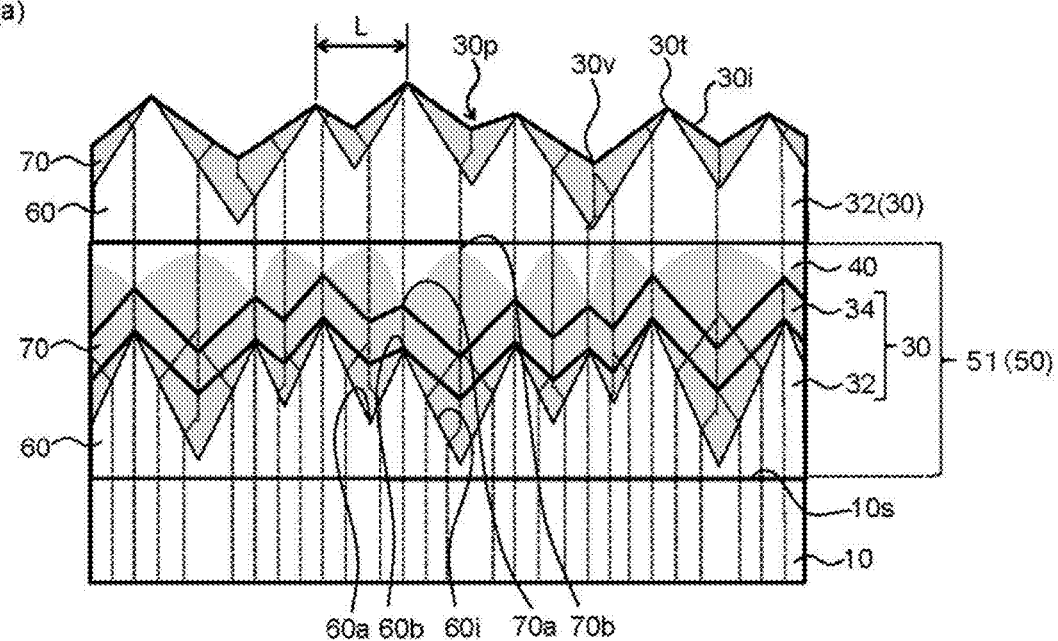
FIGS. 6(a) and 6(b) are schematic cross-sectional views illustrating a part of the method for manufacturing a nitride semiconductor substrate according to the embodiment of the present disclosure.

In the second and the following cycles, the three-dimensional growth layer 30 is grown again on the flattening layer 40 of the first laminated unit 51 as illustrated in FIG. 6(a). At this time, the three-dimensional growth layer 30 is grown under the same first growth condition as that in the three-dimensional growth step S200 of the first cycle.

In the three-dimensional growth step S200 of the second and the following cycles as well, the inclined interface expansion step S220 and the inclined interface maintenance step S240 are performed similarly to the three-dimensional growth step S200 of the first cycle.

S220: Inclined Interface Expansion Step

As illustrated in FIG. 6(a), the expanded inclined interface layer 32 of the three-dimensional growth layer 30 constituted by a single crystal of a group III nitride semiconductor is epitaxially grown on the flattening layer 40 of the first laminated unit 51.

In the second and the following cycles as well, in an initial stage of the growth of the expanded inclined interface layer 32, the expanded inclined interface layer 32 is grown with the c-plane 30c serving as the growth surface, in the normal direction (direction extending along the c-axis) of the surface of the flattening layer 40 of the first laminated unit 51. That is, in the initial stage of these cycles as well, the initial layer described above is grown over the entire surface of the flattening layer 40 of the first laminated unit 51 with the c-plane 30c serving as the growth surface.

Thereafter, the expanded inclined interface layer 32 is gradually grown under the first growth condition to generate a plurality of recessed portions 30p formed by inclined interfaces 30i other than the c-plane in the top surface 30u of the expanded inclined interface layer 32 at which the c-plane 30c is exposed and to make the c-plane 30c disappear at least once. Thereby, a plurality of valleys 30v and a plurality of peaks 30t are formed at the surface of the expanded inclined interface layer 32.

In the second and the following cycles as well, the plurality of recessed portions 30p are formed randomly in the top surface 30u of the expanded inclined interface layer 32. Accordingly, in a plan view, positions of the valleys 30v and positions of the peaks 30t at the surface of the expanded inclined interface layer 32 formed in the second and the following cycles do not necessarily respectively match positions of the valleys 30v and positions of the peaks 30t formed at the surface of the expanded inclined interface layer 32 in the first cycle.

Due to the growth process of the expanded inclined interface layer 32 described above, dislocations bend and propagate again as follows. Specifically, as illustrated in FIG. 6(a), a plurality of dislocations remaining in the surface of the flattening layer 40 of the first laminated unit 51 propagate from the flattening layer 40 of the first laminated unit 51 in a direction extending along the c-axis of the expanded inclined interface layer 32. In a region of the expanded inclined interface layer 32 that has grown with the c-plane 30c serving as the growth surface, the dislocations propagate from the flattening layer 40 of the first laminated unit 51 in the direction extending along the c-axis of the expanded inclined interface layer 32. However, when a growth interface at which the dislocations are exposed changes from the c-plane 30c to an inclined interface 30i in the expanded inclined interface layer 32, the dislocations bend and propagate in a direction that is substantially perpendicular to the inclined interface 30i. That is, the dislocations bend and propagate again in a direction that is inclined with respect to the c-axis. As a result, the dislocations are locally collected above substantially the center of each pair of peaks 30t in the second and the following cycles as well.

At this time, in the inclined interface expansion step S220 of the second and the following cycles, the average distance L between closest peaks in an arbitrary cross section perpendicular to the main surface 10s of the base substrate 10 is made longer than that in the inclined interface expansion step S220 of the first cycle, for example. Thus, the distance by which dislocations bend and propagate in the second and the following cycles can be made longer than that in the first cycle. As a result, dislocation-free density regions that are 50 μm square and do not overlap each other can be easily formed and the density of dislocation-free regions can be made high in the surface of the flattening layer 40 formed in the second and the following cycles.

Also, in the inclined interface expansion step S220 of each of the plurality of cycles, the average distance L between closest peaks is gradually increased as the number of repetitions of the cycle increases, for example. Thus, the distance by which dislocations bend and propagate can be gradually increased as the number of repetitions of the cycle increases. As a result, it is possible to gradually expand dislocation-free regions in the surface of the flattening layer 40 and gradually increase the density of dislocation-free regions in the surface of the flattening layer 40 as the number of repetitions of the cycle increases.

Also, in the inclined interface expansion step S220 of each of the second and the following cycles, the average distance L between closest peaks in an arbitrary cross section perpendicular to the main surface 10s of the base substrate 10 is at least more than 100 μm similarly to the first cycle. Therefore, the dislocations can be sufficiently collected above substantially the center between each pair of peaks 30t of the three-dimensional growth layer 30 similarly to the first cycle.

Also, in the inclined interface expansion step S220 of at least the last cycle of the plurality of cycles, the average distance L between closest peaks in an arbitrary cross section perpendicular to the main surface 10s of the base substrate 10 is preferably more than 200 μm, for example. In this case, at least a distance longer than 100 μm can be secured for the dislocations to bend and propagate in the inclined interface expansion step S220 and the following steps of the last cycle. As a result, dislocation-free regions that are at least 100 μm square can be formed at least in a portion of the surface of the flattening layer 40 formed in the last cycle.

At this time, the average distance L between closest peaks is preferably less than 800 μm, for example, in the inclined interface expansion step S220 of the second and the following cycles as well. In this case, the flattening layer 40 can be mirror-finished quickly in the flattening step S300 of the second and the following cycles as well.

S240: Inclined Interface Maintenance Step

In the second and the following cycles as well, after the c-plane 30c has disappeared from the surface of the expanded inclined interface layer 32, the first growth condition described above is maintained in the inclined interface maintenance step S240, similarly to the inclined interface expansion step S220.

Figure 6B:
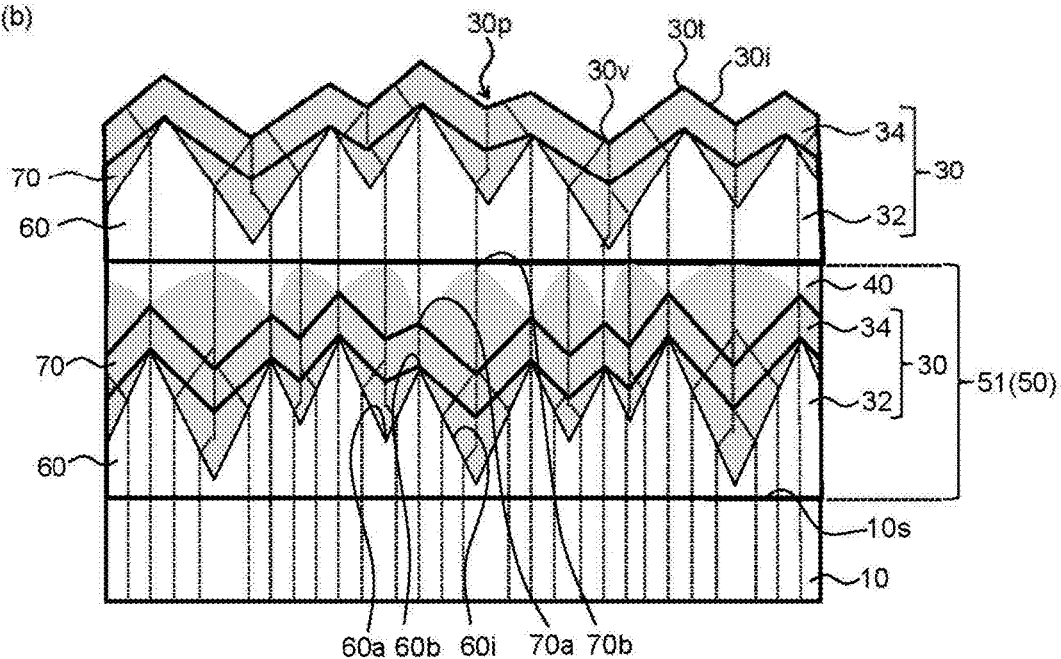

Thus, growth of the three-dimensional growth layer 30 is continued over a predetermined thickness while the state in which the inclined interface growth region 70 occupies 80% or more of the area of a cross section taken along the main surface of the base substrate is maintained as illustrated in FIG. 6(b). As a result, the inclined interface maintaining layer 34 is formed on the expanded inclined interface layer 32.

The three-dimensional growth layer 30 including the expanded inclined interface layer 32 and the inclined interface maintaining layer 34 is formed again in the three-dimensional growth step S200 of the second and the following cycles described above.

S300: Flattening Step

Figure 7:
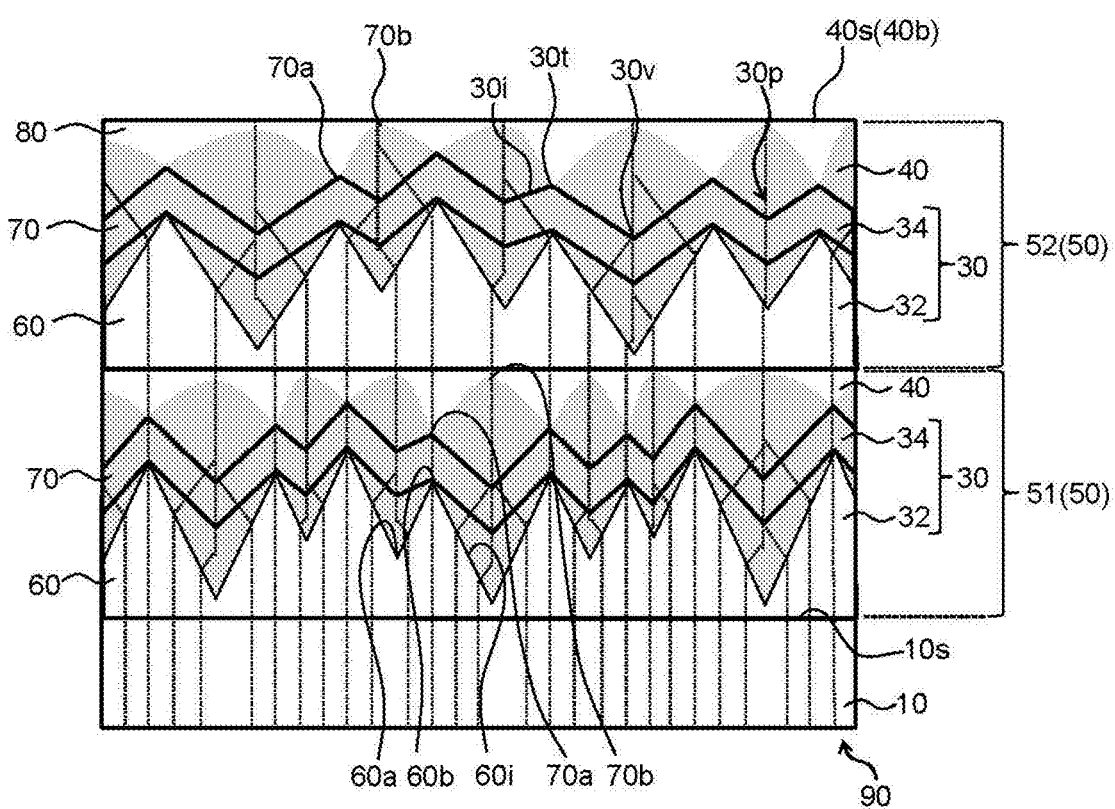
FIG. 7 is a schematic cross-sectional view illustrating a part of the method for manufacturing a nitride semiconductor substrate according to the embodiment of the present disclosure.

In the second and the following cycles as well, after the three-dimensional growth layer 30 in which the c-plane 30c has disappeared at least once is grown, the flattening layer 40 constituted by a single crystal of a group III nitride semiconductor is epitaxially grown on the three-dimensional growth layer 30 as illustrated in FIG. 7. At this time, the flattening layer 40 is grown under the same second growth condition as that in the flattening step S300 of the first cycle. Thus, the c-plane 40c is expanded and the inclined interfaces 40i other than the c-plane are contracted toward the upper side of the three-dimensional growth layer 30.

Thereafter, when the flattening layer 40 is further grown, the inclined interfaces 40i of the flattening layer 40 completely disappear, and the recessed portions 30p formed by the plurality of inclined interfaces 30i in the surface of the three-dimensional growth layer 30 are completely embedded. Thereby, the surface of the flattening layer 40 becomes a mirror-finished surface (flat surface) that is constituted only by the c-plane 40c.

At this time, the dislocation density can be further lowered by locally collecting the dislocations during the growth process of the three-dimensional growth layer 30 and the flattening layer 40 in the second and the following cycles as well. That is, the dislocation density in the surface of the flattening layer 40 formed in the second and the following cycles can be made lower than the dislocation density in the surface of the flattening layer 40 formed in the first cycle.

As described above, by repeating the cycle including the three-dimensional growth step S200 and the flattening step S300 a plurality of times, it is possible to gradually lower the dislocation density according to the number of repetitions of the cycle.

The laminated unit 50 including the three-dimensional growth layer 30 and the flattening layer 40 is formed again in the second and the following cycles including the three-dimensional growth step S200 and the flattening step S300 described above. In the following description, the laminated unit 50 formed in the second cycle may be referred to as a "second laminated 52".

S400: Execution Count Determination Step

After the second cycle ends, the number of times the cycle including the three-dimensional growth step S200 and the flattening step S300 was executed is determined again.

When the cycle has been executed the predetermined number N of times (Yes in step S400), the cycle including the three-dimensional growth step S200 and the flattening step S300 is ended.

The number of times the cycle is executed is set to two or more and five or less, for example. When the number of times the cycle is executed is set to two or more, the effect of reducing dislocations by repeating the cycle can be sufficiently achieved. On the other hand, the effect of reducing dislocations is remarkable only until the third cycle, and after the third cycle, it becomes more difficult to achieve the effect of reducing dislocations as the number of repetitions of the cycle increases. Accordingly, the number of times the cycle is executed is preferably no greater than five.

In the present embodiment, the cycle is ended when N=2, for example.

The c-plane growth region that has grown with the c-plane 40c of the flattening layer 40 gradually expanding in the last cycle constitutes a portion of a top c-plane growth region 80, which will be described later.

S500: Main Growth Step (c-Plane Growth Step)

Figure 8:
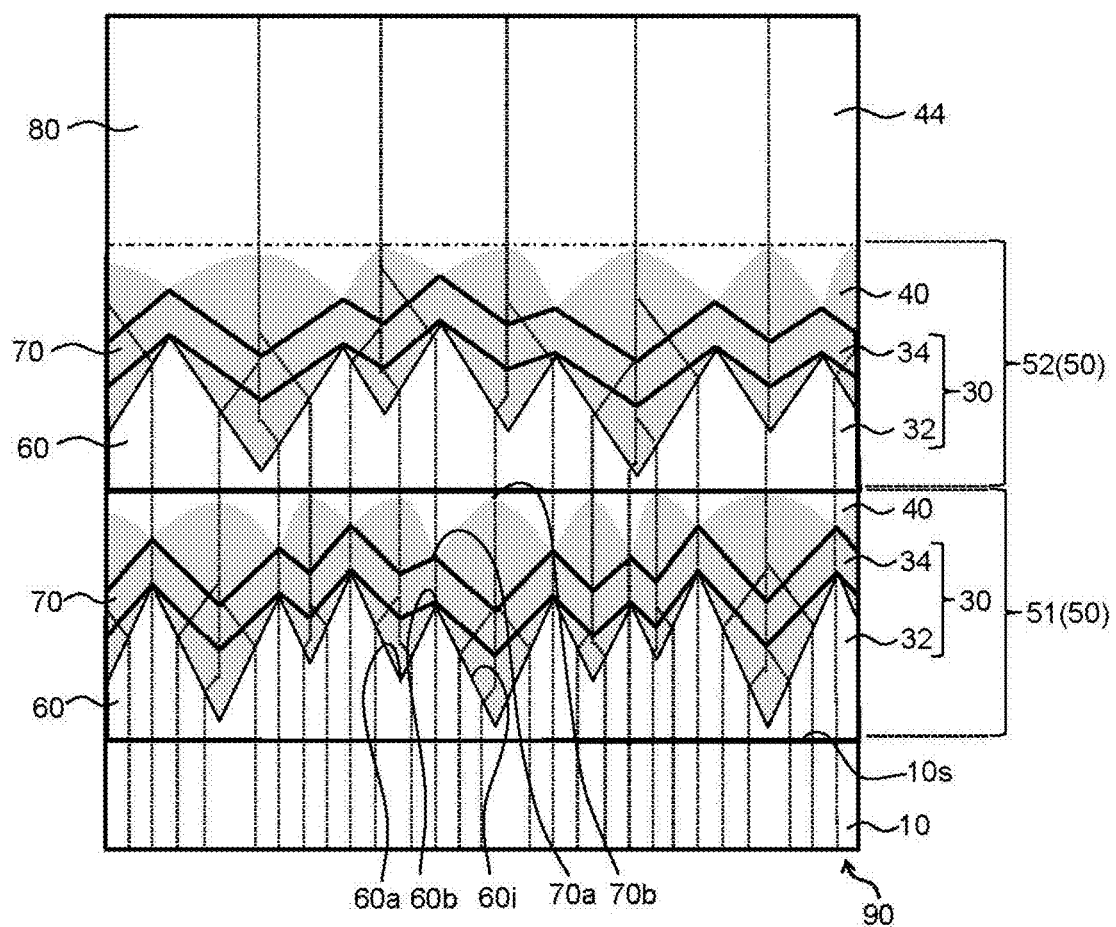
FIG. 8 is a schematic cross-sectional view illustrating a part of the method for manufacturing a nitride semiconductor substrate according to the embodiment of the present disclosure.

After the flattening step S300 of the last cycle, a main growth layer 44 is grown to a predetermined thickness with the c-plane serving as the growth surface on the flattening layer 40 that has the mirror-finished surface as illustrated in FIG. 8.

At this time, the above-described second growth condition is maintained in the main growth step S500, similarly to the flattening step S300 of each of the cycles described above. Thus, step-flow growth of the main growth layer 44 can be caused with the c-plane serving as the growth surface.

At this time, the radius of curvature of a c-plane of the main growth layer 44 can be made larger than the radius of curvature of the c-plane 10c of the base substrate 10. Thereby, variation in the off-angle of a c-axis with respect to the normal of a surface of the main growth layer 44 can be made smaller than variation in the off-angle of the c-axis 10ca with respect to the normal of the main surface 10s of the base substrate 10.

Also, at this time, the main growth layer 44 is grown with only the c-plane serving as the growth surface, without the inclined interfaces 40i being exposed, and accordingly, the entire main growth layer 44 constitutes the top c-plane growth region 80, which will be described later.

In the main growth step S500, the main growth layer 44 is set to, for example, 300 μm or more and 10 mm or less. If the thickness of the main growth layer 44 is 300 μm or more, at least one or more substrates 100 can be sliced from the main growth layer 44 in the slicing step S600, which will be described later. On the other hand, if the thickness of the main growth layer 44 is 10 mm, at least ten substrates 100 can be obtained when 700 μm-thick substrates 100 are sliced from the main growth layer 44 and a final thickness is set to 650 μm, even when a kerf loss of about 200 μm is taken into account.

Through the above-described steps from the three-dimensional growth step S200 of the first cycle to the main growth step S500, a laminated structure 90 according to the present embodiment is formed.

The steps from the three-dimensional growth step S200 in the first cycle to the main growth step S500 are continuously performed in the same chamber without exposing the base substrate 10 to the atmosphere. Thereby, it is possible to suppress unintended formation of a high oxygen concentration region (a region having an oxygen concentration that is excessively higher than that of the inclined interface growth region 70) at an interface between the three-dimensional growth layer 30 and the flattening layer 40, an interface between the laminated unites 50, and an interface between the flattening layer 40 and the main growth layer 44, for example.

S600: Slicing Step

Figure 9:
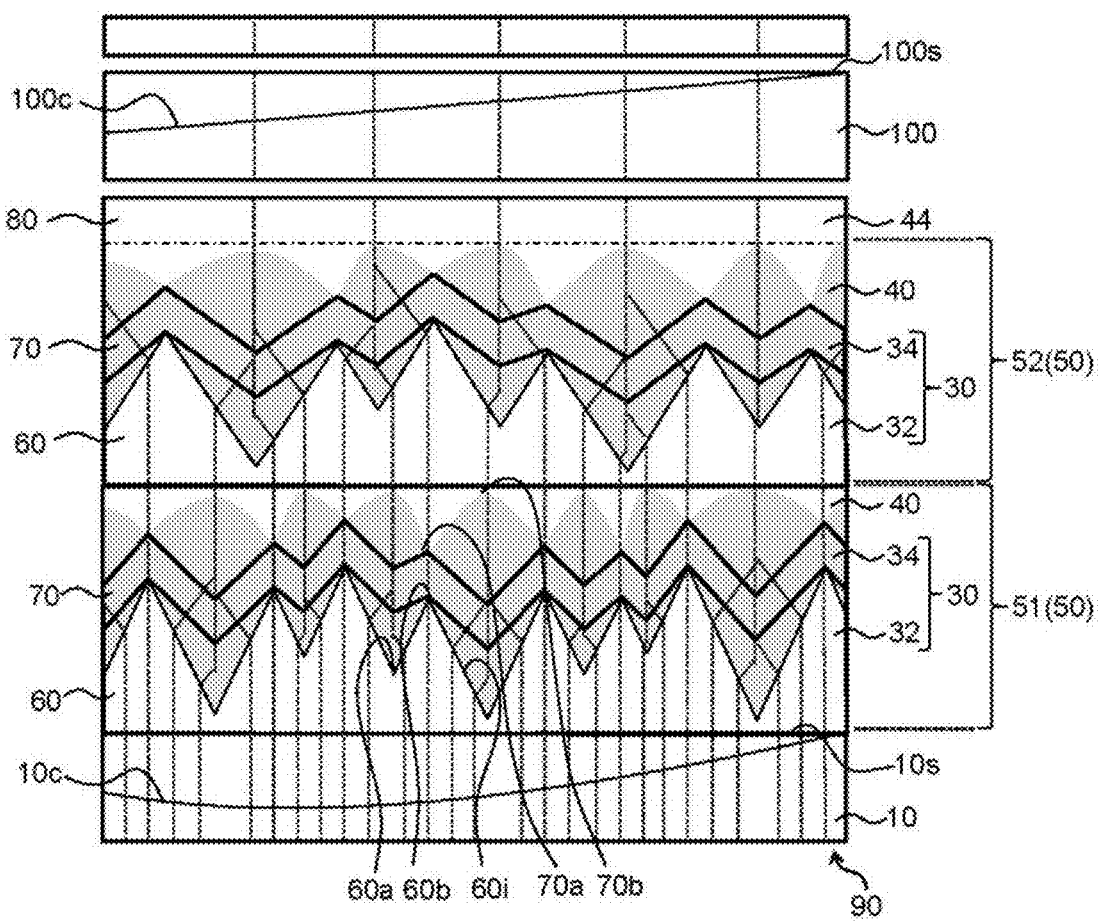
FIG. 9 is a schematic cross-sectional view illustrating a part of the method for manufacturing a nitride semiconductor substrate according to the embodiment of the present disclosure.

Next, as illustrated in FIG. 9, for example, the main growth layer 44 is sliced using a wire saw along a cut surface that is substantially parallel to the surface of the main growth layer 44. Thereby, at least one nitride semiconductor substrate 100 (also referred to as a "substrate 100") as an as-sliced substrate is formed. At this time, the thickness of the substrate 100 is, for example, 300 μm or more and 700 μm or less.

At this time, the radius of curvature of a c-plane 100c of the substrate 100 can be larger than the radius of curvature of the c-plane 10c of the base substrate 10. Also, at this time, the radius of curvature of the c-plane 100c of the substrate 100 can be larger than the radius of curvature of the c-plane 40c of the main growth layer 44 before sliced. Thereby, variation in the off-angle θ of a c-axis 100ca with respect to the normal of a main surface 100s of the substrate 100 can be made smaller than variation in the off-angle of the c-axis 10ca of the base substrate 10.

S700: Polishing step Next, both sides of the substrate 100 are polished using a polishing device. At this time, the final thickness of the substrate 100 is, for example, 250 μm or more and 650 μm or less.

The substrate 100 according to the present embodiment is manufactured by the above steps S100 to S700.

Step of preparing semiconductor laminate and step of preparing semiconductor device After the substrate 100 is manufactured, for example, a semiconductor functional layer that is constituted by a group III nitride semiconductor is epitaxially grown on the substrate 100 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, a laminated structure 90 according to the present embodiment will be described with reference to FIG. 8.

The laminated structure 90 according to the present embodiment includes the base substrate 10, a plurality of laminated units 50, and the top c-plane growth region (top low oxygen concentration region) 80, for example.

The plurality of laminated units 50 are repeatedly provided between the base substrate 10 and the top c-plane growth region 80 in the thickness direction, for example.

Each of the plurality of laminated units 50 includes the c-plane growth region (low oxygen concentration region 60) and the inclined interface growth region (high oxygen concentration region) 70, for example.

The c-plane growth region 60 is a region that has grown with the c-plane 30c serving as the growth surface. Oxygen uptake is suppressed in the c-plane growth region 60, as compared with the inclined interface growth region 70. Accordingly, the oxygen concentration in the c-plane growth region 60 is lower than the oxygen concentration in the inclined interface growth region 70. Specifically, the oxygen concentration in the c-plane growth region 60 is $5 \times 10^{16}$ cm$^{-3}$ or less, and preferably $3 \times 10^{16}$ cm$^{-3}$ or less.

The c-plane growth region 60 is provided above the main surface 10s of the base substrate 10. Since the c-plane 30c disappears at least once in the growth process of the three-dimensional growth layer 30, the c-plane growth region 60 is not continuous from the base substrate 10 side to the top c-plane growth region 80.

The c-plane growth region 60 includes, for example, a plurality of valleys 60a and a plurality of mountains 60b in a cross-sectional view. Each of the valleys 60a and the mountains 60b referred to herein means a part of a shape that is observed based on a difference in light emission intensity when a cross section of the laminated structure 90 is observed using a fluorescence microscope or the like, and does not mean a part of the shape of an outermost surface generated during the growth of the three-dimensional growth layer 30. The plurality of valleys 60a are each an inflection point that is convex downward in the c-plane growth region 60 in the cross-sectional view, and are formed at positions at which the inclined interfaces 30i are generated. At least one of the plurality of valleys 60a is provided at a position that is spaced upward from the main surface 10s of the base substrate 10. On the other hand, the plurality of mountains 60b are each an inflection point that is convex upward in the c-plane growth region 60 in the cross-sectional view, and are formed at positions at which the c-plane 30c (finally) terminates and disappears, with a pair of inclined interfaces 30i that expand in opposite directions sandwiched between the positions. The valleys 60a and the mountains 60b are formed alternately in a direction extending along the main surface 10s of the base substrate 10.

When an arbitrary cross section perpendicular to the main surface 10s of the base substrate 10 is observed, an average distance between a pair of mountains 60b spaced apart from each other in a direction extending along the main surface 10s of the base substrate 10 corresponds to the average distance L between closest peaks of the three-dimensional growth layer 30 described above, and is more than 100 μm, for example, the pair of mountains being closest to each other among the plurality of mountains 60b with one of the plurality of valleys 60a sandwiched between them. In the following description, this distance will also be referred to as an "average distance between closest mountains".

The c-plane growth region 60 includes a pair of inclined portions 60i that are formed on opposite sides of each of the plurality of mountains 60b as loci of intersections between the c-plane 30c and the inclined interfaces 30i. Each of the inclined portions 60i referred to herein means a part of the shape observed based on the difference in light emission intensity when the cross section of the laminated structure 90 is observed using a fluorescence microscope or the like, and does not mean the inclined interface 30i at the outermost surface generated during the growth of the three-dimensional growth layer 30.

An angle formed by the pair of inclined portions 60i in a cross section taken along a plane that passes through centers of two adjacent valleys 60a is, for example, 70° or less, and preferably 20° or more and 65° or less. The angle formed by the pair of inclined portions 60i being 70° or less means that under the first growth condition, the ratio $G_{c1}/G_i$ is high, which is the ratio of the growth rate $G_{c1}$ of the c-plane 30c of the three-dimensional growth layer 30 to the growth rate $G_i$ of the inclined interface 30i most inclined with respect to the c-plane 30c of the three-dimensional growth layer 30. Thereby, the inclined interfaces 30i other than the c-plane can be easily generated. As a result, dislocations can be easily bent at positions where the inclined interfaces 30i are exposed. Further, since the angle formed by the pair of inclined portions 60i is 70° or less, a plurality of valleys 30v and a plurality of peaks 30t can be easily generated above the main surface 10s of the base substrate 10. Further, if the angle formed by the pair of inclined portions 60i is 65° or less, the inclined interfaces 30i other than the c-plane can be generated more easily, and the plurality of valleys 30v and the plurality of peaks 30t can be generated more easily above the main surface 10s of the base substrate 10. Also, if the angle formed by the pair of inclined portions 60i is 20° or more, it is possible to suppress an increase in the height from the valley 30v to the peak 30t of the three-dimensional growth layer 30, and suppress an increase in the thickness of the flattening layer 40 until the flattening layer 40 is mirror-finished.

On the other hand, the inclined interface growth region 70 is a region that has grown with the inclined interfaces 30i or the inclined interfaces 40i serving as growth surfaces. Oxygen is easily taken into the inclined interface growth region 70, as compared with the c-plane growth region 60 and the top c-plane growth region 80, which will be described later. Accordingly, the oxygen concentration in the inclined interface growth region 70 is higher than the oxygen concentration in the c-plane growth region 60 and the oxygen concentration in the top c-plane growth region 80. The oxygen taken into the inclined interface growth region 70 is, for example, oxygen that is unintentionally introduced into a vapor phase growth apparatus, oxygen that is released from a member (quartz member or the like) constituting the vapor phase growth apparatus, or the like. Specifically, the oxygen concentration in the inclined interface growth region 70 is, for example, $9 \times 10^{17}$ cm$^{-3}$ or more and $5 \times 10^{19}$ cm$^{-3}$ or less.

The inclined interface growth region 70 of a laminated unit 50 is provided on the c-plane growth region 60 of the same laminated unit 50, for example. The inclined interface growth region 70 is provided continuously along the main surface 10s of the base substrate 10. That is, when a plurality of cross sections of the three-dimensional growth layer 30 taken along the main surface 10s of the base substrate 10 are observed, it is desirable that there is a cross section that does not include the c-plane growth region, which has grown with the c-plane 30c serving as the growth surface, at least in a portion of the three-dimensional growth layer 30 in its thickness direction.

The lower surface of the inclined interface growth region 70 conforms to the shape of the c-plane growth region 60 of the same laminated unit 50, for example.

The lower surface of the inclined interface growth region 70 includes a plurality of valleys 70a and a plurality of mountains 70b in a cross-sectional view, for example. Each of the valleys 70a and the mountains 70b referred to herein means a part of a shape that is observed based on a difference in light emission intensity when a cross section of the laminated structure 90 is observed using a fluorescence microscope or the like, and does not mean a part of the shape of an outermost surface generated during the growth of the flattening layer 40. The plurality of valleys 70a of the inclined interface growth region 70 are formed at positions at which the c-plane 40c is generated again in the cross-sectional view as described above. Also, the plurality of valleys 70a of the inclined interface growth region 70 are respectively formed above the plurality of mountains 60b of the c-plane growth region 60 in the cross-sectional view. On the other hand, the plurality of mountains 70b of the inclined interface growth region 70 are formed at positions where the inclined interfaces 40i terminate and disappear in the cross-sectional view as described above. Also, the plurality of mountains 70b of the inclined interface growth region 70 are respectively formed above the plurality of valleys 60a of the c-plane growth region 60 in the cross-sectional view.

A boundary surface that extends along the main surface 10s of the base substrate 10 at the upper end of the inclined interface growth region 70 serves as a boundary surface between the laminated units 50, which is located at a position at which the inclined interfaces 40i terminate and disappear. In the following description, a boundary surface that extends along the main surface 10s of the base substrate 10 at the upper end of the inclined interface growth region 70 of a predetermined laminated unit 50 will also be simply referred to as a "boundary surface of the laminated unit 50".

The c-plane growth region 60 of the second or higher laminated unit 50 is provided on the inclined interface growth region 70 of the laminated unit 50 that is under the second or higher laminated unit 50, for example.

The top c-plane growth region 80 is provided on the inclined interface growth region 70 of the highest laminated unit 50, for example.

The top c-plane growth region 80 is a region that has grown with the c-plane c serving as the growth surface. Oxygen uptake is suppressed in the top c-plane growth region 80, as compared with the inclined interface growth region 70. Accordingly, the oxygen concentration in the top c-plane growth region 80 is lower than the oxygen concentration in the inclined interface growth region 70. Similarly to the oxygen concentration in the c-plane growth region 60, the oxygen concentration in the top c-plane growth region 80 is $5 \times 10^{16}$ cm$^{-3}$ or less, and preferably $3 \times 10^{16}$ cm$^{-3}$ or less, for example.

In the present embodiment, when an arbitrary cross section perpendicular to the main surface 10s of the base substrate 10 is observed, the average distance between closest mountains in the second or higher laminated unit 50 of the plurality of laminated units 50 is longer than the average distance between closest mountains in the first laminated unit 50, for example.

Also, in the present embodiment, when an arbitrary cross section perpendicular to the main surface 10s of the base substrate 10 is observed, the average distance between closest mountains gradually increases toward the upper side of the plurality of laminated units 50 such that a higher laminated unit 50 has a longer average distance between closest mountains.

Also, in the present embodiment, dislocations bend and propagate in the direction substantially perpendicular to the inclined interfaces 30i other than the c-plane at positions at which the inclined interfaces 30i are exposed during the growth process of the three-dimensional growth layer 30 in each cycle, and consequently, some of the plurality of dislocations disappear and some of the plurality of dislocations are kept from propagating toward the surface side of a c-plane expansion layer 42 in the flattening layer 40. Thus, the dislocation density in the boundary surface of each laminated unit 50 becomes lower than the dislocation density in the main surface 10s of the base substrate 10.

Also, in the present embodiment, dislocations are locally collected during the growth process of the three-dimensional growth layer 30 and the flattening layer 40 in the second and the following cycles as well, and accordingly, the dislocation densities in the boundary surfaces of the second and higher laminated units 50 are lower than the dislocation density in the boundary surface of the first laminated unit 50.

Also, in the present embodiment, the cycle including the three-dimensional growth step S200 and the flattening step S300 is repeatedly performed a plurality of times, and therefore, the dislocation density is gradually lowered according to the number of repetitions of the cycle. Specifically, the dislocation density in the boundary surface gradually decreases toward the upper side of the plurality of laminated units 50 such that a higher laminated unit 50 has a lower dislocation density in the boundary surface.

As a result of the above, the dislocation density is sharply reduced in the thickness direction in the present embodiment.

Here, let $N_0$ be the dislocation density in the main surface 10s of the base substrate 10, and let N be the dislocation density (average dislocation density) in the boundary surface of the highest laminated unit 50. On the other hand, let N' be the dislocation density in a surface of a crystal layer of a group III nitride semiconductor that is epitaxially grown on the main surface 10s of the base substrate 10 so as to have a thickness equal to the thickness from the main surface 10s of the base substrate 10 to the boundary surface of the highest laminated unit 50 in the present embodiment, with only the c-plane serving as the growth surface (hereinafter, such a case will also be referred to as "in the case of c-plane thick film growth (c-plane limited growth)").

In the case of the c-plane thick film growth, the dislocation density in the surface of the crystal layer tended to be inversely proportional to the thickness of the crystal layer. Specifically, in the case of the c-plane thick film growth, when the thickness of the crystal layer is 2 mm, a dislocation density reduction rate $N'/N_0$ is about 0.5.

In contrast, in the present embodiment, a dislocation density reduction rate $N/N_0$ is smaller than the dislocation density reduction rate $N'/N_0$ of the case of the c-plane thick film growth, for example.

Specifically, in the present embodiment, the thickness of each laminated unit 50 is, for example, more than 200 μm and 1.5 mm or less, and preferably 1.2 mm or less. When the number of laminated units 50 stacked on each other is two, the thickness from the main surface 10s of the base substrate 10 to the boundary surface of the second laminated unit 52 is, for example, 3 mm or less, and preferably 2.4 mm or less. In this case, the above-described dislocation density reduction rate $N/N_0$ is, for example, 0.15 or less, preferably 0.10 or less, and more preferably 0.08 or less.

In the present embodiment, the lower limit of the dislocation density reduction rate is not limited, because the smaller, the better. However, when a base substrate 10 that has an average dislocation density of $3 \times 10^6$ cm$^{-2}$ is used, it is difficult to achieve an average dislocation density of $10^3$ cm$^{-2}$ or less in the boundary surface of the second laminated unit 52. Accordingly, the dislocation density reduction rate is $3 \times 10^{-4}$ or more, for example.

In addition, in the present embodiment, the entire surface of the laminated structure 90 is composed of +c plane, and the laminated units 50 and the top c-plane growth region 80 each do not include a polarity reversal domain (inversion domain). In this respect, the laminated structure 90 of the present embodiment is different from a laminated structure that is formed by a so-called DEEP (Dislocation Elimination by the Epitaxial-growth with inverse-pyramidal Pits) method, that is, different from a laminated structure including the polarity reversal domain in a core located at the center of a pit.

(3) Nitride Semiconductor Substrate (Nitride Semiconductor Free-Standing Substrate, Nitride Crystal Substrate)

Figure 12:
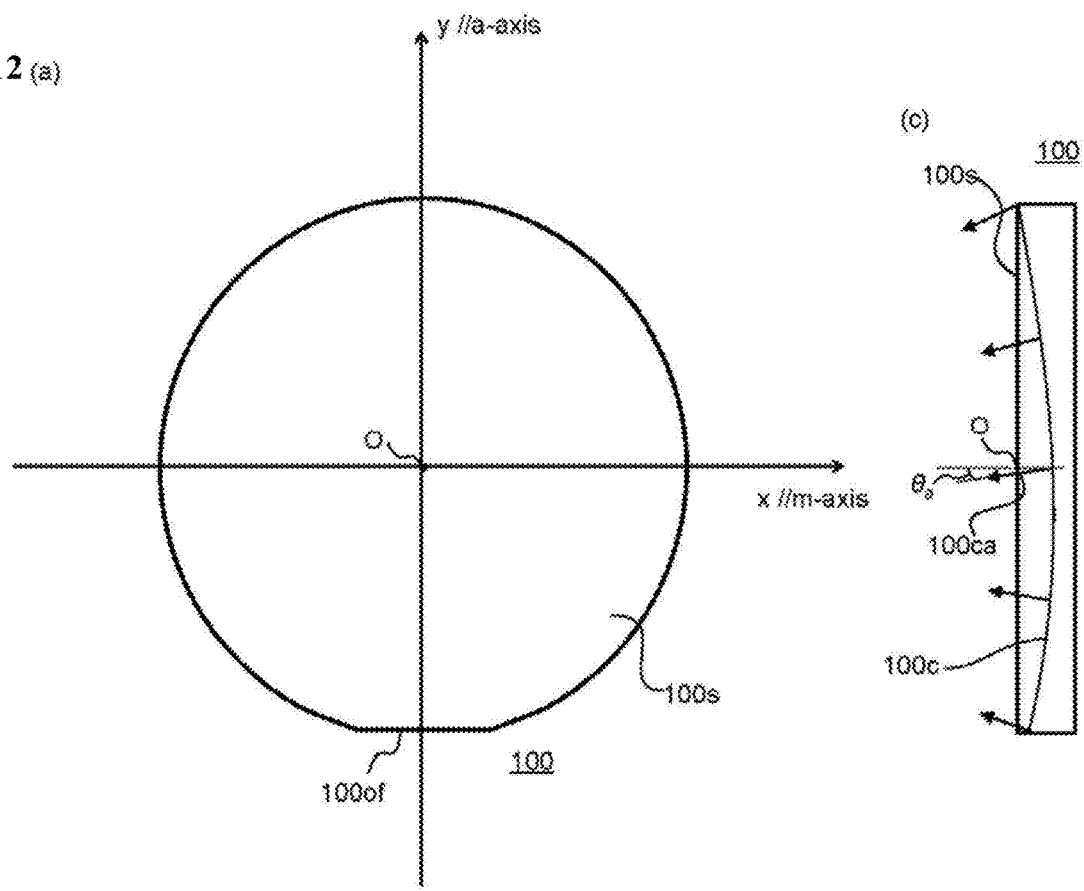
FIG. 12(a) is a schematic top view illustrating a nitride semiconductor substrate according to an embodiment of the present disclosure.
FIG. 12(b) is a schematic cross-sectional view taken along an m-axis of the nitride semiconductor substrate according to the embodiment of the present disclosure.
FIG. 12(c) is a schematic cross-sectional view taken along an a-axis of the nitride semiconductor substrate according to the embodiment of the present disclosure.
Figure 12:
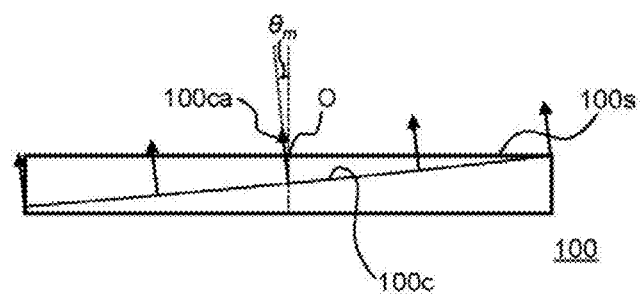

Next, the nitride semiconductor substrate 100 according to the present embodiment will be described with reference to FIG. 12. FIG. 12(a) is a schematic top view showing the nitride semiconductor substrate according to the present embodiment, FIG. 12(b) is a schematic cross-sectional view of the nitride semiconductor substrate according to the present embodiment, which is taken along an m-axis, and FIG. 12(c) is a schematic cross-sectional view of the nitride semiconductor substrate according to the present embodiment, which is taken along an a-axis. A direction that extends along the m-axis will be referred to as an x direction, and a direction that extends along the a-axis will be referred to as a y direction.

In the present embodiment, the substrate 100 obtained by slicing the main growth layer 44 using the above-described manufacturing method is a free-standing substrate constituted by a single crystal of a group III nitride semiconductor, for example. In the present embodiment, the substrate 100 is, for example, a GaN free-standing substrate.

The substrate 100 has a diameter of 2 inches or more, for example. The substrate 100 has a thickness of 300 µm or more and 1 mm or less, for example.

The conductivity of the substrate 100 is not particularly limited, but when manufacturing a semiconductor device as a vertical Schottky barrier diode (SBD) using the substrate 100, the substrate 100 is n-type, for example, an n-type impurity in the substrate 100 is Si or germanium (Ge), for example, and the concentration of the n-type impurity in the substrate 100 is $1.0 \times 10^{18}$ cm$^{-3}$ or more and $1.0 \times 10^{20}$ cm$^{-3}$ or less, for example.

The substrate 100 includes the main surface 100s that serves as an epitaxial growth surface, for example. In the present embodiment, a low index crystal plane that is closest to the main surface 100s is, for example, the c-plane 100c.

The main surface 100s of the substrate 100 is mirror-finished, for example, and has a root mean square roughness RMS of less than 1 nm, for example.

Further, in the present embodiment, the impurity concentration in the substrate 100 obtained using the above-described manufacturing method is lower than that of a substrate obtained using a flux method, an ammonothermal method, or the like.

Specifically, the hydrogen concentration in the substrate 100 is less than $1 \times 10^{17}$ cm$^{-3}$, and preferably $5 \times 10^{16}$ cm$^{-3}$ or less, for example.

Further, in the present embodiment, the substrate 100 is formed by slicing the main growth layer 44 grown with the c-plane 40c serving as the growth surface, and accordingly, the substrate 100 does not include the inclined interface growth region 70 grown with the inclined interfaces 30i or the inclined interfaces 40i serving as growth surfaces. That is, the entire substrate 100 is constituted by a low oxygen concentration region.

Specifically, the oxygen concentration in the substrate 100 is, for example, $5 \times 10^{16}$ cm$^{-3}$ or less, and preferably $3 \times 10^{16}$ cm$^{-3}$ or less.

Further, in the present embodiment, the substrate 100 does not include, for example, the polarity reversal domain (inversion domain) as described above.

Curvature of c-Plane and Variation in Off-Angle

As illustrated in FIGS. 12(b) and 12(c), in the present embodiment, the c-plane 100c, which is the low index crystal plane closest to the main surface 100s of the substrate 100, is curved in a concave spherical shape with respect to the main surface 100s, due to the above-described method for manufacturing the substrate 100, for example.

In the present embodiment, the c-plane 100c of the substrate 100 has a curved surface that approximates to a spherical surface in each of a cross section taken along the m-axis and a cross section taken along the a-axis, for example.

In the present embodiment, since the c-plane 50f of the substrate 100 is curved like a concave spherical surface as described above, at least a part of the c-axis 100ca is inclined with respect to the normal of the main surface 100s. The off-angle θ, which is the angle formed by the c-axis 100ca with respect to the normal of the main surface 100s, has a predetermined distribution within the main surface 100s.

In the off-angle θ formed by the c-axis 100ca with respect to the normal of the main surface 100s, a directional component extending along the m-axis is represented by θm, and a directional component extending along the a-axis is represented by $\theta_a$, and $\theta^2 = \theta_m^2 + \theta_a^2$ is satisfied.

In the present embodiment, since the c-plane 100c of the substrate 100 is curved like a concave spherical surface as described above, the off-angle m-axis component $\theta_m$ and the off-angle a-axis component $\theta_a$ can be represented approximately by a linear function of x and a linear function of y, respectively.

Specifically, when X-ray rocking curve measurement of the (0002) plane is performed at positions on a straight line that passes through the center in the main surface 100s, for example, and a peak value of an angle ω (hereinafter also referred to as a "peak angle ω") formed between the main surface 100s and X-rays incident on the main surface 100s is plotted for the positions on the straight line, the peak angle ω can be approximated by a linear function of the positions. Note that the "peak angle ω" referred to here is an angle that is formed between the main surface 100s and X-rays incident on the main surface 100s and at which diffraction intensity is at the maximum. The radius of curvature of the c-plane 100c can be determined based on the reciprocal of inclination of the linear function approximated as described above.

In the present embodiment, the radius of curvature of the c-plane 100c of the substrate 100 is larger than, for example, the radius of curvature of the c-plane 10c of the base substrate 10 used in the above-described method for manufacturing the substrate 100.

Specifically, the radius of curvature of the c-plane 100c of the substrate 100 is, for example, 23 µm or more, preferably 30 µm or more, and more preferably 40 µm or more.

For reference, in the case of the c-plane thick film growth as well, the radius of curvature of a c-plane in a substrate that is sliced from a crystal layer having the same thickness as the thickness from the main surface 10s of the base substrate 10 to the boundary surface of the highest laminated unit 50 of the present embodiment may be larger than the radius of curvature of the c-plane 10c of the base substrate 10. However, in the case of the c-plane thick film growth, when the thickness of the crystal layer is 2 mm, the radius of curvature of the c-plane in the substrate sliced from the crystal layer is about 11 μm and is about 1.4 times the radius of curvature of the c-plane 10c of the base substrate 10.

In the present embodiment, the upper limit of the radius of curvature of the c-plane 100c of the substrate 100 is not particularly limited, because the larger, the better. When the c-plane 100c of the substrate 100 is substantially flat, the radius of curvature of the c-plane 100c can be considered infinite.

Further, in the present embodiment, since the radius of curvature of the c-plane 100c of the substrate 100 is large, variation in the off-angle θ of the c-axis 100ca with respect to the normal of the main surface 100s of the substrate 100 can be smaller than variation in the off-angle of the c-axis 10ca of the base substrate 10.

Specifically, when X-ray rocking curve measurement of the (0002) plane of the substrate 100 is performed and the off-angle θ of the c-axis 100ca with respect to the normal of the main surface 100s is measured based on a diffraction peak angle of the (0002) plane, variation that is calculated as a difference between the largest off-angle θ and the smallest off-angle θ within a diameter of 2 inches (50.8 mm) from the center of the main surface 100s is, for example, 0.127° or less, preferably 0.097° or less, and more preferably 0.073° or less.

For reference, in the base substrate 10 prepared using the above-described VAS method, variation in the off-angle of the c-axis 10ca determined by the above-described measurement method is about 0.38°. Further, in the case of the c-plane thick film growth, when a nitride semiconductor substrate is obtained from a crystal layer that has the same thickness (for example, 2 mm) as the thickness from the main surface 10s of the base substrate 10 to the boundary surface of the highest laminated unit 50 of the present embodiment, variation in the off-angle of the c-axis of the nitride semiconductor substrate determined by the above-described measurement method is about 0.26°.

In the present embodiment, the lower limit of the variation in the off-angle θ of the c-axis 100ca of the substrate 100 is not particularly limited, because the smaller, the better. When the c-plane 100c of the substrate 100 is substantially flat, the variation in the off-angle θ of the c-axis 100ca of the substrate 100 can be considered 0°.

Further, in the present embodiment, since the curvature of the c-plane 100c becomes isotropically small with respect to the main surface 100s of the substrate 100, the radius of curvature of the c-plane 100c has little dependence on directions.

Specifically, a difference between the absolute value of a radius of curvature of the c-plane 100c in a direction extending along the a-axis and the absolute value of a radius of curvature of the c-plane 100c in a direction extending along the m-axis determined by the above-described measurement method is, for example, 90% or less, preferably 50% or less, and more preferably 20% or less of the larger radius of curvature.

Also, in the present embodiment, when the peak angle ω is approximated by the linear function of positions on the main surface 100s in X-ray rocking curve measurement of the c-plane 100c, an error of ω with respect to the linear function is small. The error of ω in the present embodiment can be made small as compared with, for example, a substrate obtained from a crystal layer grown on a base substrate on which patterning is performed using an ELO method in which a mask layer is used, or a substrate obtained from a flattening layer when the cycle was performed once and the c-plane did not disappear in the three-dimensional growth step.

Specifically, the error of a measured peak angle ω with respect to the linear function approximated as described above is, for example, no greater than 0.05°, preferably no greater than 0.02°, and more preferably no greater than 0.01°. At least some peak angles ω may match the linear function, and accordingly, the minimum value of the error is 0°.

Dark Spots

Next, dark spots on the main surface 100s of the substrate 100 of the present embodiment will be described. The "dark spots" referred to herein means points at which the light emission intensity is low in an observation image of the main surface 100s observed using a multiphoton excitation microscope, a cathodoluminescence image of the main surface 100s, or the like, and includes not only dislocations but also non-light-emissive centers due to foreign matters or point defects. The "multiphoton excitation microscope" is sometimes called a two-photon excitation fluorescence microscope.

In the present embodiment, since the substrate 100 is manufactured using the base substrate 10 constituted by a high-purity GaN single crystal prepared by the VAS method, there are few non-light-emissive centers due to foreign matters or point defects in the substrate 100. Accordingly, 95% or more, preferably 99% or more, and more preferably 100% of dark spots in the main surface of the substrate 100 observed using the multi-photon excitation microscope or the like are dislocations, rather than non-light-emissive centers due to foreign matters or point defects.

Further, in the present embodiment, due to the above-described manufacturing method, the dislocation density in the surface of the main growth layer 44 is lower than the dislocation density in the main surface 10s of the base substrate 10. Accordingly, the dislocation density is also lowered in the main surface 100s of the substrate 100 formed by slicing the main growth layer 44.

Moreover, in the above-described manufacturing method of the present embodiment, the three-dimensional growth step S200 or the like is performed using the base substrate 10 on which patterning has not been performed, and therefore, the main surface 100s of the substrate 100 formed by slicing the main growth layer 44 does not include regions in which the dislocation density is excessively high due to patterning performed on the base substrate 10, and regions in which the dislocation density is low are uniformly formed in the main surface 100s of the substrate 100.

Specifically, in the present embodiment, when the dislocation density is determined based on a dark spot density by observing the main surface 100s of the substrate 100 using a multiphoton excitation microscope in a field of view that is 250 μm square, there is no region that has a dislocation density higher than $3 \times 10^6$ cm$^{-2}$, and regions that have a dislocation density lower than $1 \times 10^6$ cm$^{-2}$ constitute 80% or more, preferably 90% or more, and more preferably 95% or more of the main surface 100s.

When the manufacturing method of the present embodiment is used, the upper limit of the ratio of regions that have a dislocation density lower than $1 \times 10^6$ cm$^{-2}$ is 100%.

Furthermore, in the present embodiment, the cycle including the three-dimensional growth step S200 and the flattening step S300 is repeatedly performed a plurality of times, and therefore, the dislocation density in the main surface 100s of the substrate 100 is lowered according to the number of repetitions of the cycle. That is, the dislocation density in the main surface 100s of the substrate 100 according to the present embodiment is lower than the dislocation density in the main surface of a substrate that is formed by slicing the main growth layer when the cycle is performed only once.

Specifically, in the present embodiment, when the dislocation density is determined based on a dark spot density by observing the main surface 100s of the substrate 100 using a multiphoton excitation microscope in a field of view that is 250 µm square, there is no region that has a dislocation density higher than or equal to $1\times10^6$ cm$^{-2}$, and regions that have a dislocation density lower than $7\times10^5$ cm$^{-2}$ constitute 80% or more, preferably 90% or more, and more preferably 95% or more of the main surface 100s.

When the manufacturing method of the present embodiment is used, the upper limit of the ratio of regions that have a dislocation density lower than $7\times10^5$ cm$^{-2}$ is 100%.

Also, in the present embodiment, a dislocation density determined by averaging the entire main surface 100s of the substrate 100 is, for example, lower than $7\times10^5$ cm$^{-2}$, preferably lower than $5.5\times10^5$ cm$^{-2}$, and more preferably $3\times10^5$ cm$^{-2}$ or less.

Further, the main surface 100s of the substrate 100 of the present embodiment includes, for example, dislocation-free regions that are at least 50 µm square based on the average distance L between closest peaks in the three-dimensional growth step S200 described above.

Further, in the present embodiment, the dislocation density is lowered over the entire main surface 100s of the substrate 100, and accordingly, dislocation-free regions that are 50 µm square are scattered over the entire main surface 100s of the substrate 100, for example.

Also, the density of dislocation-free regions is high in the present embodiment because the plurality of cycles are performed and the average distance L between closest peaks is increased in each cycle when compared with that in the first cycle. Specifically, the main surface 100s of the substrate 100 includes dislocation-free regions that are 50 µm square and do not overlap each other at a density of, for example, 100 regions/cm$^2$ or more, preferably 1000 regions/cm$^2$ or more, more preferably 1600 regions/cm$^2$ or more, yet more preferably 4800 regions/cm$^2$ or more, and most preferably 10000 regions/cm$^2$ or more.

The upper limit of the density of dislocation-free regions that are 50 µm square and do not overlap each other is 40000 regions/cm$^2$ based on the method for measuring the density.

Also, in the present embodiment, the average distance L between closest peaks is more than 200 µm in at least the inclined interface expansion step S220 of the last cycle of the plurality of cycles, and therefore, at least a portion of the main surface 100s of the substrate 100 includes dislocation-free regions that are at least 100 µm square, for example. The main surface 100s of the substrate 100 includes dislocation-free regions that are 100 µm square and do not overlap each other at a density of, for example, 100 regions/cm$^2$ or more, and preferably 250 regions/cm$^2$ or more.

The upper limit of the density of dislocation-free regions that are 100 µm square and do not overlap each other is 10000 regions/cm$^2$ based on the method for measuring the density.

Also, in the present embodiment, even in a region other than the dislocation-free regions (e.g., a region between a pair of adjacent dislocation-free regions), dislocations are not excessively concentrated and the dislocation density is low. Specifically, the number of dislocations that are present in a quadrangular region sandwiched between mutually opposed sides of a pair of dislocation-free regions that are 50 µm square and closest to each other is, for example, 330 or less, preferably 90 or less, more preferably 70 or less, yet more preferably 33 or less, and most preferably 18 or less.

For reference, in the case of a substrate that is obtained using a conventional manufacturing method in which a special process for collecting dislocations is not performed, the size of dislocation-free regions is smaller than 50 µm square, or the density of dislocation-free regions that are 50 µm square is lower than 100 regions/cm$^2$. Since the density of dislocation-free regions that are 50 µm square is low, the number of dislocations that are present between a pair of dislocation-free regions is large. Furthermore, it is highly likely that dislocation-free regions that are 100 µm square will not be formed.

Next, the Burgers vector of the dislocations in the substrate 100 of the present embodiment will be described.

In the present embodiment, the dislocation density in the main surface 10s of the base substrate 10 used in the above-described manufacturing method is low, and therefore, a plurality of dislocations are less likely to be combined (mixed) when the three-dimensional growth layer 30 and the flattening layer 40 are grown on the base substrate 10. This makes it possible to suppress the formation of dislocations having a large Burgers vector in the substrate 100 obtained from the flattening layer 40.

Specifically, in the substrate 100 of the present embodiment, for example, the Burgers vector of most of the dislocations is any of <11-20>/3, <0001>, and <11-23>/3. The "Burgers vector" referred to herein can be measured by, for example, a large-angle convergent-beam electron diffraction method (LACBED method) using a transmission electron microscope (TEM). Dislocations whose Burgers vector is <11-20>/3 are edge dislocations, dislocations whose Burgers vector is <0001> are screw dislocations, and dislocations whose Burgers vector is <11-23>/3 are mixed dislocations in which edge dislocations and screw dislocations are mixed.

In the present embodiment, when 100 dislocations in the main surface 100s of the substrate 100 are extracted at random, the percentage of dislocations whose Burgers vector is any of <11-20>/3, <0001>, and <11-23>/3 is, for example, 50% or more, preferably 70% or more, and more preferably 90% or more. Dislocations whose Burgers vector is 2<11-20>/3, <11-20>, or the like may be present at least in a part of the main surface 100s of the substrate 100.

X-ray rocking curve measurement of c-plane diffraction in which width of incident side slit in ω direction is varied Here, the inventor found that it is possible to evaluate both crystal quality factors of the substrate 100 of the present embodiment and the curvature (warp) of the c-plane 100c described above at the same time by performing X-ray rocking curve measurement of c-plane diffraction and varying the width of an incident side slit in a ω direction in the measurement.

First, the influence of crystal quality factors on the X-ray rocking curve measurement will be described.

A full width at half maximum of a diffraction pattern in the X-ray rocking curve measurement is greatly affected by crystal quality factors such as high/low dislocation density, high/low mosaicity, high/low stacking fault density, high/low basal plane dislocation density, high/low point defect (vacancy, etc.) density, large or small amount of in-plane fluctuation of lattice constant, and a distribution of an impurity concentration. When these crystal quality factors are not good, a fluctuation of a diffraction angle in the X-ray rocking curve measurement becomes large, and the full width at half maximum of the diffraction pattern becomes large.

Figure 13:
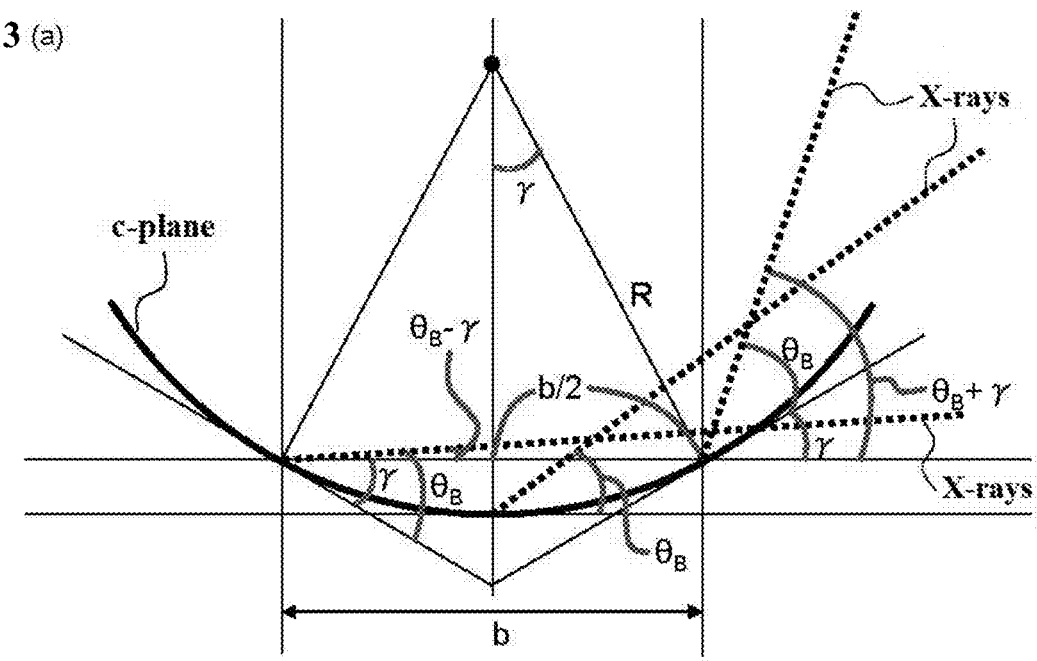
FIG. 13(a) is a schematic cross-sectional view illustrating X-ray diffraction with respect to a curved c-plane.
FIGS. 13(b) and 13(c) are diagrams showing fluctuation of the diffraction angle of a (0002) plane relative to the radius of curvature of the c-plane.
Figure 13:
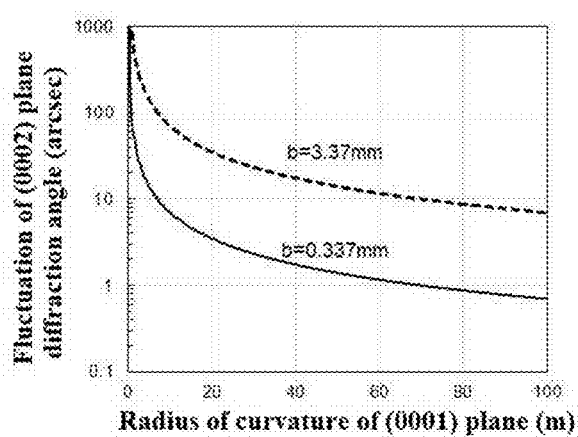
Figure 13:
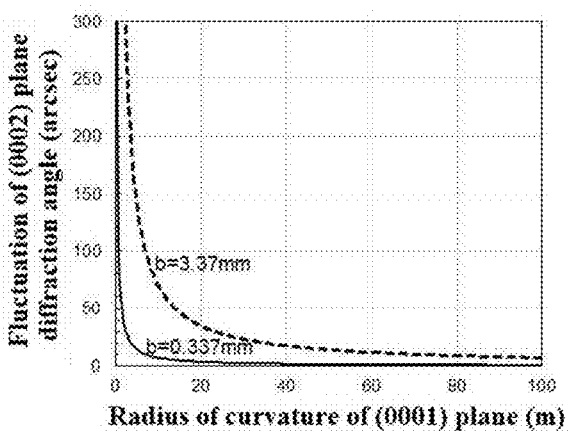

Next, the influence of the curvature of the c-plane 100c in the X-ray rocking curve measurement will be described with reference to FIG. 13(a). FIG. 13(a) is a schematic cross-sectional view illustrating diffraction of X-rays with respect to a curved c-plane.

An X-ray irradiation width b on the main surface of the substrate is calculated using the following formula (h):

$$b = dI/\sin\theta_B \qquad (h)$$

where dI represents the width of an incident side slit in the ω direction, b represents the X-ray irradiation width (width of a footprint) by which the main surface of the substrate is irradiated with X-rays, and θB represents the Bragg angle of the crystal.

"ω" represents a rotation angle about a rotation axis of a goniometer and "ω direction" refers to the direction of the rotation angle about the rotation axis in the X-ray rocking curve measurement. In the measurement of c-plane diffraction, "ω" and "ω direction" can also be taken to be a rotation angle of the substrate 100 and the direction in which the substrate 100 is rotated, respectively, when the substrate 100 that is placed on a substrate stage is rotated about a center axis that passes through the center of the substrate stage and is parallel to a placement surface of the substrate stage.

In a case where the c-plane of the substrate is curved, the radius of curvature R of the c-plane is very large relative to the X-ray irradiation width b as illustrated in FIG. 13(a) in which R represents the radius of curvature of the c-plane and γ represents half of the central angle formed by the curved c-plane within the range of the X-ray irradiation width b. Therefore, the angle γ can be calculated using the following formula (i).

$$\gamma = \sin^{-1}(b/2R) \approx b/2R \qquad (i)$$

At this time, at the incident side end (right end in the figure) of the region in the c-plane of the substrate irradiated with X-rays, the diffraction angle with respect to the main surface of the substrate is: $\theta_B+\gamma=\theta_B+b/2R$.

On the other hand, at the beam receiving side end (left end in the figure) of the region in the c-plane of the substrate irradiated with X-rays, the diffraction angle with respect to the main surface of the substrate is $\theta_B-\gamma=\theta_B-b/2R$.

Accordingly, based on the difference between the diffraction angle with respect to the main surface of the substrate at the incident side end of the c-plane of the substrate and the diffraction angle with respect to the main surface of the substrate at the beam receiving side end of the c-plane of the substrate, fluctuation of the X-ray diffraction angle with respect to the curved c-plane is b/R.

FIGS. 13(b) and 13(c) are diagrams showing fluctuation of the diffraction angle of the (0002) plane relative to the radius of curvature of the c-plane. The vertical axis of FIG. 13(b) is a logarithmic scale, and the vertical axis of FIG. 13(c) is a linear scale.

As shown in FIGS. 13(b) and 13(c), when the width dI of the X-ray incident side slit in the ω direction is increased, that is, when the X-ray irradiation width b is increased, fluctuation of the diffraction angle of the (0002) plane increases according to the X-ray irradiation width b. Also, as the radius of curvature R of the c-plane becomes smaller, fluctuation of the diffraction angle of the (0002) plane gradually increases. The difference in the fluctuation of the diffraction angle of the (0002) plane between different X-ray irradiation widths b becomes larger as the radius of curvature R of the c-plane becomes smaller.

For example, when the width dI of the incident side slit in the ω direction is narrow, the influence of the curvature of the c-plane is small, and the influence of the above-described crystal quality factors becomes dominant in the fluctuation of the diffraction angle of the (0002) plane. In contrast, for example, when the width dI of the incident side slit in the ω direction is wide, both the influence of the crystal quality factors and the influence of the curvature of the c-plane are superimposed in the fluctuation of the diffraction angle of the (0002) plane. Accordingly, by varying the width dI of the incident side slit in the ω direction when performing X-ray rocking curve measurement, it is possible to evaluate both the above-described crystal quality factors and the curvature (warp) of the c-plane at the same time across the region irradiated with X-rays.

Here, features of the substrate 100 of the present embodiment when X-ray rocking curve measurement of c-plane diffraction is performed will be described.

In the following description, when X-ray rocking curve measurement of (0002) plane diffraction is performed by irradiating the main surface 100s of the substrate 100 with Cu Kα1 X-rays via a two-crystal monochromator of a Ge (220) plane and the incident side slit, a full width at half maximum of the (0002) plane diffraction when the width of the incident side slit in the ω direction is 1 mm is represented by "FWHMa", and a full width at half maximum of the (0002) plane diffraction when the width of the incident side slit in the ω direction is 0.1 mm is represented by "FWHMb".

In the substrate 100 of the present embodiment, all of the above-described crystal quality factors such as high/low dislocation density, high/low mosaicity, high/low stacking fault density, high/low basal plane dislocation density, high/low point defect (vacancy, etc.) density, large or small amount of in-plane fluctuation of lattice constant, and a distribution of an impurity concentration are good.

As a result, in the substrate 100 of the present embodiment, when the X-ray rocking curve measurement of (0002) plane diffraction is performed with the width of the incident side slit in the ω direction set to 0.1 mm, the full width at half maximum FWHMb of the (0002) plane diffraction is, for example, 80 arcsecs or less, preferably 50 arcsecs or less, and more preferably 32 arcsecs or less.

Further, in the substrate 100 of the present embodiment, all of the above-described crystal quality factors are good over a wide range of the main surface 100s.

As a result, when the X-ray rocking curve measurement of (0002) plane diffraction is performed at a plurality of measurement points that are set at 5 mm intervals (between the center and the outer edge) within the main surface 100s of the substrate 100 of the present embodiment with the width of the incident side slit in the ω direction set to 0.1 mm, the full width at half maximum FWHMb of the (0002) plane diffraction is 80 arcsecs or less, preferably 50 arcsecs or less, and more preferably 32 arcsecs or less, for example, at 90% or more, preferably 95% or more, and more preferably 100% of all the measurement points.

Further, in-plane variation of the above-described crystal quality factors is small in the substrate 100 of the present embodiment. Therefore, a (0002) plane diffraction pattern obtained through X-ray rocking curve measurement in which the width of the incident side slit in the ω direction is wide is unlikely to be narrower than a (0002) plane diffraction pattern obtained through X-ray rocking curve measurement in which the width of the incident side slit in the ω direction is narrow.

As a result, in the substrate 100 of the present embodiment, the full width at half maximum FWHMa of the (0002) plane diffraction when the width of the incident side slit in the ω direction is 1 mm can be, for example, larger than or equal to the full width at half maximum FWHMb of the (0002) plane diffraction when the width of the incident side slit in the ω direction is 0.1 mm.

Even when the crystal quality factors of the substrate 100 are good, there is a case where FWHMa<FWHMb is satisfied, with FWHMb being very small.

In the substrate 100 of the present embodiment, not only there are few dislocations, but also all of the above-described crystal quality factors are good in a well-balanced manner over a wide range of the main surface 100s as described above. Moreover, the curvature of the c-plane 100c of the substrate 100 is small and the radius of curvature of the c-plane 100c is large. Accordingly, even when the X-ray rocking curve measurement of (0002) plane diffraction is performed with the width of the incident side slit in the ω direction being wide, fluctuation of the diffraction angle of the (0002) plane does not become very large because the above-described crystal quality factors are good in a well-balanced manner and the radius of curvature of the c-plane is large across the region in the substrate 100 of the present embodiment irradiated with X-rays. Therefore, even when the width of the incident side slit in the ω direction is varied in the X-ray rocking curve measurement, a difference in the fluctuation of the diffraction angle of the (0002) plane is small.

As a result, at a predetermined measurement point (e.g., the center of the main surface) of the substrate 100 of the present embodiment, a difference FWHMa-FWHMb obtained by subtracting the full width at half maximum FWHMb of (0002) plane diffraction when the width of the incident side slit in the ω direction is 0.1 mm from the full width at half maximum FWHMa of (0002) plane diffraction when the width of the incident side slit in the ω direction is 1 mm is, for example, (0% or more and) 30% or less, and preferably 22% or less of FWHMa.

Further, when the X-ray rocking curve measurement of (0002) plane diffraction is performed at a plurality of measurement points set at 5 mm intervals (between the center and the outer edge) within the main surface 100s of the substrate 100 of the present embodiment and the width of the incident side slit in the ω direction is varied, FWHMa-FWHMb is, for example, 30% or less, and preferably 22% or less of FWHMa, at 95% or more, and preferably 100% of all the measurement points.

In the substrate 100 of the present embodiment, |FWHMa-FWHMb|/FWHMa is 30% or less even when the following relationship is satisfied: FWHMa<FWHMb. Also, in the substrate 100 of the present embodiment, FWHMa may be approximately equal to FWHMb and |FWHMa-FWHMb|/FWHMa may be 0%.

Further, even when the X-ray rocking curve measurement is performed with the width of the incident side slit in the ω direction being wide, the diffraction pattern has a single peak because variation of the above-described crystal quality factors is small across the region in the substrate 100 of the present embodiment irradiated with X-rays.

For reference, a substrate (hereinafter also referred to as a "conventional substrate") manufactured using a conventional manufacturing method will be described. The conventional manufacturing method referred to here is, for example, a conventional VAS method, a method of growing a thick film using the c-plane as the growth surface, the above-described DEEP method, a THVPE (Tri-halide vapor phase epitaxy) method, an ammonothermal method, or a flux method.

In the conventional substrate, at least one of the above-described crystal quality factors is not good compared with that of the substrate 100 of the present embodiment. Therefore, FWHMb of the conventional substrate is larger than that of the substrate 100 of the present embodiment.

In the conventional substrate, in-plane variation of at least one of the above-described crystal quality factors may occur. Therefore, a (0002) plane diffraction pattern obtained through X-ray rocking curve measurement in which the width of the incident side slit in the ω direction is wide may be wider than a (0002) plane diffraction pattern obtained through X-ray rocking curve measurement in which the width of the incident side slit in the ω direction is narrow. As a result, in the conventional substrate, FWHMa<FWHMb may be satisfied.

In the conventional substrate, the radius of curvature of the c-plane is smaller than that of the substrate 100 of the present embodiment. When the width of the incident side slit in the ω direction is wide, at least a part of the region irradiated with X-rays necessarily includes a portion where at least one of the crystal quality factors is not good compared with that of the substrate 100 of the present embodiment. Therefore, the difference FWHMa-FWHMb in the conventional substrate becomes larger than that of the substrate 100 of the present embodiment.

In the conventional substrate, in-plane variation of at least one of the above-described crystal quality factors may occur. When the width of the incident side slit in the ω direction is wide, fluctuation of the diffraction angle of the (0002) plane may vary in at least a part of the region irradiated with X-rays. Therefore, the (0002) plane diffraction pattern may have a plurality of peaks when the width of the incident side slit in the ω direction is wide.

As described above, the conventional substrate may not satisfy the above-described requirements about (0002) plane diffraction defined for the substrate 100 of the present embodiment.

X-Ray Rocking Curve Measurement of Asymmetrical Reflection Plane Performed Under Different Measurement Conditions Further, the inventor found that it is possible to appropriately evaluate the crystal quality of the substrate 100 of the present embodiment by performing X-ray rocking curve measurement of an asymmetrical reflection plane under different measurement conditions.

Figure 14:
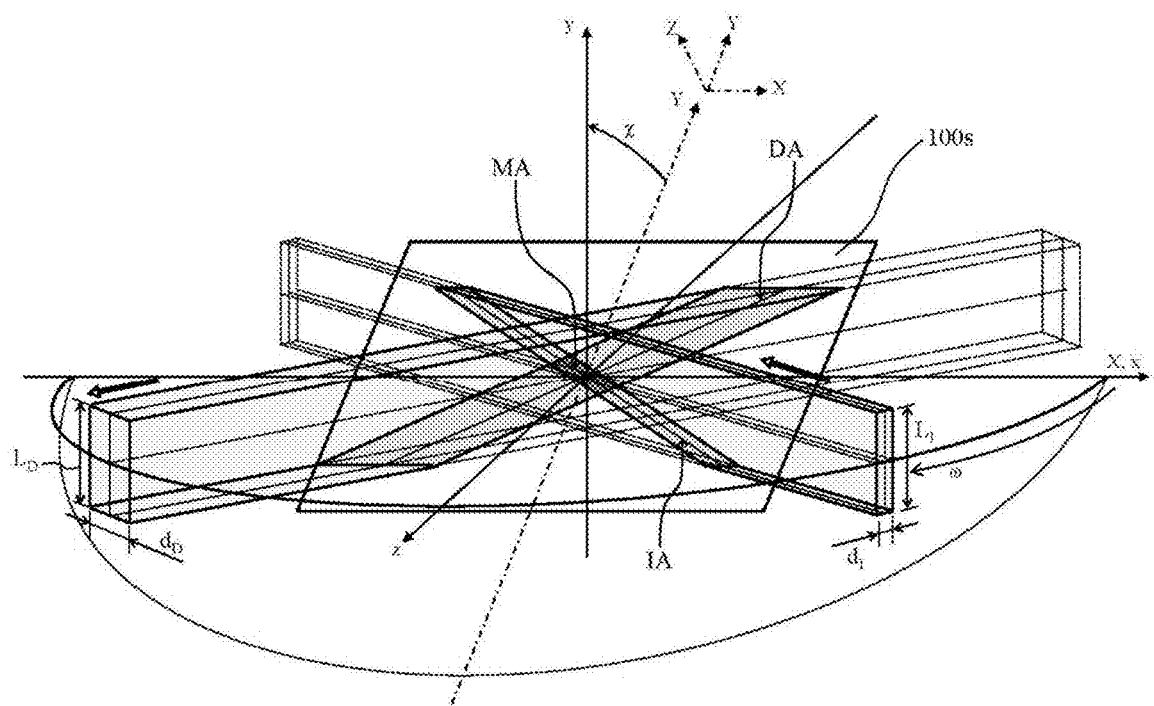
FIG. 14 is a schematic perspective view illustrating X-ray rocking curve measurement of an asymmetrical reflection plane according to an embodiment of the present disclosure.
Figure 15:
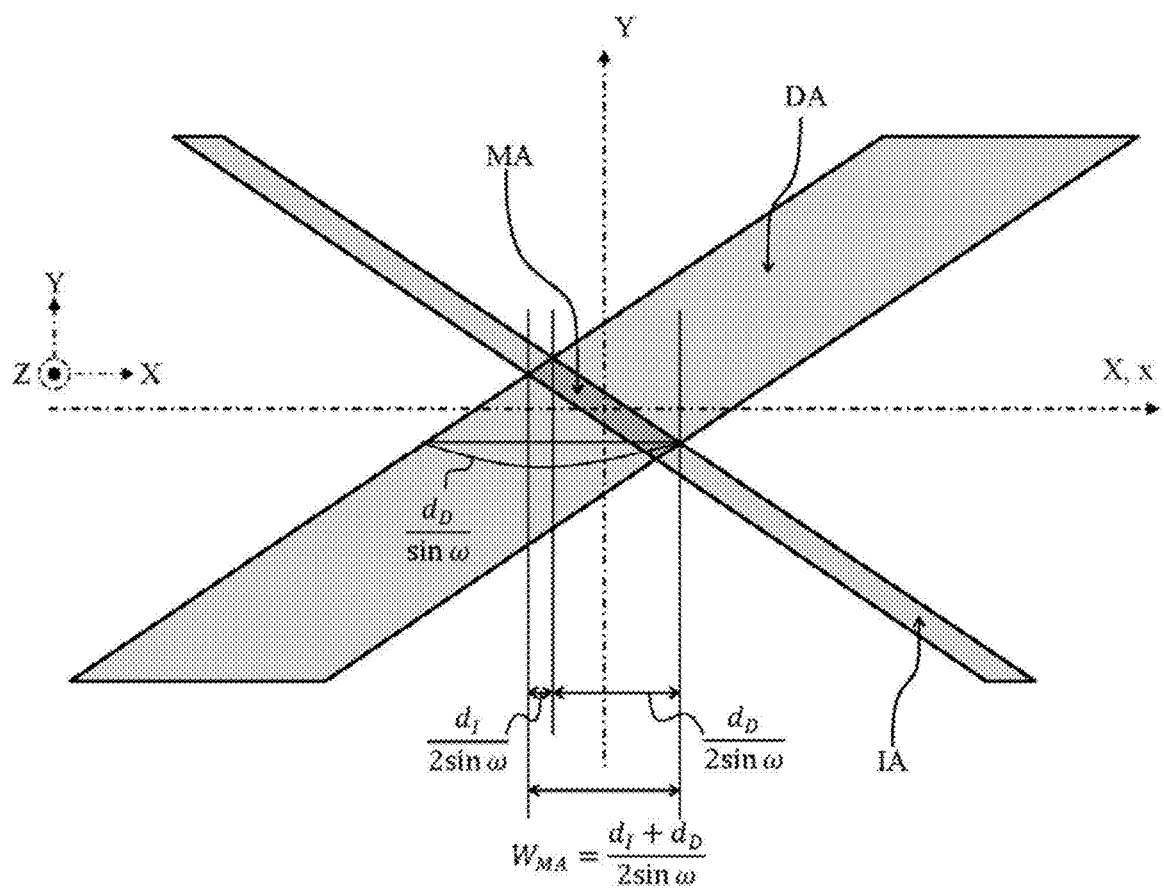
FIG. 15 is a schematic plan view illustrating X-ray rocking curve measurement of the asymmetrical reflection plane according to the embodiment of the present disclosure.

First, a measurement region MA in the X-ray rocking curve measurement of an asymmetrical reflection plane will be described with reference to FIGS. 14 and 15. FIG. 14 is a schematic perspective view and FIG. 15 is a schematic plan view illustrating the X-ray rocking curve measurement of an asymmetrical reflection plane in the present embodiment. A part of the main surface 100s of the substrate 100 is shown as a rectangle.

In FIGS. 14 and 15 and the following description, two directions that extend along the main surface 100s of the substrate 100 and are perpendicular to each other are defined as an "X direction" and a "Y direction", and the normal direction of the main surface 100s of the substrate 100 is defined as a "Z direction". Also, the direction of a rotation axis of a goniometer is defined as a "y direction", a direction that is perpendicular to the rotation axis of the goniometer and matches the X direction of the substrate 100 is defined as an "x direction", and a direction that is perpendicular to the x direction and the y direction is defined as a "z direction".

Also, as described above, a rotation angle about the rotation axis of the goniometer is represented by "ω", and the direction of the rotation angle about the rotation axis is referred to as the "ω direction". Also, an inclination angle of the rotation axis of the goniometer with respect to the main surface of the substrate 100 (i.e., an inclination angle of the y direction with respect to the Y direction) is represented by "χ".

The width of an incident side aperture in the ω direction will be represented by "$d_I$", and the length of the incident side aperture in a direction parallel to the rotation axis of the goniometer will be represented by "$L_I$". On the other hand, the width of a beam receiving side aperture in the ω direction will be represented by "$d_D$", and the length of the beam receiving side aperture in the direction parallel to the rotation axis of the goniometer will be represented by "$L_D$". In measurement described later, the beam receiving side aperture corresponds to an aperture of a detector or an inlet aperture of an analyzer crystal.

A region that is irradiated with X-rays emitted from an X-ray source toward the substrate 100 will be referred to as an "X-ray irradiation region IA", a region in the substrate 100 from which a detector can receive X-rays will be referred to as a "beam receivable region DA", and a region in the substrate 100 for which information regarding the crystal quality of the substrate 100 can actually be obtained will be referred to as the "measurement region MA". In FIGS. 14 and 15, the locus of X-rays from the incident side toward the main surface 100s and the locus of imaginary X-rays from the detector side toward the main surface 100s are shown in light gray, the X-ray irradiation region IA and the beam receivable region DA are shown in gray, and the measurement region MA is shown in dark gray.

As illustrated in FIGS. 14 and 15, in the X-ray rocking curve measurement of an asymmetrical reflection plane, the rotation axis of the goniometer is inclined at the angle χ with respect to the main surface 100s of the substrate 100. Accordingly, the X-ray irradiation region IA on the main surface 100s of the substrate 100 in the measurement extends along a direction that is inclined with respect to the Y axis of the main surface 100s. As a result, the irradiation region IA in the measurement is wider than a measurement region that extends along the Y axis in the above-described X-ray rocking curve measurement of c-plane diffraction.

On the other hand, as illustrated in FIGS. 14 and 15, the beam receivable region DA, which is the region in the substrate 100 from which the detector can receive X-rays, can be determined as an imaginary irradiation region that would be irradiated with X-rays when the X-rays were emitted from the detector side toward the substrate 100, for example. The beam receivable region DA on the main surface 100s of the substrate 100 in the measurement extends in a direction that is symmetrical with the X-ray irradiation region IA with respect to the Y axis of the main surface 100s.

As a result, the measurement region MA for which information regarding the crystal quality of the substrate 100 can be actually obtained is a region in which the X-ray irradiation region IA based on incident conditions and the beam receivable region DA based on beam receiving conditions overlap each other as illustrated in FIGS. 14 and 15.

Here, the influence of incompleteness of the crystal constituted by the substrate 100 (i.e., fluctuation of the diffraction angle) depends on the width of a component that corresponds to the ω direction on the main surface 100s of the substrate 100, i.e., the width $W_{MA}$ of the measurement region MA in the X direction.

As shown in FIG. 15, the width $W_{MA}$ of the measurement region MA in the X direction is calculated using the following formula (j).

$$W_{MA} = \frac{d_I + d_D}{2\sin\omega} \quad (j)$$

The width $W_{MA}$ of the measurement region MA in the X direction will be compared between cases where the width $d_I$ of the incident side aperture in the ω direction is fixed. For example, when the width $d_D$ of the beam receiving side aperture in the ω direction is narrow, the width $W_{MA}$ of the measurement region MA in the X direction is narrow. Accordingly, the influence of the curvature of a crystal plane is small and the influence of the above-described crystal quality factors is dominant in fluctuation of the diffraction angle of the asymmetrical reflection plane. In contrast, for example, when the width $d_D$ of the beam receiving side aperture in the ω direction is wide, the width $W_{MA}$ of the measurement region MA in the X direction is wide. Accordingly, both the influence of the crystal quality factors and the influence of the curvature of the crystal plane are superimposed in fluctuation of the diffraction angle of the asymmetrical reflection plane. Therefore, by varying the width $d_D$ of the beam receiving side aperture in the ω direction when performing X-ray rocking curve measurement, it is possible to evaluate both the above-described crystal quality factors and the curvature of the crystal plane at the same time across the entire measurement region MA.

Next, the following describes features of the substrate 100 of the present embodiment when X-ray rocking curve measurement of diffraction with respect to a {10–12} plane, which is an asymmetrical reflection plane, is performed.

In the following description, $\text{FWHM1}_{\{10\text{-}12\}}$ and $\text{FWHM2}_{\{10\text{-}12\}}$ each represent a full width at half maximum of {10–12} plane diffraction measured using the X-ray rocking curve measurement.

$\text{FWHM1}_{\{10\text{-}12\}}$ is measured under the following incident conditions: the center of the main surface 100s of the substrate 100 is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width $d_I$ of 1.4 mm in the ω direction that is the direction of a rotation angle about the rotation axis of the goniometer, and a length $L_I$ of 12 mm in a direction parallel to the rotation axis.

$\text{FWHM1}_{\{10\text{-}12\}}$ is measured under the following beam receiving conditions: X-rays are received by a detector not via an analyzer crystal in a state where a beam receiving side slit is open, the detector having an aperture (beam receiving side aperture) that has a width $d_D$ of 14.025 mm in the ω direction.

$\text{FWHM2}_{\{10\text{-}12\}}$ is measured under the same incident conditions as those in the measurement of $\text{FWHM1}_{\{10\text{-}12\}}$.

$\text{FWHM2}_{\{10\text{-}12\}}$ is measured under the following beam receiving conditions: X-rays are received by the detector via a 3-bounce Ge (220) analyzer crystal that has an inlet aperture (i.e., beam receiving side aperture) having a width $d_D$ of 6.54 mm in the ω direction.

When the X-ray rocking curve measurement of {10–12} plane diffraction is performed for the substrate 100 of the present embodiment, theoretical diffraction angles are $\chi=43.19°$ and $\omega=24.05°$.

Under the above-described conditions, the width $W_{MA}$ of the measurement region MA in the X direction is as follows:

$W_{MA}$ in the measurement of $FWHM1_{\{10-12\}}$: about 18.92 mm $W_{MA}$ in the measurement of $FWHM2_{\{10-12\}}$: about 9.74 mm In the following description, conditions under which the width $W_{MA}$ of the measurement region MA in the X direction is relatively wide as in the measurement of $FWHM1_{\{10-12\}}$ may be simply referred to as "wide measurement region conditions", and conditions under which the width $W_{MA}$ of the measurement region MA in the X direction is relatively narrow as in the measurement of $FWHM2_{\{10-12\}}$ may be simply referred to as "narrow measurement region conditions".

As described above, all of the above-described crystal quality factors are good over a wide range of the main surface 100s of the substrate 100 of the present embodiment, and the curvature of a crystal plane of the substrate 100 is small. Even when the X-ray rocking curve measurement of {10–12} plane diffraction is performed under the wide measurement region conditions, fluctuation of the diffraction angle of the {10–12} plane does not become very large because the above-described crystal quality factors are good in a well-balanced manner and the curvature of the crystal plane is small across the entire measurement region MA in the substrate 100 of the present embodiment.

As a result, in the substrate 100 of the present embodiment, $FWHM1_{\{10-12\}}$ under the wide measurement region conditions is, for example, 50 arcsecs or less, and preferably 40 arcsecs or less.

Also, in the substrate 100 of the present embodiment, all of the above-described crystal quality factors are good in a well-balanced manner and the curvature of a crystal plane in the substrate 100 is small, irrespective of the crystal orientation. Even when X-ray rocking curve measurement of diffraction with respect to equivalent crystal planes in the substrate 100 of the present embodiment is performed from different directions under the wide measurement region conditions, variation in the fluctuation of the diffraction angle of the {10–12} plane does not become very large.

As a result, when diffractions are measured with respect to equivalent crystal planes that are represented as {10–12} planes from three directions rotated by 60° from each other in a circumferential direction about the normal at the center of the main surface 100s of the substrate 100 of the present embodiment, a difference between the largest value of $FWHM1_{\{10-12\}}$ and the smallest value of $FWHM1_{\{10-12\}}$ is 9 arcsecs or less, for example.

Further, even when the X-ray rocking curve measurement of {10–12} plane diffraction is performed under different measurement conditions, variation in the fluctuation of the diffraction angle of the {10–12} plane is small, because all of the above-described crystal quality factors are good in a well-balanced manner and the curvature of a crystal plane in the substrate 100 is small over a wide range of the main surface 100s of the substrate 100 of the present embodiment as described above.

As a result, the ratio of $FWHM2_{\{10-12\}}$ to $FWHM1_{\{10-12\}}$ at the center of the main surface 100s of the substrate 100 of the present embodiment is 80% or more, for example.

The "ratio of $FWHM2_{\{10-12\}}$ to $FWHM1_{\{10-12\}}$" referred to here is a value that is calculated using the following formula: $(FWHM2_{\{10-12\}}/FWHM1_{\{10-12\}}) \times 100$.

On the other hand, even when the above-described crystal quality factors and the curvature of a crystal plane satisfy the above-described requirements, if a portion of the main surface 100s of the substrate 100 has a defect such as a pit in the surface state, $FWHM1_{\{10-12\}}$ under the wide measurement region conditions may be smaller than $FWHM2_{\{10-12\}}$ under the narrow measurement region conditions. That is, the ratio of $FWHM2_{\{10-12\}}$ to $FWHM1_{\{10-12\}}$ may exceed 100%.

In this respect, in the present embodiment, it is preferable that there are no defects in the surface state of the main surface 100s of the substrate 100, i.e., it is preferable that the ratio of $FWHM2_{\{10-12\}}$ to $FWHM1_{\{10-12\}}$ is no greater than 100%, for example.

For reference, in the conventional substrate, at least one of the above-described crystal quality factors is not good. Accordingly, when measurement is performed under the wide measurement region conditions, at least a part of the measurement region MA necessarily includes a portion where at least one of the crystal quality factors is not good. Further, the curvature of a crystal plane in the conventional substrate is larger the curvature of a crystal plane in the substrate 100 of the present embodiment. As a result, $FWHM1_{\{10-12\}}$ in the conventional substrate is larger than that in the substrate 100 of the present embodiment.

Also, in-plane variation of at least one of the above-described crystal quality factors may occur in the conventional substrate. Therefore, when diffractions are measured with respect to equivalent crystal planes in the conventional substrate from three directions, the difference between the largest value of $FWHM1_{\{10-12\}}$ and the smallest value of $FWHM1_{\{10-12\}}$ is larger than that in the substrate 100 of the present embodiment.

Also, in the conventional substrate, at least one of the crystal quality factors is not good and the curvature of a crystal plane is larger than that in the substrate 100 of the present embodiment as described above. Therefore, the ratio of $FWHM1_{\{10-12\}}$ to $FWHM2_{\{10-12\}}$ measured from at least one direction in the conventional substrate is smaller than that in the substrate 100 of the present embodiment.

As described above, the conventional substrate may not satisfy the above-described requirements about {10–12} plane diffraction defined for the substrate 100 of the present embodiment.

(4) Effects Achieved by the Present Embodiment

According to the present embodiment, one or more of the following effects can be achieved.

(a) By generating the inclined interfaces 30i other than the c-plane in the surface of the single crystal constituting the three-dimensional growth layer 30 in the three-dimensional growth step S200, it is possible to bend dislocations and make the dislocations propagate in a direction that is substantially perpendicular to the inclined interfaces 30i at positions where the inclined interfaces 30i are exposed. Thus, the dislocations can be locally collected. As a result of the dislocations being locally collected, dislocations that have Burgers vectors opposite to each other disappear. Alternatively, as a result of the locally collected dislocations forming a loop, the dislocations can be kept from propagating to the surface side of the flattening layer 40. Thus, the dislocation density in the surface of the flattening layer 40 can be lowered. As a result, the substrate 100 having a lower dislocation density than the base substrate 10 can be obtained.

(b) In the three-dimensional growth step S200, the c-plane 30c disappears at least once from the top surface 30u of the three-dimensional growth layer 30. Thus, the plurality of valleys 30v and the plurality of peaks 30t can be formed at the surface of the three-dimensional growth layer 30. As a result, dislocations propagating from the base substrate 10 can be reliably bent at positions where the inclined interfaces 30i in the three-dimensional growth layer 30 are exposed.

Here, a case where the c-plane remains in the three-dimensional growth step will be considered. In this case, in portions where the c-plane remains, the dislocations propagating from the base substrate propagate substantially vertically upward without being bent and reach the surface of a second layer. Therefore, the dislocations are not reduced and high dislocation density regions are formed above the portions where the c-plane remains.

In contrast, according to the present embodiment, since the c-plane 30c disappears at least once from the top surface 30u of the three-dimensional growth layer 30 in the three-dimensional growth step S200, the surface of the three-dimensional growth layer 30 can be constituted only by the inclined interfaces 30i other than the c-plane, and the plurality of valleys 30v and the plurality of peaks 30t can be formed at the surface of the three-dimensional growth layer 30. Therefore, the dislocations propagating from the base substrate 10 can be reliably bent over the entire surface of the three-dimensional growth layer 30. Since the dislocations are reliably bent, some of the plurality of dislocations are likely to disappear, or some of the plurality of dislocations are unlikely to propagate to the surface side of the flattening layer 40. As a result, the dislocation density can be lowered over the entire main surface is of the substrate 100 obtained from the main growth layer 44.

(c) In the present embodiment, the cycle including the three-dimensional growth step S200 and the flattening step S300 is repeated a plurality of times. In a single cycle including the three-dimensional growth step S200 and the flattening step S300, dislocations propagating from the base substrate 10 side can be bent and locally collected as described above. By further performing the next cycle, it is possible to bend and locally collect dislocations that remain in the flattening layer 40 after the previous cycle. Thus, the dislocation density in the surface of the flattening layer 40 formed in the next cycle can be made lower than the dislocation density in the surface of the flattening layer 40 formed in the previous cycle. By repeating the cycle as described above, it is possible to gradually lower the dislocation density according to the number of repetitions of the cycle.

(d) Even when the c-plane 30c remains after the three-dimensional growth step S200 of any one of the plurality of cycles, in the following cycles, it is possible to make the c-plane 30c disappear at least once above portions where the c-plane 30c remains. Therefore, dislocations can be reliably bent above the portions where the c-plane 30c remains. As a result, the dislocation density can be stably lowered.

(e) In the inclined interface expansion step S220 of the second and the following cycles, the average distance L between closest peaks in an arbitrary cross section perpendicular to the main surface 10s of the base substrate 10 is made longer than that in the inclined interface expansion step S220 of the first cycle. Thus, the distance by which dislocations bend and propagate in the second and the following cycles can be made longer than that in the first cycle. As a result, dislocation-free density regions that are 50 μm square and do not overlap each other can be easily formed and the density of dislocation-free regions can be made high in the surface of the flattening layer 40 formed in the second and the following cycles.

(f) In the inclined interface expansion step S220 of each of the plurality of cycles, the average distance L between closest peaks is gradually increased as the number of repetitions of the cycle increases, for example. Thus, the distance by which dislocations bend and propagate can be gradually increased as the number of repetitions of the cycle increases. As a result, it is possible to gradually expand dislocation-free regions in the surface of the flattening layer 40 and gradually increase the density of dislocation-free regions in the surface of the flattening layer 40 as the number of repetitions of the cycle increases.

(g) In the inclined interface expansion step S220 of each of the plurality of cycles, when an arbitrary cross section perpendicular to the main surface 10s of the base substrate 10 is observed, the average distance L between closest peaks is more than 100 μm, and thus, at least a distance longer than 50 μm can be secured for dislocations to bend and propagate. Accordingly, the dislocations can be sufficiently collected above substantially the center between each pair of peaks 30t of the three-dimensional growth layer 30. As a result, the dislocation density in the surface of the flattening layer 40 can be sufficiently lowered.

(h) Furthermore, in the inclined interface expansion step S220 of at least the last cycle of the plurality of cycles, the average distance L between closest peaks in an arbitrary cross section perpendicular to the main surface 10s of the base substrate 10 is preferably more than 200 μm. In this case, at least a distance longer than 100 μm can be secured for dislocations to bend and propagate in the inclined interface expansion step S220 and the following steps of the last cycle. As a result, discoloration-free regions that are at least 100 μm can be formed at least in a portion of the surface of the flattening layer 40.

(i) In the three-dimensional growth step S200 of each of the plurality of cycles, the first growth condition is adjusted so as to satisfy the formula (1), and therefore, {11-2 μm} planes satisfying m>3 can be generated as the inclined interfaces 30i. Thereby, an inclination angle of the {11-2 μm} plane with respect to the c-plane 30c can be made moderate. Specifically, the inclination angle can be 47.3° or less. Since the inclination angle of the {11-2 μm} plane with respect to the c-plane 30c is moderate, a cycle of the plurality of peaks 30t can be lengthened. Specifically, the average distance L between closest peaks can be made more than 100 μm when an arbitrary cross section perpendicular to the main surface 10s of the base substrate 10 is observed.

For reference, when an etch pit is generated in a nitride semiconductor substrate using a predetermined etchant, an etch pit that is constituted by a {1–10n} plane is usually formed in the surface of the substrate. In contrast, {11–2 μm} planes satisfying m>3 can be generated in the surface of the three-dimensional growth layer 30 grown under the predetermined condition in the present embodiment. It is thought that the inclined interfaces 30i peculiar to the manufacturing method are accordingly formed in the present embodiment as compared with the usual etch pit.

(j) In the three-dimensional growth step S200 of each of the plurality of cycles, after the c-plane 30c has disappeared from the surface of the three-dimensional growth layer 30, growth of the three-dimensional growth layer 30 is continued over a predetermined thickness while the state in which the inclined interfaces 30i occupy a large area of the surface of the three-dimensional growth layer 30 is maintained. Thus, it is possible to make sure that the c-plane 30c disappears over the entire surface of the three-dimensional growth layer 30. For example, even when the timing at which the c-plane 30c disappears from the surface of the three-dimensional growth layer 30 in the inclined interface expansion step S220 shifts and the c-plane 30c partially remains in the expanded inclined interface layer 32, it is possible to make sure that the c-plane 30c disappears.

Further, a sufficient time can be secured to bend dislocations at positions where the inclined interfaces 30i are exposed, by continuing the growth of the three-dimensional growth layer 30 at the inclined interfaces 30i after the c-plane 30c disappears. Here, if the c-plane grows immediately after disappearing, there is a possibility that the dislocations are not sufficiently bent and propagate in the substantially vertical direction toward the surface of the second layer. In contrast, according to the present embodiment, since sufficient time is secured to bend dislocations at positions where the inclined interfaces 30i other than the c-plane are exposed, particularly, dislocations near the peaks 30t of the three-dimensional growth layer 30 can be reliably bent, and the dislocations can be kept from propagating in the substantially vertical direction from the base substrate 10 toward the surface of the flattening layer 40. Thus, concentration of the dislocations above the peaks 30t of the three-dimensional growth layer 30 can be suppressed.

(k) The c-plane 100c of the substrate 100 can have a larger radius of curvature than the c-plane 10c of the base substrate 10 due to the manufacturing method of the present embodiment. Thereby, variation in the off-angle θ of the c-axis 100ca with respect to the normal of the main surface 100s of the substrate 100 can be made smaller than variation in the off-angle of the c-axis 10ca of the base substrate 10.

One of reasons why the radius of curvature of the c-plane 100c of the substrate 100 is large can be considered as follows, for example.

As described above, in the three-dimensional growth step S200, the inclined interface growth region 70 is formed by growing the three-dimensional growth layer 30 three-dimensionally with the inclined interfaces 30i other than the c-plane serving as growth surfaces. Oxygen is easily taken into the inclined interface growth region 70, as compared with the c-plane growth region 60. Accordingly, the oxygen concentration in the inclined interface growth region 70 is higher than the oxygen concentration in the c-plane growth region 60. That is, the inclined interface growth region 70 can be considered as being a high oxygen concentration region.

By taking oxygen into the high oxygen concentration region as described above, the lattice constant of the high oxygen concentration region can be made larger than the lattice constant of regions other than the high oxygen concentration region (reference: Chris G. Van de Walle, Physical Review B vol. 68, 165209 (2003)). Due to the curvature of the c-plane 10c of the base substrate 10, stress that is concentrated toward the center of curvature of the c-plane is applied to the base substrate 10 or the c-plane growth region 60 of the three-dimensional growth layer 30, which has grown with the c-plane 30c serving as the growth surface. In contrast, by making the lattice constant of the high oxygen concentration region relatively large, stress can be generated in the high oxygen concentration region so as to spread the c-plane 30c outward in a direction extending along the main surface. Thereby, the stress concentrated toward the center of curvature of the c-plane 30c under the high oxygen concentration region can be offset by the stress that causes the c-plane 30c in the high oxygen concentration region to spread outward in the direction extending along the main surface.

Owing to the stress offset effect of the three-dimensional growth layer 30 described above, it is possible to make the radius of curvature of the c-plane 100c of the substrate 100 obtained from the flattening layer 40 larger than the radius of curvature of the c-plane 10c of the base substrate 10 obtained using the conventional VAS method.

(l) In the substrate 100 obtained using the manufacturing method of the present embodiment, not only the dislocation density can be lowered and variation in the off-angle can be reduced, but also all of the above-described crystal quality factors that determine the full width at half maximum in the X-ray rocking curve measurement can be made good in a well-balanced manner.

Therefore, in the substrate 100 of the present embodiment, FWHMb in the X-ray rocking curve measurement of (0002) plane diffraction can be 32 arcsecs or less. Furthermore, in the substrate 100 of the present embodiment, the radius of curvature of the c-plane is large and the above-described crystal quality factors are good in a well-balanced manner across the entire region irradiated with X-rays even when the width of the incident side slit in the ω direction is 1 mm, and therefore, (FWHMa−FWHMb)/FWHMa can be 30% or less.

Furthermore, in the substrate of the present embodiment, $FWHM1_{\{10\text{-}12\}}$ in the X-ray rocking curve measurement of {10-12} plane diffraction can be 50 arcsecs or less. Also, when diffractions are measured with respect to equivalent crystal planes represented as {10-12} planes from three directions, a difference between the largest value of $FWHM1_{\{10\text{-}12\}}$ and the smallest value of $FWHM1_{\{10\text{-}12\}}$ can be 9 arcsecs or less in the substrate of the present embodiment. Also, the ratio of $FWHM2_{\{10\text{-}12\}}$ to $FWHM1_{\{10\text{-}12\}}$ can be 80% or more in the substrate 10 of the present embodiment.

OTHER EMBODIMENTS

An embodiment of the present disclosure has been specifically described. However, the present disclosure is not limited to the above-described embodiment, and various modifications can be made without departing from the gist thereof.

In the above-described embodiment, an explanation is given for the case where the base substrate 10 is a GaN free-standing substrate, but the base substrate 10 is not limited to the GaN free-standing substrate, and for example, may be a free-standing substrate constituted by a group III nitride semiconductor such as aluminum nitride (AlN), aluminum gallium nitride (AlGaN), indium nitride (InN), indium gallium nitride (InGaN), or aluminum indium gallium nitride (AlInGaN), that is, a free-standing substrate constituted by a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, an explanation is given for the case where the substrate 100 is a GaN free-standing substrate, but the substrate 100 is not limited to the GaN free-standing substrate, and for example, may be a free-standing substrate constituted by a group III nitride semiconductor such as AlN, AlGaN, InN, InGaN, or AlInGaN, that is, a free-standing substrate constituted by a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, an explanation is given for the case where the substrate 100 is n-type, but the substrate 100 may be p-type or may have semi-insulating properties. For example, when manufacturing a semiconductor device as a high electron mobility transistor (HEMT) using the substrate 100, the substrate 100 preferably has semi-insulating properties.

In the above-described embodiment, an explanation is given for the case where the main surface 10s of the base substrate 10 is mirror-finished in the polishing step S180 of the base substrate preparation step S100, but the main surface 10s of the base substrate 10 may be roughly polished in the polishing step S180 while being kept in a so-called epi-ready state in which a single crystal of the group III nitride semiconductor can be epitaxially grown on the main surface. Specifically, the root mean square roughness RMS of the main surface 10s of the base substrate 10 is set to 1 nm or more and 10 nm or less, for example. By setting RMS of the main surface 10s of the base substrate 10 within the above range, it is possible to promote the generation of the inclined interfaces 30i other than the c-plane at the surface of the three-dimensional growth layer 30 when the three-dimensional growth layer 30 is grown on the base substrate 10 in the three-dimensional growth step S200 of the first cycle. Also, by setting RMS of the main surface 10s of the base substrate 10 within the above range, it is possible to keep the surface of the three-dimensional growth layer 30 from becoming excessively rough in the three-dimensional growth step S200 of the first cycle and to suppress a reduction in the average distance L between closest peaks in the three-dimensional growth layer 30.

Alternatively, crystal strain that is introduced through processing of the base substrate 10 such as the slicing step S170 or the polishing step S180 may be left on the main surface 10s side of the base substrate 10 while keeping the crystal quality of the bulk of the base substrate 10 good, for example. Specifically, when X-ray rocking curve measurement is performed with an incident angle with respect to the main surface 10s of the base substrate 10 after the processing set to 2°, a full width at half maximum (FWHM) of (10–10) plane diffraction is larger than the full width at half maximum of the base substrate 10 before the processing, and is 60 arcsecs or more and 200 arcsecs or less, for example. When FWHM of (10–10) plane diffraction is within the above range, it is possible to change a stable crystal plane that appears at the surface of the three-dimensional growth layer 30 due to the crystal strain on the main surface 10s side of the base substrate 10 in the three-dimensional growth step S200 of the first cycle. As a result, inclined interfaces 30i other than the c-plane can be generated at the surface of the three-dimensional growth layer 30. Also, when FWHM of (10–10) plane diffraction is within the above range, it is possible to prevent generation of too many dislocations in the three-dimensional growth layer 30 due to the crystal strain on the main surface 10s side of the base substrate 10 in the three-dimensional growth step S200 of the first cycle.

In the above-described embodiment, an explanation is given for the case where the three-dimensional growth step S200 of the first cycle is performed immediately after the base substrate preparation step S100, but there is no limitation to such a case. After the base substrate preparation step S100 and before the three-dimensional growth step S200 of the first cycle, an initial layer may be grown directly on the main surface 10s of the base substrate 10 with the c-plane serving as the growth surface in an initial step S190. At this time, the growth rate of the initial layer in the initial step S190 is set lower than the growth rate of the three-dimensional growth layer 30 in the three-dimensional growth step S200. Thus, step-flow growth of the initial layer can be caused on the main surface 10s of the base substrate 10. Through the step-flow growth of the initial layer, it is possible to make surface morphology and crystallinity of the initial layer substantially uniform across the entire surface irrespective of the state of the main surface 10s of the base substrate 10 even when the main surface 10s of the base substrate 10 includes an abnormal portion such as a rough portion or a portion that has different crystallinity. By making surface morphology and crystallinity of the initial layer substantially uniform, it is possible to make the state of generation of the inclined interfaces 30i such as the inclination angle of the inclined interfaces 30i with respect to the c-plane 30c substantially uniform across the entire surface of the three-dimensional growth layer 30 in the three-dimensional growth step S200 of the first cycle. Specifically, it is possible to prevent formation of a region where the distance between closest peaks is short in the surface of the three-dimensional growth layer 30 and to make the distance between closest peaks substantially uniform across the entire surface of the three-dimensional growth layer 30. As a result, it is possible to prevent formation of a region that has a high dislocation density in the surface of the flattening layer 40 and to lower the dislocation density across the entire surface of the flattening layer 40.

In the above-described embodiment, the growth temperature is mainly adjusted as the first growth condition in the three-dimensional growth step S200 of each cycle, but a growth condition other than the growth temperature may be adjusted, or the growth temperature and another growth condition may be adjusted in combination, as the first growth condition so long as the first growth condition satisfies the formula (1).

In the above-described embodiment, the growth temperature is mainly adjusted as the second growth condition in the flattening step S300 of each cycle, but a growth condition other than the growth temperature may be adjusted, or the growth temperature and another growth condition may be adjusted in combination, as the second growth condition so long as the second growth condition satisfies the formula (2).

In the above-described embodiment, an explanation is given for the case where the first growth condition is maintained in the inclined interface maintenance step S240 of each cycle similarly to the inclined interface expansion step S220, but the growth condition in the inclined interface maintenance step S240 may be different from the growth condition in the inclined interface expansion step S220 so long as the growth condition in the inclined interface maintenance step S240 satisfies the first growth condition.

In the above-described embodiment, an explanation is given for the case where the cycle is ended when the number of times the cycle is executed reaches two in the execution count determination step S400, but the number of times the cycle is executed may be set greater than two.

In the above-described embodiment, an explanation is given for the case where the three-dimensional growth layer 30 is grown in the three-dimensional growth step S200 of the second and the following cycles under the same first growth condition as that in the three-dimensional growth step S200 of the first cycle, but so long as the growth condition in the three-dimensional growth step S200 of the second and the following cycles satisfies the first growth condition, the growth condition may be different from that in the three-dimensional growth step S200 of the first cycle.

In the above-described embodiment, an explanation is given for the case where the flattening layer 40 is grown in the flattening step S300 of the second and the following cycles under the same second growth condition as that in the flattening step S300 of the first cycle, but so long as the growth condition in the flattening step S300 of the second and the following cycles satisfies the second growth condition, the growth condition may be different from that in the flattening step S300 of the first cycle.

In the above-described embodiment, an explanation is given for the case where the second growth condition is maintained in the main growth step S500 of each cycle similarly to the flattening step S300 of each cycle, but the growth condition in the main growth step S500 may be different from the growth condition in the flattening step S300 of each cycle so long as the growth condition in the main growth step S500 satisfies the second growth condition.

In the above-described embodiment, an explanation is given for the case where the second crystal layer 6 or the main growth layer 44 is sliced using a wire saw in the slicing step S170 and the slicing step S600, but for example, an outer peripheral blade slicer, an inner peripheral blade slicer, an electric discharge machine, or the like may be used.

In the above-described embodiment, an explanation is given for the case where the substrate 100 is obtained by slicing the main growth layer 44 in the laminated structure 90, but the present disclosure is not limited thereto. For example, the laminated structure 90 may be used as is to manufacture a semiconductor laminate for manufacturing a semiconductor device. Specifically, after preparing the laminated structure 90, in a semiconductor laminate manufacturing step, a semiconductor functional layer is epitaxially grown on the laminated structure 90 to prepare a semiconductor laminate. After preparing the semiconductor laminate, a back surface side of the laminated structure 90 is polished to remove the base substrate 10 and the plurality of laminated units 50 from the laminated structure 90. Thereby, a semiconductor laminate that includes the main growth layer 44 and the semiconductor functional layer can be obtained as in the above-described embodiment. In this case, the slicing step S600 and the polishing step S700 for obtaining the substrate 100 can be omitted.

In the above-described embodiment, an explanation is given for the case where the manufacturing steps are ended after manufacturing the substrate 100, but the steps S200 to S700 may be performed again using the substrate 100 as the base substrate 10. In this case, a substrate 100 in which the dislocation density is further lowered can be obtained. Also, a substrate 100 in which variation in the off-angle θ of the c-axis 100ca is further reduced can be obtained. Moreover, a cycle that includes the steps S200 to S700 in which the substrate 100 is used as the base substrate 10 may be repeated a plurality of times. In this case, the dislocation density in the substrate 100 can be gradually lowered according to the number of repetitions of the cycle. Also, variation in the off-angle θ of the c-axis 100ca of the substrate 100 can be gradually reduced according to the number of repetitions of the cycle.

Examples

Hereinafter, various experimental results supporting the effects of the present disclosure will be described. In the following description, a "nitride semiconductor substrate" may be simply referred to as a "substrate".

(1) Experiment 1
(1-1) Preparation of Nitride Semiconductor Substrate
Substrates of samples 1 to 4 were prepared as follows. A laminated structure was also prepared as for sample 1.
<Conditions for Preparing Nitride Semiconductor Substrate of Sample 1>
In sample 1, the cycle including the three-dimensional growth step and the flattening step was performed twice.
(Base Substrate)
  Material: GaN
  Manufacturing method: VAS method
  Diameter: 2 inches
  Thickness: 400 μm
  Low index crystal plane closest to the main surface: c-plane
  No patterning such as formation of a mask layer was performed on the main surface.
  Off-angle at the center of the main surface: 0.4° in the m direction
[First Cycle]
(Three-Dimensional Growth Layer)
  Material: GaN
  Growth method: HVPE method
  First growth condition:
    Growth temperature was 980° C. or higher and 1,020° C. or lower, and the V/III ratio was 2 or more and 20 or less. At this time, at least either the growth temperature or the V/III ratio was adjusted within the above-described ranges such that the first growth condition satisfied the formula (1).
(Flattening Layer)
  Material: GaN
  Growth method: HVPE method
  Growth temperature: 1,050° C.
  V/III ratio: 2
  The second growth condition described above satisfies the formula (2).
  Thickness from the main surface of the base substrate to the boundary surface of the first laminated unit (thickness of the first laminated unit): about 800 μm
[Second Cycle]
(Three-Dimensional Growth Layer)
  The same growth conditions as those of the three-dimensional growth layer formed in the first cycle.
(Flattening Layer)
  The same growth conditions as those of the flattening layer formed in the first cycle. Thickness from the boundary surface of the first laminated unit to the boundary surface of the second laminated unit (thickness of the second laminated unit): about 800 μm
(Main Growth Layer)
  The same growth conditions as those of the flattening layers formed in the respective cycles.
  Thickness: about 2 mm
  In the laminated structure prepared for observation, the thickness of the main growth layer was about 200 μm.

(Slicing Condition)
  Thickness of the substrate: 400 μm
  Kerf loss: 200 μm
<Conditions for Preparing Nitride Semiconductor Substrate of Sample 2>
  In sample 2, the cycle including the three-dimensional growth step and the flattening step was performed once. That is, the cycle was not repeated.
(Base Substrate)
  The same as the base substrate used in sample 1.
(Three-Dimensional Growth Layer)
  The same growth conditions as those of the three-dimensional growth layer formed in the first cycle of sample 1.
(Flattening Layer)
  The same growth conditions as those of the flattening layer formed in the first cycle of sample 1.
  Thickness from the main surface of the base substrate to the boundary surface of the flattening layer: about 800 μm
(Main Growth Layer)
  The same growth conditions as those of the flattening layer described above.
  Thickness: about 2 mm
(Slicing Condition)
  The same as those of sample 1.
<Conditions for Preparing Nitride Semiconductor Substrate of Sample 3>
  The method of "c-plane thick film growth" described above was used.
(Base Substrate)
  Material: GaN
  Manufacturing method: VAS method
  Diameter: 62 mm
  Thickness: 400 μm
  Low index crystal plane closest to the main surface: c-plane
  Off-angle at the center of the main surface: 0.5° in the m-axis direction
  No patterning such as formation of a mask layer was performed on the main surface.
(Crystal Layer)
  Material: GaN
  Growth method: HVPE method
  Growth temperature: 1050° C.
  V/III ratio: 2.8
  Growth period: 15 hours
(Processing)
  Grinding: A cylindrical region was removed to obtain a circular column region having a diameter of 56 mm.
  Slicing: 5 substrates with a thickness of 630 μm were sliced.
  Beveling processing: The diameter was adjusted to 50.8 mm.
  Polishing: The thickness was adjusted to 400 to 450 μm.
<Conditions for Preparing Nitride Semiconductor Substrate of Sample 4>
  The substrate of sample 4 was prepared using the conventional VAS method as that used for the base substrate. The absolute value of the off-angle and the direction of the off-angle in sample 4 were different from those in the base substrate, but the radius of curvature of the c-plane, the dislocation density, and the like in sample 4 were the same as those in the base substrate.

(1-2) Evaluation
Observation Using Fluorescence Microscope
  A cross section of the laminated structure before the substrate of sample 1 was sliced was observed using a fluorescence microscope.
Observation Using Multiphoton Excitation Microscope
  Main surfaces of the substrates of samples 1 to 3 and the substrate of sample 4 corresponding to the base substrate were observed using a multi-photon excitation microscope. At this time, the dislocation density was measured by measuring a dark spot density over the entire main surface for every 250 μm field of view. It was confirmed that all dark spots on these substrates were dislocations by performing the measurement while shifting a focus in the thickness direction. Further, at this time, the ratio of the number of regions having a dislocation density lower than $1\times10^6$ cm$^{-2}$ or lower than $7\times10^5$ cm$^{-2}$ to the total number of measurement regions of 250 μm square field of view was determined.
X-Ray Rocking Curve Measurement of (0002) Plane Diffraction
  The following two types of X-ray rocking curve measurement of (0002) plane diffraction were performed for each of the substrates of samples 1 to 3 and the substrate of sample 4 corresponding to the base substrate.
  For the X-ray rocking curve measurement, "X'Pert-PRO MRD" manufactured by Spectris was used, and "Hybrid monochromator" manufactured by the same company was used as the monochromator at the incident side. The hybrid monochromator includes an X-ray mirror and two crystals of the Ge (220) plane in this order from an X-ray source side. In the measurement, first, X-rays emitted from the X-ray source were made into parallel beam by the X-ray mirror. Thereby, the number of X-ray photons (i.e., X-ray intensity) to be used could be increased. Next, the parallel beam from the X-ray mirror was made into Cu Kα1 monochromatic beam by the two crystals of the Ge (220) plane. Next, the monochromatic light from the two crystals of the Ge (220) plane was narrowed to a predetermined width through an incident side slit and were then incident on the substrate. When a full width at half maximum is determined through simulation for a case where the rocking curve of the (0002) plane of a perfect crystal GaN is measured using the hybrid monochromator, the full width at half maximum is 25.7 arcsecs. That is, this full width at half maximum is the theoretical measurement limit when measurement is performed using the above-described optical system.
  In the measurement, X-rays that were incident on the substrate were parallel beam toward the substrate side in a cross section that is perpendicular to a rotation axis of a goniometer (i.e., cross section taken along the ω direction). However, the X-rays were not parallel beam in a cross section taken along the rotation axis of the goniometer. Therefore, the width of the X-rays in the ω direction was almost constant, but the width of the X-rays in the direction orthogonal to the ω direction increased while the X-rays traveled from the slit to the substrate. Accordingly, in the X-ray rocking curve measurement, the full width at half maximum of the X-rays diffracted at a predetermined crystal plane depends on the width of the incident side slit in the ω direction in which the X-rays were parallel beam.
  On the other hand, the beam receiving side was open. A window width in the ω direction of a detector on the beam receiving side was 14.025 mm. In the above-described optical system, the goniometer radius was 420 mm, and therefore, fluctuation of the Bragg angle of 0.95° could be measured.

X-Ray Rocking Curve Measurement 1

An X-ray rocking curve of the (0002) plane of each of the substrates of samples 1 to 3 and the substrate of sample 4 corresponding to the base substrate was measured with the width of the incident side slit in the ω direction set to 0.1 mm. At this time, the measurement was performed at a plurality of measurement points that were set at 5 mm intervals on a straight line that passes through the center of the main surface and extends along the m-axis direction and a straight line that passes through the center of the main surface and extends along the a-axis direction orthogonal to the m-axis direction, in the main surface of each substrate. At this time, X-rays were incident on the side that was defined as the positive side regarding positions on the main surface of the substrate. As a result of the measurement, a peak angle ω formed between the main surface and the X-rays incident on the main surface was plotted for positions on the straight lines, and was approximated by a linear function of the positions. The radius of curvature of a c-plane was determined based on the reciprocal of inclination of the linear function.

Further, the full width at half maximum FWHMb of (0002) plane diffraction when the width of the incident side slit in the ω direction was 0.1 mm was obtained at each measurement point.

X-Ray Rocking Curve Measurement 2

An X-ray rocking curve was measured for each of the substrates of samples 1 to 3 and the substrate of sample 4 corresponding to the base substrate, with the width of the incident side slit in the ω direction set to 1 mm. At this time, the measurement was performed at the plurality of measurement points that were set at 5 mm intervals on the straight line that passes through the center of the main surface and extends along the m-axis direction and the straight line that passes through the center of the main surface and extends along the a-axis direction orthogonal to the m-axis direction, in the main surface of each substrate. As a result of the measurement, the full width at half maximum FWHMa of (0002) plane diffraction when the width of the incident side slit in the ω direction was 1 mm was obtained at each measurement point. Further, the ratio of FWHMa-FWHMb to FWHMa was calculated for each measurement point.

In the X-ray rocking curve measurements 1 and 2, when X-rays are incident on the main surface of each substrate at a Bragg angle of 17.28° of the (0002) plane, the X-ray footprint is about 0.337 mm when the width of the slit in the ω direction is 0.1 mm, and the X-ray foot print is about 3.37 mm when the width of the slit in the ω direction is 1 mm.

(1-3) Result

Results are shown in Tables 1 to 5.

TABLE 1

|  | Sample 1 | Sample 2 | Sample 3 | Sample 4 (Equivalent of base substrate) |
|---|---|---|---|---|
| Cycle | Twice | Once | None | — |
| Average dislocation density ($cm^{-2}$) | $2.1 \times 10^5$ | $4.5 \times 10^5$ | $6.5 \times 10^5$ | $3.0 \times 10^6$ |
| Ratio (%) of regions having dislocation density lower than $1 \times 10^6$ $cm^{-2}$ | 100 | 95 | 83 | 0 |
| Ratio (%) of regions having dislocation density lower than $7 \times 10^5$ $cm^{-2}$ | 93 | 79 | 52 | 0 |
| Density of 50 μm square dislocation-free regions (regions/$cm^2$) | 15000 | 4800 | 0 | 0 |
| Density of 100 μm square dislocation-free regions (regions/$cm^2$) | 270 | 0 | 0 | 0 |
| Absolute value of radius of curvature of c-plane (m) | 34.8~274 | 33.0~68.2 | 11.9~15.5 | 4.8 |

TABLE 2

<Sample 1> 2 cycles

|  |  | Incident slit = 0.1 | | | Incident slit = open | | |
|---|---|---|---|---|---|---|---|
|  | (mm) | ω (deg.) | FWHMb(sec.) | (mm) | ω (deg.) | FWHMa(sec.) | difference |
| //M | −20 | 16.84553 | 29.8 | −20 | 16.84531 | 29.3 | −1.7% |
|  | −15 | 16.84389 | 29.3 | −15 | 16.84392 | 31.6 | 7.3% |
|  | −10 | 16.84177 | 30.4 | −10 | 16.84185 | 31.6 | 3.8% |
|  | −5 | 16.84054 | 27.4 | −5 | 16.84078 | 29.1 | 5.8% |
|  | 0 | 16.8402 | 28.7 | 0 | 16.84013 | 29.4 | 2.4% |
|  | 5 | 16.8389 | 28.9 | 5 | 16.83855 | 30.9 | 6.5% |
|  | 10 | 16.83862 | 30.1 | 10 | 16.8374 | 35.4 | 15.0% |
|  | 15 | 16.8372 | 31.1 | 15 | 16.83647 | 31.1 | 0.0% |
|  | 20 | 16.83718 | 31.3 | 20 | 16.83751 | 31.4 | 0.3% |
| //a | −20 | 17.28775 | 28.4 | −20 | 17.28739 | 36.5 | 22.2% |
|  | −15 | 17.29508 | 29 | −15 | 17.29502 | 31.7 | 8.5% |
|  | −10 | 17.30315 | 27.7 | −10 | 17.30282 | 33.7 | 17.8% |
|  | −5 | 17.30918 | 30.5 | −5 | 17.30937 | 31.2 | 2.2% |
|  | 0 | 17.31326 | 29.2 | 0 | 17.31326 | 30.1 | 3.0% |
|  | 5 | 17.31696 | 28.5 | 5 | 17.31691 | 30 | 4.7% |
|  | 10 | 17.32159 | 30.8 | 10 | 17.32156 | 32.5 | 5.2% |

TABLE 2-continued

<Sample 1> 2 cycles

| Incident slit = 0.1 | | | Incident slit = open | | | |
|---|---|---|---|---|---|---|
| (mm) | ω (deg.) | FWHMb(sec.) | (mm) | ω (deg.) | FWHMa(sec.) | difference |
| 15 | 17.32828 | 29.4 | 15 | 17.32839 | 33.6 | 12.5% |
| 20 | 17.33548 | 30.5 | 20 | 17.33603 | 35.1 | 13.1% |

TABLE 3

<Sample 2> 1 cycle

| | Incident slit = 0.1 | | | Incident slit = open | | | |
|---|---|---|---|---|---|---|---|
| | (mm) | ω (deg.) | FWHMb(sec.) | (mm) | ω (deg.) | FWHMa(sec.) | difference |
| //M | −20 | 16.97834 | 26.9 | −20 | 16.97833 | 31.1 | 13.5% |
| | −15 | 16.98569 | 27.3 | −15 | 16.98558 | 32.1 | 15.0% |
| | −10 | 16.99292 | 28 | −10 | 16.9926 | 31.7 | 11.7% |
| | −5 | 16.99957 | 28 | −5 | 16.99923 | 32.9 | 14.9% |
| | 0 | 17.00571 | 27 | 0 | 17.00539 | 28.8 | 6.3% |
| | 5 | 17.00978 | 26.7 | 5 | 17.00962 | 29 | 7.9% |
| | 10 | 17.01599 | 26.9 | 10 | 17.01568 | 29.6 | 9.1% |
| | 15 | 17.02317 | 27.7 | 15 | 17.02288 | 31.1 | 10.9% |
| | 20 | 17.03257 | 28.7 | 20 | 17.03206 | 39.9 | 28.1% |
| //a | −20 | 17.23878 | 28.5 | −20 | 17.23859 | 35.6 | 19.9% |
| | −15 | 17.2487 | 27.9 | −15 | 17.24847 | 33.7 | 17.2% |
| | −10 | 17.25665 | 27.4 | −10 | 17.25634 | 32 | 14.4% |
| | −5 | 17.26536 | 27.9 | −5 | 17.26474 | 33.3 | 16.2% |
| | 0 | 17.27063 | 26.4 | 0 | 17.27034 | 29.1 | 9.3% |
| | 5 | 17.27604 | 26.3 | 5 | 17.27594 | 29.6 | 11.1% |
| | 10 | 17.28341 | 26.2 | 10 | 17.28324 | 30.8 | 14.9% |
| | 15 | 17.29102 | 27.6 | 15 | 17.29078 | 31.8 | 13.2% |
| | 20 | 17.29929 | 27.5 | 20 | 17.29909 | 31.7 | 13.2% |

TABLE 4

<Sample 3> c-plane thick film growth

| | Incident slit = 0.1 | | | Incident slit = open | | | |
|---|---|---|---|---|---|---|---|
| | (mm) | ω (deg.) | FWHMb(sec.) | (mm) | ω (deg.) | FWHMa(sec.) | difference |
| //M | −20 | 17.58718 | 30.6 | −20 | 17.58637 | 61 | 49.8% |
| | −15 | 17.60427 | 29.9 | −15 | 17.60367 | 49 | 39.0% |
| | −10 | 17.62154 | 29.4 | −10 | 17.62094 | 53.2 | 44.7% |
| | −5 | 17.63899 | 29.2 | −5 | 17.63827 | 51.6 | 43.4% |
| | 0 | 17.65626 | 28.1 | 0 | 17.65561 | 52.3 | 46.3% |
| | 5 | 17.67447 | 29.4 | 5 | 17.6738 | 55.2 | 46.7% |
| | 10 | 17.6939 | 29.6 | 10 | 17.6931 | 56.5 | 47.6% |
| | 15 | 17.71332 | 28.2 | 15 | 17.71235 | 59.2 | 52.4% |
| | 20 | 17.73509 | 28.9 | 20 | 17.73384 | 68.2 | 57.6% |
| //a | −20 | 17.19294 | 36.3 | −20 | 17.19209 | 75.8 | 52.1% |
| | −15 | 17.21843 | 33.1 | −15 | 17.21749 | 75.9 | 56.4% |
| | −10 | 17.24258 | 31.4 | −10 | 17.24179 | 68.4 | 54.1% |
| | −5 | 17.26492 | 29.8 | −5 | 17.26405 | 67.1 | 55.6% |
| | 0 | 17.28636 | 31.4 | 0 | 17.28551 | 67.3 | 53.3% |
| | 5 | 17.30887 | 31.4 | 5 | 17.30794 | 69.2 | 54.6% |
| | 10 | 17.3332 | 33.6 | 10 | 17.33179 | 78.2 | 57.0% |
| | 15 | 17.35942 | 32.9 | 15 | 17.35821 | 79.7 | 58.7% |
| | 20 | 17.385 | 30.5 | 20 | 17.38469 | 75.4 | 59.5% |

TABLE 5

<Sample 4>: Equivalent of base substrate

| | | Incident slit = 0.1 | | | Incident slit = open | | |
|---|---|---|---|---|---|---|---|
| | (mm) | ω (deg.) | FWHMb(sec.) | (mm) | ω (deg.) | FWHMa(sec.) | difference |
| //M | −20 | 17.07689 | 42.9 | −20 | 17.07888 | 187.2 | 77.1% |
| | −15 | 17.13755 | 45.6 | −15 | 17.14011 | 184 | 75.2% |
| | −10 | 17.19635 | 46.6 | −10 | 17.19869 | 171.7 | 72.9% |
| | −5 | 17.25394 | 46.3 | −5 | 17.25502 | 170.3 | 72.8% |
| | 0 | 17.31046 | 46.1 | 0 | 17.31278 | 170.3 | 72.9% |
| | 5 | 17.36629 | 44.2 | 5 | 17.36438 | 169.1 | 73.9% |
| | 10 | 17.42552 | 44.1 | 10 | 17.42475 | 175.2 | 74.8% |
| | 15 | 17.48624 | 45.6 | 15 | 17.48797 | 179.6 | 74.6% |
| | 20 | 17.5534 | 43.9 | 20 | 17.5618 | 208.5 | 78.9% |
| //a | −20 | 17.14414 | 47.3 | −20 | 17.14824 | 211.2 | 77.6% |
| | −15 | 17.20841 | 46.2 | −15 | 17.20506 | 183.2 | 74.8% |
| | −10 | 17.27142 | 47.2 | −10 | 17.27079 | 180.1 | 73.8% |
| | −5 | 17.33018 | 50.5 | −5 | 17.3292 | 176.7 | 71.4% |
| | 0 | 17.38817 | 47.4 | 0 | 17.38517 | 169 | 72.0% |
| | 5 | 17.44551 | 50.2 | 5 | 17.44218 | 166.6 | 69.9% |
| | 10 | 17.50449 | 46.5 | 10 | 17.50376 | 172.9 | 73.1% |
| | 15 | 17.56355 | 43.9 | 15 | 17.5611 | 173 | 74.6% |
| | 20 | 17.62587 | 46.3 | 20 | 17.62643 | 178.5 | 74.1% |

<Sample 4: Equivalent of Base Substrate>

Results of the substrate of sample 4 corresponding to the base substrate manufactured using the conventional VAS method will be described with reference to Tables 1 and 5 and FIG. 21(b). FIG. 21(b) is a diagram showing normalized X-ray diffraction patterns of the nitride semiconductor substrate of sample 4 obtained through the X-ray rocking curve measurement of (0002) plane diffraction in which the incident side slit was varied. FIG. 21(b) shows a measurement result in the direction extending along the a-axis. "Line width" in FIG. 21(b) means the X-ray foot print described above.

Dislocations

As shown in Table 1, the average dislocation density in the substrate of sample 4 corresponding to the base substrate was $1 \times 10^6$ cm$^{-2}$ or more. The main surface of the substrate of sample 4 did not include regions having a dislocation density lower than $1 \times 10^6$ cm$^{-2}$.

Also, dislocations were dispersed uniformly over the surface of the substrate of sample 4, although this is not shown. Accordingly, the size of dislocation-free regions was smaller than 50 m square over the entire substrate of sample 4, and there were no dislocation-free regions that were 50 μm square.

Results of X-Ray Rocking Curve Measurement

As shown in Table 1, the radius of curvature of the c-plane in the substrate of sample 4 was less than 10 μm.

As shown in Table 5, variation in the off-angle of the c-axis within a diameter of 40 mm was about 0.24° in the substrate of sample 4.

Moreover, as shown in Table 5, when the width of the incident side slit in the ω direction was 0.1 mm, FWHMb was greater than 32 arcsecs at all the measurement points in the substrate of sample 4.

As shown in FIG. 21(b), in the substrate of sample 4, the X-ray diffraction pattern obtained when the width of the incident side slit in the ω direction was 1 mm was wider than the X-ray diffraction obtained when the width of the incident side slit in the ω direction was 0.1 mm.

Accordingly, as shown in Table 5, (FWHMa−FWHMb)/FWHMa was greater than 30% at all the measurement points in the substrate of sample 4.

<Sample 3: c-Plane Thick Film Growth>

Figure 20:
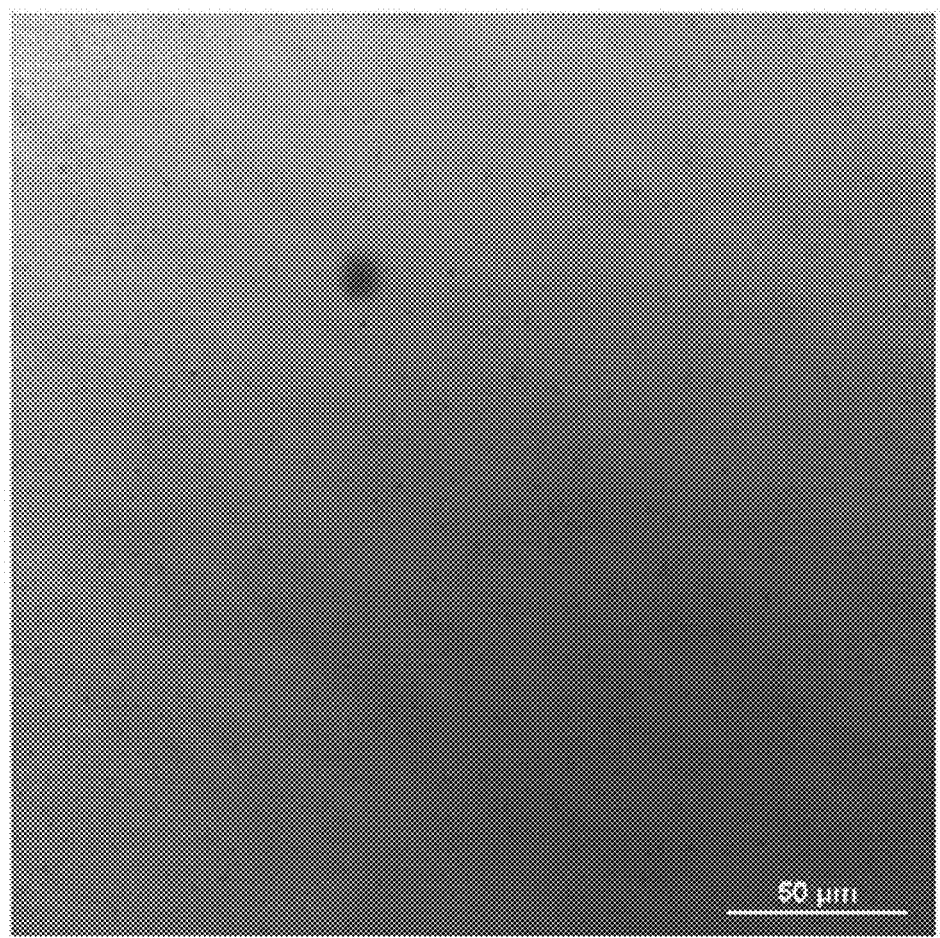
FIG. 20 is a diagram showing a main surface of a nitride semiconductor substrate of sample 3 observed using a multiphoton excitation microscope.

Results of the substrate of sample 3 obtained through the c-plane thick film growth will be described with reference to Tables 1 and 4 and FIG. 20. FIG. 20 is a diagram showing the main surface of the nitride semiconductor substrate of sample 3 observed using a multi-photon excitation microscope.

Dislocations

As shown in Table 1, in the substrate of sample 3 obtained through the c-plane thick film growth, the dislocation density decreased in inverse proportion to the thickness of the crystal layer, and therefore, the average dislocation density was lower than that in sample 4 corresponding to the base substrate.

However, in the substrate of sample 3, the ratio of regions having a dislocation density lower than $1 \times 10^6$ cm$^{-2}$ was less than 90%, and the ratio of regions having a dislocation density lower than $7 \times 10$ cm$^{-2}$ was less than 80%.

Also, as shown in FIG. 20, dislocations were dispersed uniformly over the surface of the substrate of sample 3. Regions that are not shown also had a distribution of dislocations similar to that shown in FIG. 20. Accordingly, the size of dislocation-free regions was smaller than 50 μm square over the entire substrate of sample 3, and there were no dislocation-free regions that were 50 μm square.

As described above, even though a conventional method with which a high-quality substrate can be obtained was used for sample 3, the obtained substrate did not include the low dislocation density regions described above, and dislocation-free regions that were 50 μm square were not formed in the substrate. Accordingly, it is thought that dislocation-free regions that are 50 μm square would not be formed in substrates manufactured using other conventional manufacturing methods in which no special process for collecting dislocations is performed.

Results of X-Ray Rocking Curve Measurement

As shown in Table 1, the radius of curvature of the c-plane in the substrate of sample 3 was slightly larger than the radius of curvature of the c-plane in the base substrate due to the effect of forming the crystal layer thick.

Also, as shown in Table 4, in the substrate of sample 3 obtained through the c-plane thick film growth, variation in the off-angle of the c-axis within a diameter of 40 mm was improved when compared with the substrate of sample 4, and was about ±0.074°. Also, FWHMb of the substrate of sample 3 was improved compared with FWHMb of the substrate of sample 4.

However, there were a plurality of portions in which FWHMb was greater than 32 arcsecs in the substrate of sample 3. Also, (FWHMa−FWHMb)/FWHMa was much greater than 30% at all the measurement points in the substrate of sample 3.

As described above, in the substrate of sample 3, which has relatively high quality among conventional substrates, the dislocation density and variation in the off-angle were improved when compared with sample 4 corresponding to the base substrate. However, the substrate of sample 3 included no point at which the following conditions about the full width at half maximum were satisfied: FWHMb≤32 arcsecs and (FWHMa−FWHMb)/FWHMa<30%. The reason for this is thought that at least one of the above-described crystal quality factors was not good in the substrate of sample 3 when compared with that of the substrates of samples 1 and 2.

Even the substrate of sample 3, which has relatively high quality among conventional substrates, does not satisfy the above-described conditions about the full width at half maximum, and accordingly, it is thought that substrates manufactured using other conventional manufacturing methods did not satisfy the conditions about the full width at half maximum.

<Sample 2: 1 Cycle>

Figure 19:
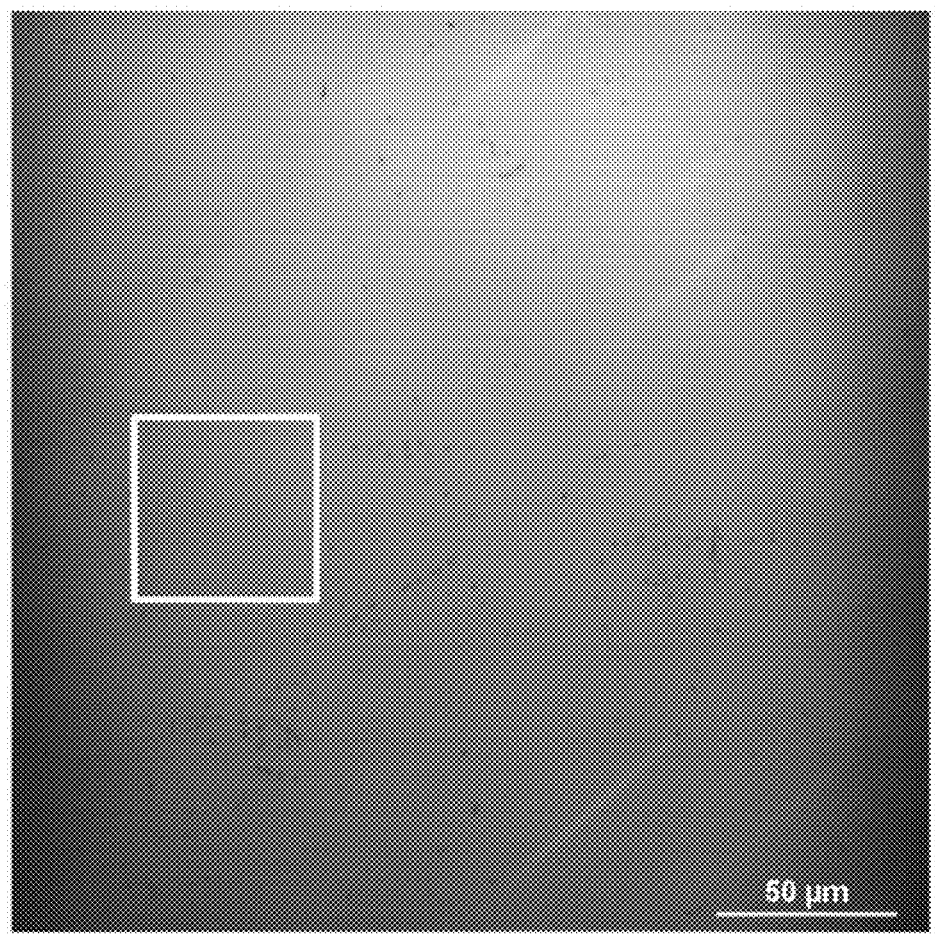
FIG. 19 is a diagram showing a main surface of a nitride semiconductor substrate of sample 2 observed using a multiphoton excitation microscope.

Results of the substrate of sample 2 for which the cycle was performed once will be described with reference to Tables 1 and 3 and FIG. 19. FIG. 19 is a diagram showing the main surface of the nitride semiconductor substrate of sample 2 observed using a multi-photon excitation microscope.

Dislocations

As shown in Table 1, the average dislocation density in the substrate of sample 2 for which the cycle was performed once was lower than the average dislocation densities in the substrates of samples 3 and 4. In the substrate of sample 2, the ratio of regions having a dislocation density lower than $1\times10^6$ cm$^{-2}$ was 90% or more.

However, the substrate of sample 2 included regions having a dislocation density of $1\times10^6$ cm$^{-2}$ or more at a ratio of about 5%. Also, the ratio of regions having a dislocation density lower than $7\times10^5$ cm$^{-2}$ was less than 80% in the substrate of sample 2.

As shown in FIG. 19, the main surface of the substrate of sample 2 included dislocation-free regions that were at least 50 μm square. Also, dislocation-free regions that were 50 μm square were scattered over the entire main surface of the substrate of sample 2.

Also, in the substrate of sample 2, all fields of view that were 250 μm square included at least one dislocation-free region that was 50 μm square. The main surface of the substrate of sample 2 included dislocation-free regions that were 50 μm square and did not overlap each other at a density of 1000 regions/cm$^2$ or more.

However, the main surface of the substrate of sample 2 did not include dislocation-free regions that were 100 μm square.

Results of X-Ray Rocking Curve Measurement

As shown in Table 1, the radius of curvature of the c-plane in the substrate of sample 2 was larger than those in the substrates of samples 3 and 4, and was 23 μm or more.

Also, as shown in Table 3, in the substrate of sample 2, variation in the off-angle of the c-axis within a diameter of 40 mm was smaller than those in the substrates of samples 3 and 4, and was about 0.03°.

Also, FWHMb was 32 arcsecs or less at all the measurement points in the substrate of sample 2. Also, (FWHMa−FWHMb)/FWHMa was 30% or less at all the measurement points in the substrate of sample 2.

<Sample 1: 2 Cycles>

Figure 16:
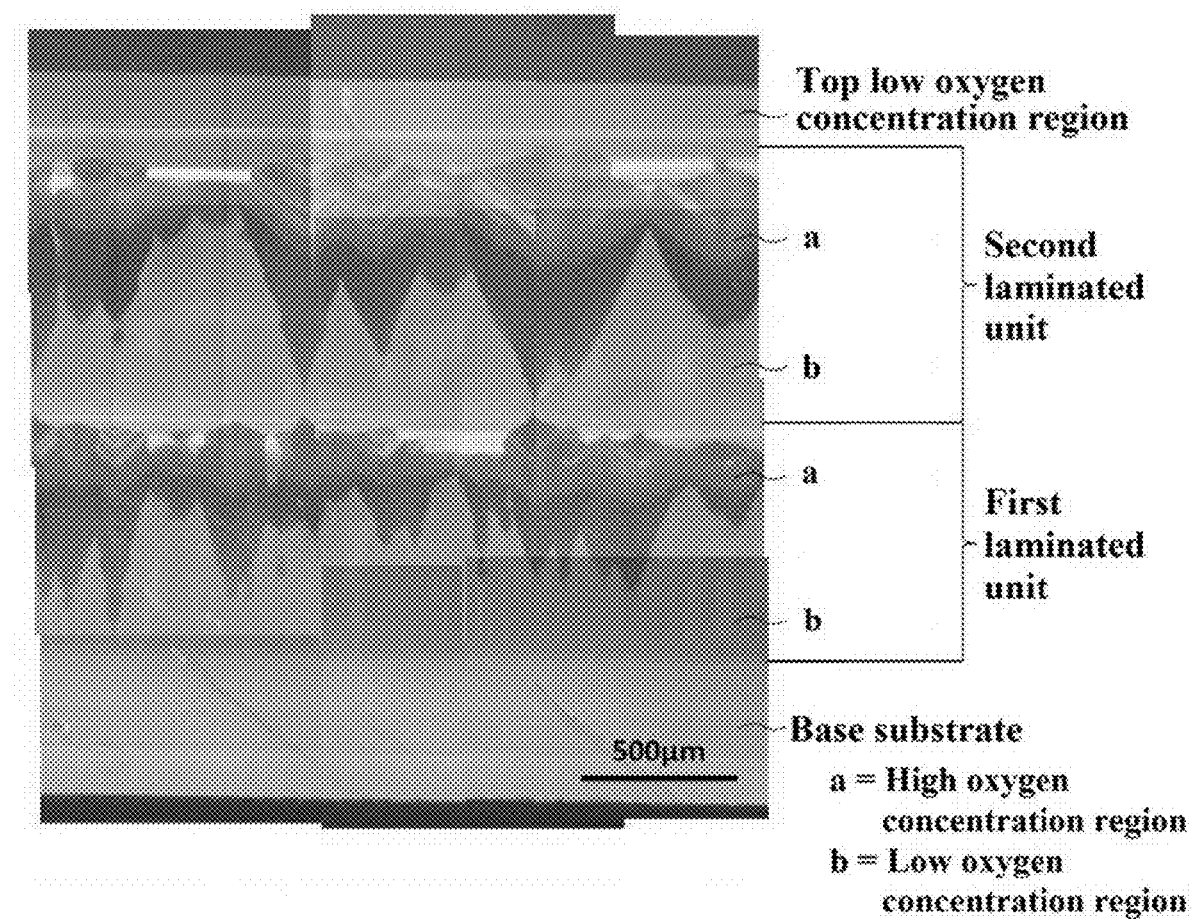
FIG. 16 is a diagram showing an observation image of a cross section of a laminated structure of sample 1 observed using a fluorescence microscope.
Figure 17:
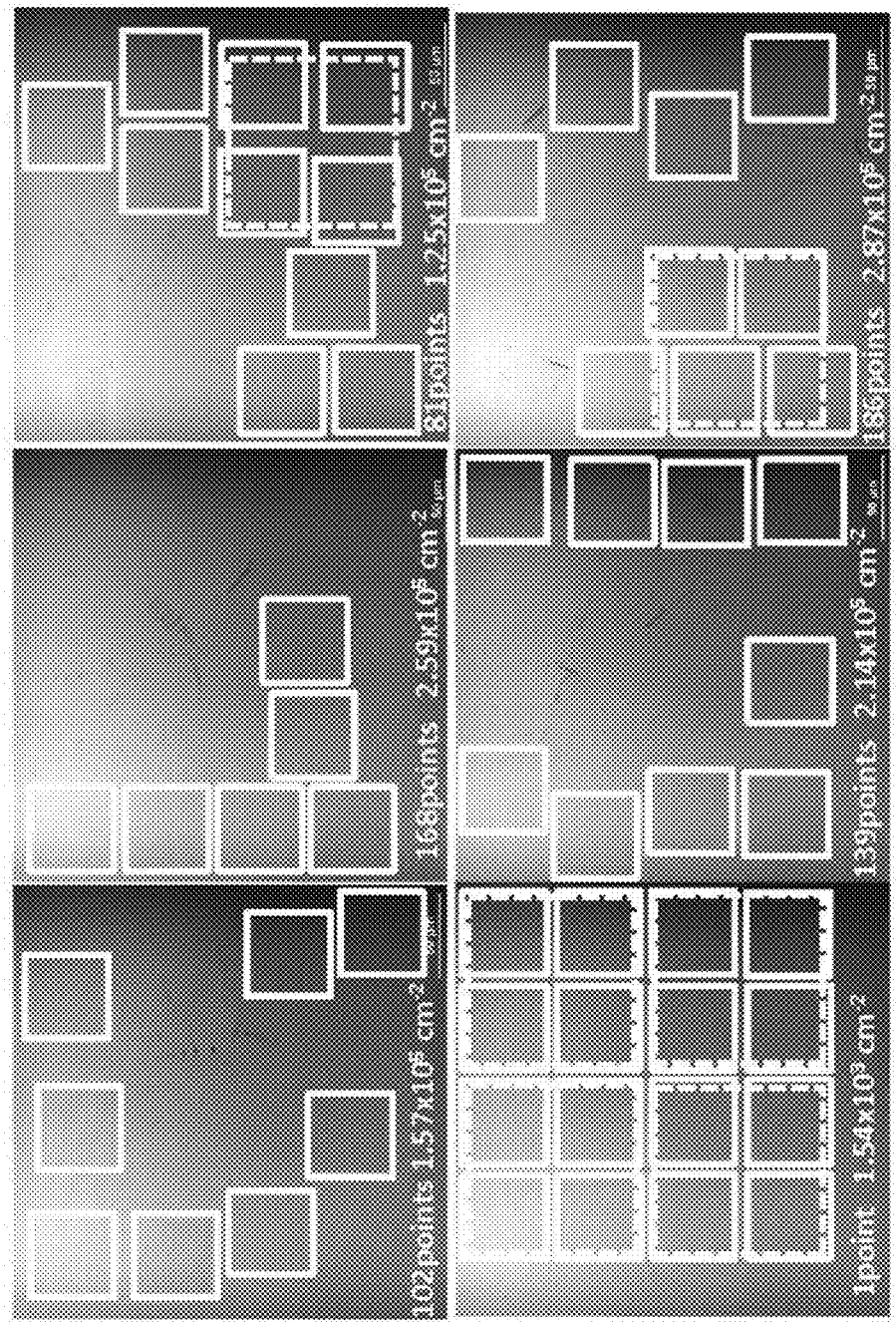
FIG. 17 is a diagram showing a main surface of a nitride semiconductor substrate of sample 1 observed using a multiphoton excitation microscope.
Figure 18:
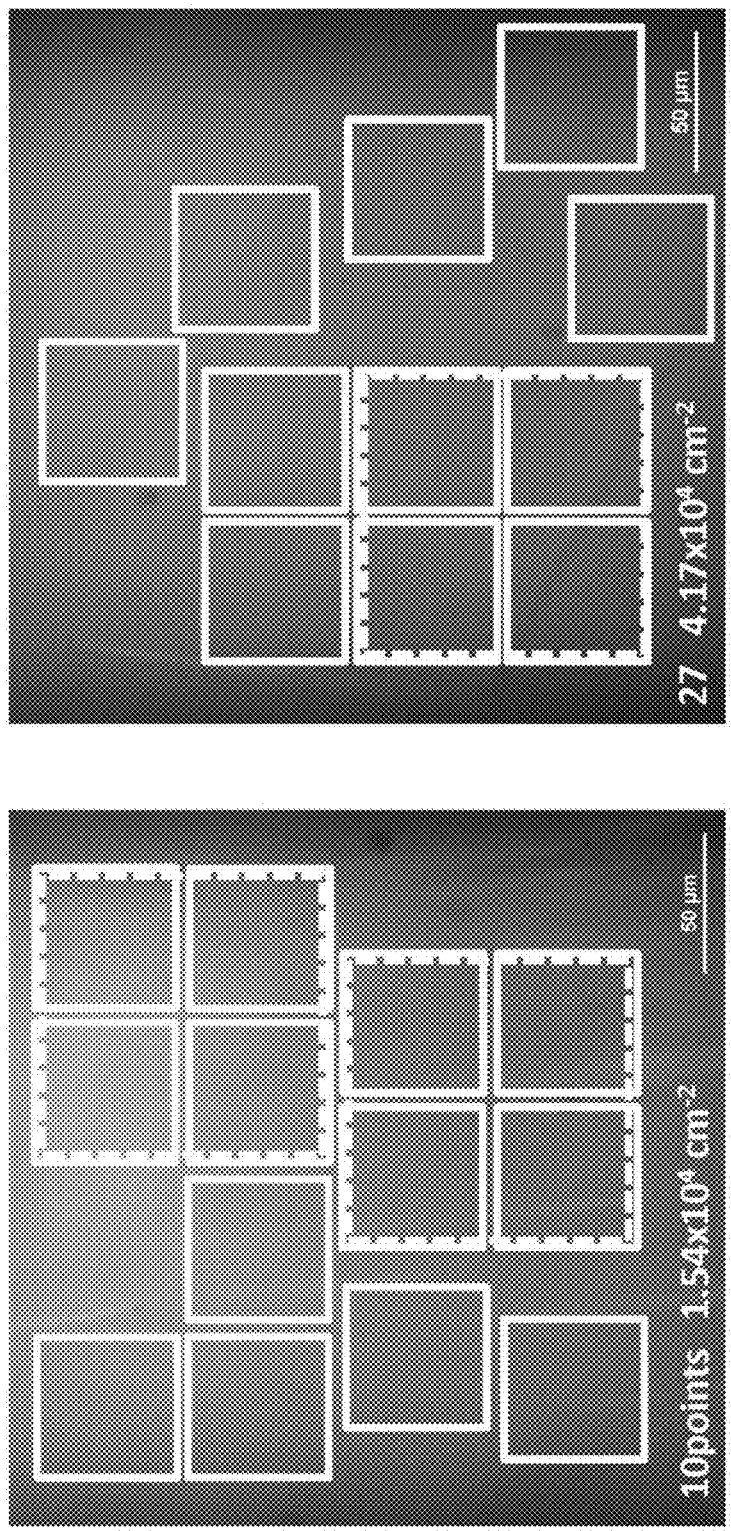
FIG. 18 is a diagram showing the main surface of the nitride semiconductor substrate of sample 1 observed using a multiphoton excitation microscope.

Results of the substrate of sample 1 for which the cycle was performed twice will be described with reference to Tables 1 and 2 and FIGS. 16, 17, 18, and 21(a). FIG. 16 is a diagram showing an observation image of a cross section of the laminated structure of sample 1 observed using a fluorescence microscope. FIGS. 17 and 18 are diagrams showing the main surface of the nitride semiconductor substrate of sample 1 observed using a multi-photon excitation microscope. In FIGS. 17 and 18, rectangles shown with white solid lines indicate dislocation-free regions that are 50 μm square, and rectangles shown with white dotted lines indicate dislocation-free regions that are 100 μm square. FIG. 21(a) is a diagram showing normalized X-ray diffraction patterns of the nitride semiconductor substrate of sample 1 obtained through the X-ray rocking curve measurement of (0002) plane diffraction in which the incident side slit was varied. Measurement conditions of FIG. 21(a) are the same as those of FIG. 21(b) described above.

Laminated Structure

As shown in FIG. 16, the laminated structure of sample 1 included two laminated units and a top low oxygen concentration region based on a difference in the oxygen concentration derived from a difference in the growth surface. Each of the two laminated units included a low oxygen concentration region and a high oxygen concentration region.

The low oxygen concentration region was not continuous from the base substrate side to the top low oxygen concentration region in the thickness direction.

The low oxygen concentration region of the first laminated unit included a portion corresponding to an initial layer that was grown on the base substrate with the c-plane serving as the growth surface in an initial stage of growth. The initial layer was formed with a predetermined thickness over the entire main surface of the base substrate.

The low oxygen concentration region of the first laminated unit included a plurality of valleys and a plurality of mountains in the cross-sectional view. The average distance between closest mountains in the first laminated unit was about 135 μm.

The high oxygen concentration region of the first laminated unit was provided on the low oxygen concentration region of the first laminated unit. The high oxygen concentration region of the first laminated unit was provided continuously along the main surface of the base substrate. That is, it was confirmed that the c-plane disappeared at least once in the growth process of the first laminated unit.

The low oxygen concentration region of the second laminated unit was provided on the high oxygen concentration region of the first laminated unit.

The low oxygen concentration region of the second laminated unit also included a plurality of valleys and a plurality of mountains in the cross-sectional view. The average distance between closest mountains in the second laminated unit was longer than the average distance between closest mountains in the first laminated unit, and was about 209 μm.

The high oxygen concentration region of the second laminated unit was provided on the low oxygen concentration region of the second laminated unit. The high oxygen concentration region of the second laminated unit was provided continuously along the main surface of the base substrate. That is, it was confirmed that the c-plane disappeared at least once in the growth process of the second laminated unit.

In the laminated structure of sample 1, the thickness from the main surface of the base substrate to the boundary surface of the second laminated unit was 1690 μm. The dislocation density reduction rate $N/N_0$ described above calculated from the results shown in Table 1 was 0.07.

Dislocations

As shown in Table 1, the average dislocation density in the substrate of sample 1 for which the cycle was performed twice was lower than the average dislocation densities in the substrates of samples 2, 3 and 4.

In the substrate of sample 1, the ratio of regions having a dislocation density lower than $1 \times 10^6$ cm$^{-2}$ was 100%. That is, the main surface did not include regions having a dislocation density of $1 \times 10^6$ cm$^{-2}$ or more.

Also, the ratio of regions having a dislocation density lower than $7 \times 10^5$ cm$^{-2}$ was 80% or more in the substrate of sample 1.

As shown in FIGS. 17 and 18, the main surface of the substrate of sample 1 included dislocation-free regions that were at least 50 μm square. Also, a plurality of dislocation-free regions that were 50 μm square were scattered over the entire main surface of the substrate of sample 1.

Also, in the substrate of sample 1, all fields of view that were 250 μm square included a plurality of dislocation-free regions that were 50 μm square. That is, the density of dislocation-free regions that were 50 μm square and did not overlap each other in the main surface of the substrate of sample 1 was higher than that of sample 2. Specifically, the main surface of the substrate of sample 1 included dislocation-free regions that were 50 μm square and did not overlap each other at a density of 10000 regions/cm$^2$ or more.

Also, in the substrate of sample 1, the number of dislocations that were present in a quadrangular region sandwiched between mutually opposed sides of a pair of dislocation-free regions that were closest to each other was 90 or less.

Further, as indicated by the rectangles shown with white dotted lines in FIGS. 17 and 18, the main surface of the substrate of sample 1 included dislocation-free regions that were 100 μm square. The main surface of the substrate of sample 1 included dislocation-free regions that were 100 μm square and did not overlap each other at a density of 100 regions/cm$^2$ or more.

Results of X-Ray Rocking Curve Measurement

As shown in Table 1, the radius of curvature of the c-plane in the substrate of sample 1 was larger than those in the substrates of samples 3 and 4, and was 23 μm or more.

Also, as shown in Table 2, in the substrate of sample 1, variation in the off-angle of the c-axis within a diameter of 40 mm was smaller than those in the substrates of samples 3 and 4, and was about 0.006°.

Also, in the substrate of sample 1, when the width of the incident side slit in the ω direction was 0.1 mm, FWHMb was 32 arcsecs or less at all the measurement points.

As shown in FIG. 21(a), in the substrate of sample 1, even when the width of the incident side slit in the ω direction was increased from 0.1 mm to 1 mm, the X-ray diffraction pattern became not so wide.

Accordingly, as shown in Table 2, (FWHMa−FWHMb)/FWHMa was 30% or less at all the measurement points in the substrate of sample 1.

That is, the results of the substrate of sample 1 in the X-ray rocking curve measurement of (0002) plane diffraction were better than the results of the substrate of sample 2.

(2) Experiment 2

(2-1) Preparation of Nitride Semiconductor Substrates

Samples 1, 3, and 4 in the above-described experiment 1 were prepared, and the following evaluation was performed.

(2-2) Evaluation

X-Ray Rocking Curve Measurement of {10–12} Plane Diffraction

The following two types of X-ray rocking curve measurement of {10–12} plane diffraction were performed for each of the substrates of samples 1 and 3 and the substrate of sample 4 corresponding to the base substrate.

The same apparatus as that used in experiment 1 was used for the X-ray rocking curve measurement.

As described in the above embodiment, $FWHM1_{\{10-12\}}$ was measured under wide measurement region conditions and $FWHM2_{\{100-12\}}$ was measured under narrow measurement region conditions.

$FWHM1_{\{10-12\}}$ was measured under the following incident conditions: the center of the main surface 100s of the substrate 100 was irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width $d_I$ of 1.4 mm in the ω direction that is the direction of a rotation angle about the rotation axis of the goniometer, and a length $L_I$ of 12 mm in a direction parallel to the rotation axis. That is, the measurement in experiment 2 was performed in the state where the incident side slit used in experiment 1 was removed.

$FWHM1_{\{10-12\}}$ was measured under the following beam receiving conditions: X-rays were received not via an analyzer crystal in a state where a beam receiving slit was open. In a detector that received X-rays, the width $d_D$ of an aperture in the ω direction (width of a beam receiving side aperture in the ω direction) and the length $L_D$ of the aperture (length of the beam receiving side aperture) in a direction parallel to the rotation axis were both set to 14.025 mm.

$FWHM2_{\{10-12\}}$ was measured under the same incident conditions as those in the measurement of $FWHM1_{\{10-12\}}$.

$FWHM2_{\{10-12\}}$ was measured under the following beam receiving conditions: X-rays were received via a 3-bounce Ge (220) analyzer crystal. In the analyzer crystal, the width $d_D$ of an inlet aperture in the ω direction (width of a beam receiving side aperture in the ω direction) was set to 6.54 mm, and the length $L_D$ of the inlet aperture (length of the beam receiving side aperture) in the direction parallel to the rotation axis was set to 14.025 mm.

(2-3) Results

Results are shown in Table 6.

TABLE 6

|  | Angle (°) relative to a-axis | Sample 1 2 cycles | Sample 3 c-plane thick film growth | Sample 4 Equivalent of base substrate |
| --- | --- | --- | --- | --- |
| FWHM1$_{(10\text{-}12)}$ (arcsec) open detector | 30 | 36.6 | 53.7 | 705.5 |
|  | 90 | 37.5 | 51.7 | 864.5 |
|  | 150 | 34.9 | 75.3 | 820.6 |
|  | Difference between largest and smallest | 2.6 | 23.6 | 159 |
| FWHM2$_{(10\text{-}12)}$ (arcsec) analyser | 30 | 32.8 | 51.7 | 216 |
|  | 90 | 30.3 | 51.1 | 267.4 |
|  | 150 | 34.5 | 55 | 242.5 |
| (FWHM2$_{(10\text{-}12)}$/ FWHM1$_{(10\text{-}12)}$) × 100 (%) | 30 | 89.6 | 96.3 | 30.6 |
|  | 90 | 80.8 | 98.8 | 30.9 |
|  | 150 | 98.9 | 73.0 | 29.5 |

<Sample 4: Equivalent of Base Substrate>

Figure 24:
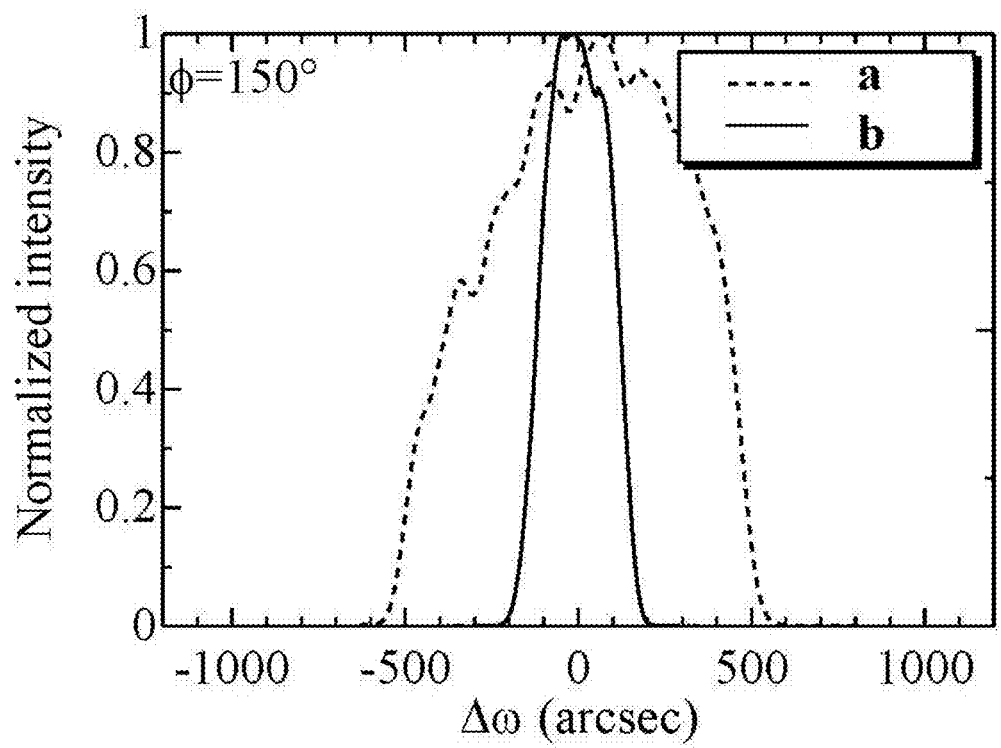
FIG. 24 is a diagram showing normalized X-ray diffraction patterns obtained by performing X-ray rocking curve measurement of {10–12} plane diffraction for the nitride semiconductor substrate of sample 4 under different measurement conditions.

Results of the substrate of sample 4 corresponding to the base substrate will be described with reference to Table 6 and FIG. 24. FIG. 24 is a diagram showing normalized X-ray diffraction patterns of the nitride semiconductor substrate of sample 4 obtained by performing the X-ray rocking curve measurement of {10–12} plane diffraction under the different measurement conditions.

As shown in Table 6 and FIG. 24, FWHM1$_{\{10\text{-}12\}}$ under the wide measurement region conditions was large and was more than 700 arcsecs in the substrate of sample 4. Also, when diffractions were measured with respect to equivalent crystal planes in the substrate of sample 4 from three directions, variation in FWHM1$_{\{10\text{-}12\}}$ was large, and a difference between the largest value of FWHM1$_{\{10\text{-}12\}}$ and the smallest value of FWHM1$_{\{10\text{-}12\}}$ was more than 150 arcsecs.

As shown in FIG. 24, in the substrate of sample 4, the {10–12} diffraction pattern under the wide measurement region conditions was wider than the {10–12} diffraction pattern under the narrow measurement region conditions.

Accordingly, as shown in Table 6, in each of the three directions, the ratio of FWHM2$_{\{10\text{-}12\}}$ to FWHM1$_{\{10\text{-}12\}}$ was less than 40% in the substrate of sample 4.

<Sample 3: c-Plane Thick Film Growth>

Figure 23:
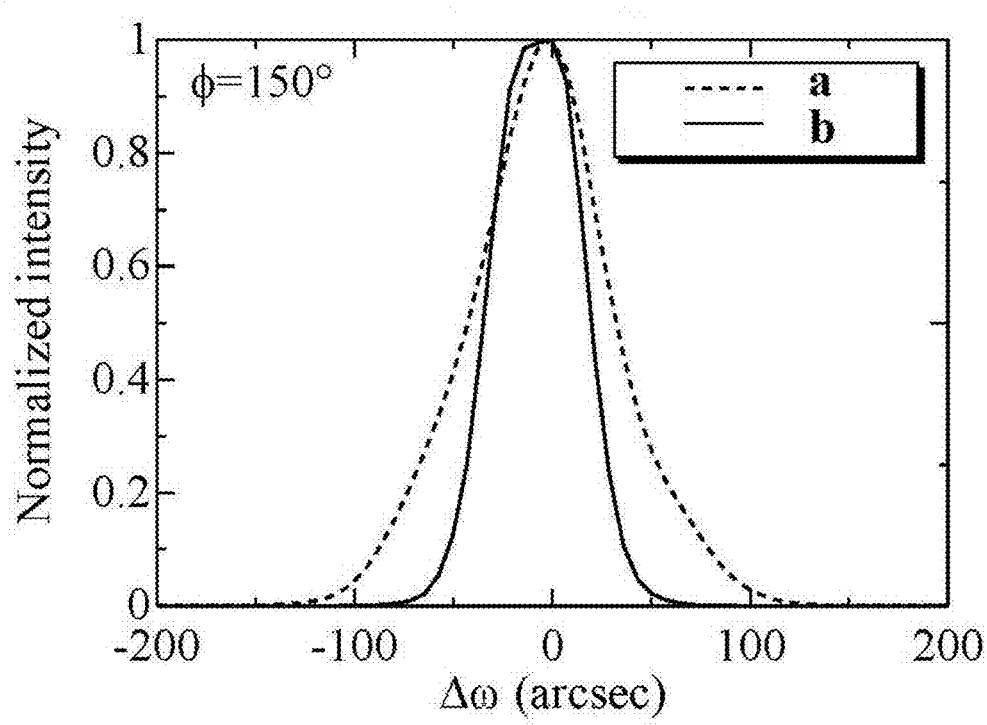
FIG. 23 is a diagram showing normalized X-ray diffraction patterns obtained by performing X-ray rocking curve measurement of {10–12} plane diffraction for the nitride semiconductor substrate of sample 3 under different measurement conditions.

Results of the substrate of sample 3 will be described with reference to Table 6 and FIG. 23. FIG. 23 is a diagram showing normalized X-ray diffraction patterns of the nitride semiconductor substrate of sample 3 obtained by performing the X-ray rocking curve measurement of {10–12} plane diffraction under the different measurement conditions.

As shown in Table 6 and FIG. 23, when the measurement was performed from a direction that formed an angle of 150° with respect to the a-axis in the substrate of sample 3, FWHM1$_{\{10\text{-}12\}}$ under the wide measurement region conditions was large and was more than 70 arcsecs. Also, when diffraction was measured with respect to equivalent crystal planes in the substrate of sample 3 from three directions, there was a variation in FWHM1$_{\{10\text{-}12\}}$, and a difference between the largest value of FWHM1$_{\{10\text{-}12\}}$ and the smallest value of FWHM1$_{\{10\text{-}12\}}$ was more than 20 arcsecs.

As shown in FIG. 23, when the measurement was performed from the direction that formed an angle of 150° with respect to the a-axis in the substrate of sample 3, the {10–12} diffraction pattern under the wide measurement region conditions was wider than the {10–12} diffraction pattern under the narrow measurement region conditions.

Accordingly, as shown in Table 6, when the measurement was performed from the direction that formed an angle of 150° with respect to the a-axis in the substrate of sample 3, the ratio of FWHM2$_{\{10\text{-}12\}}$ to FWHM1$_{\{10\text{-}12\}}$ was less than 80%.

<Sample 1: 2 Cycles>

Figure 22:
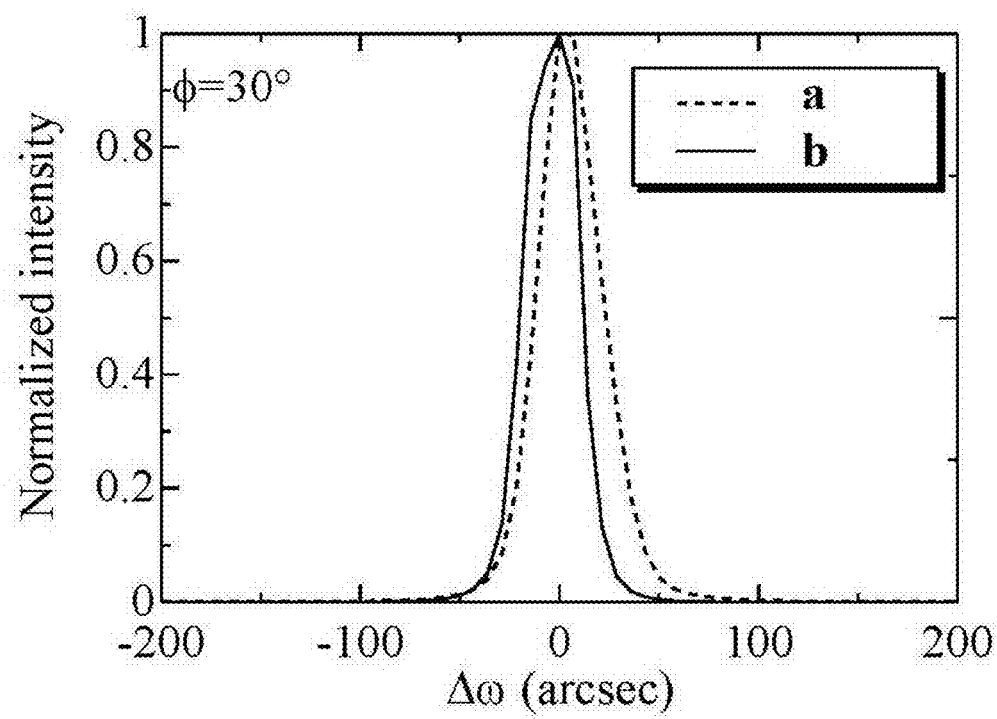
FIG. 22 is a diagram showing normalized X-ray diffraction patterns obtained by performing X-ray rocking curve measurement of {10–12} plane diffraction for the nitride semiconductor substrate of sample 1 under different measurement conditions.

Results of the substrate of sample 1 will be described with reference to Table 6 and FIG. 22. FIG. 22 is a diagram showing normalized X-ray diffraction patterns of the nitride semiconductor substrate of sample 1 obtained by performing the X-ray rocking curve measurement of {10–12} plane diffraction under the different measurement conditions.

As shown in Table 6 and FIG. 22, FWHM1$_{\{10\text{-}12\}}$ under the wide measurement region conditions was 40 arcsecs or less in the substrate of sample 3. Also, when diffraction was measured with respect to equivalent crystal planes in the substrate of sample 3 from three directions, variation in FWHM1$_{\{10\text{-}12\}}$ was small, and a difference between the largest value of FWHM1$_{\{10\text{-}12\}}$ and the smallest value of FWHM1$_{\{10\text{-}12\}}$ was 9 arcsecs or less.

As shown in FIG. 22, in the substrate of sample 1, the {10–12} diffraction pattern did not become so wide even under the wide measurement region conditions.

Accordingly, as shown in Table 6, the ratio of FWHM2$_{\{10\text{-}12\}}$ to FWHM1$_{\{10\text{-}12\}}$ was 80% or more in the substrate of sample 1.

Also, in the substrate of sample 1, the main surface did not have defects, and accordingly, the ratio of FWHM2$_{\{10\text{-}12\}}$ to FWHM1$_{\{10\text{-}12\}}$ was 100% or less.

(3) Summary of Results of Samples 1 and 2

As for samples 1 and 2 described above, the first growth condition was adjusted so as to satisfy the formula (1) in the three-dimensional growth step. Therefore, it was possible to reliably make the c-plane disappear during the growth process of the three-dimensional growth layer. By reliably making the c-plane disappear, it was possible to reliably bend dislocations at positions at which inclined interfaces of the three-dimensional growth layer were exposed. It was confirmed that consequently, the dislocation density in the main surface of the substrate was efficiently lowered.

Further, the cycle including the three-dimensional growth step and the flattening step was repeated a plurality of times for sample 1. Therefore, dislocations remaining in the flattening layer formed in the first cycle were further bent and locally collected in the second cycle. It was confirmed that consequently, the dislocation density in sample 1 for which the cycle was performed twice was lower than the dislocation density in sample 2 for which the cycle was performed once.

Also, in sample 1, the average distance between closest mountains in the second laminated unit was longer than the average distance between closest mountains in the first laminated unit. Therefore, dislocations bent and propagated a longer distance in the second cycle than in the first cycle. It was confirmed that consequently, the density of dislocation-free regions that were 50 μm square was increased.

Also, in sample 1, the average distance between closest mountains in the second laminated unit was about 209 μm. Therefore, at least a distance longer than 100 μm was secured for the dislocations to bend and propagate in the second cycle. It was confirmed that consequently, dislocation-free regions that were at least 100 μm square were formed in at least a portion of the surface of the flattening layer formed in the second cycle. Also, it was confirmed that the density of dislocation-free regions that were 100 μm square and did not overlap each other in the main surface was 100 regions/cm$^2$ or more.

It was confirmed that, in samples 1 and 2, the radius of curvature of the c-plane of the substrate was greater than the radius of curvature of the c-plane in the base substrate due to the stress offset effect of the high oxygen concentration region, and variation in the off-angle of the c-axis in the substrate was smaller than variation in the off-angle of the c-axis in the base substrate.

Also, in samples 1 and 2, not only the dislocation density was lowered and variation in the off-angle was reduced, but also all of the above-described crystal quality factors that determine the full width at half maximum were good in a well-balanced manner.

It was confirmed that consequently, FWHMb was 32 arcsecs or less in the X-ray rocking curve measurement of (0002) plane diffraction performed for the substrates of samples 1 and 2. Furthermore, it was confirmed that (FWHMa−FWHMb)/FWHMa was 30% or less in samples 1 and 2 because the radius of curvature of the c-plane was large and the above-described crystal quality factors were good in a well-balanced manner across the entire region irradiated with X-rays even when the width of the incident side slit in the ω direction was 1 mm.

Furthermore, it was confirmed that, in the X-ray rocking curve measurement of {10−12} plane diffraction performed for the substrate of sample 1, $FWHM1_{\{10\text{-}12\}}$ was 50 arcsecs or less. Also, it was confirmed that, when diffraction was measured with respect to equivalent crystal planes represented as {10−12} planes in the substrate of sample 1 from three directions, the difference between the largest value of $FWHM1_{\{10\text{-}12\}}$ and the smallest value of $FWHM1_{\{10\text{-}12\}}$ was 9 arcsecs or less. Also, it was confirmed that, in the substrate 10 of sample 1, the ratio of $FWHM2_{\{10\text{-}12\}}$ to $FWHM1_{\{10\text{-}12\}}$ was 80% or more.

PREFERABLE ASPECTS OF THE PRESENT DISCLOSURE

Hereinafter, preferable aspects of the present disclosure will be supplementarily described.
Supplementary Note 1
A nitride semiconductor substrate that has a diameter of 2 inches or more and includes a main surface for which the closest low index crystal plane is a (0001) plane,
wherein the ratio of $FWHM2_{\{10\text{-}12\}}$ to $FWHM1_{\{10\text{-}12\}}$ is 80% or more,
$FWHM1_{\{10\text{-}12\}}$ and $FWHM2_{\{10\text{-}12\}}$ each representing a full width at half maximum of {10-12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis,
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction,
$FWHM2_{\{10\text{-}12\}}$ being measured under the same incident conditions as those in the measurement of $FWHM1_{\{10\text{-}12\}}$, and
$FWHM2_{\{10\text{-}12\}}$ being measured under the following beam receiving conditions: X-rays are received by the detector via a 3-bounce Ge (220) analyzer crystal that includes an inlet aperture having a width of 6.54 mm in the ω direction.
Supplementary Note 2
The nitride semiconductor substrate according to Supplementary Note 1, wherein the ratio of $FWHM2_{\{10\text{-}12\}}$ to $FWHM1_{\{10\text{-}12\}}$ is 100% or less.
Supplementary Note 3
The nitride semiconductor substrate according to Supplementary Note 1 or 2,
wherein, when diffractions are measured with respect to equivalent crystal planes that are represented as {10-12} planes from three directions rotated by 60° from each other in a circumferential direction about the normal at the center of the main surface, a difference between the largest value of $FWHM1_{\{10\text{-}12\}}$ and the smallest value of $FWHM1_{\{10\text{-}12\}}$ is 9 arcsecs or less.
Supplementary Note 4
A nitride semiconductor substrate that has a diameter of 2 inches or more and includes a main surface for which the closest low index crystal plane is a (0001) plane,
wherein, when diffractions are measured with respect to equivalent crystal planes that are represented as {10-12} planes from three directions rotated by 60° from each other in a circumferential direction about the normal at the center of the main surface, a difference between the largest value of $FWHM1_{\{10\text{-}12\}}$ and the smallest value of $FWHM1_{\{10\text{-}12\}}$ is 9 arcsecs or less,
$FWHM1_{\{10\text{-}12\}}$ representing a full width at half maximum of {10-12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis, and
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction.

Supplementary Note 5
The nitride semiconductor substrate according to any one of Supplementary Notes 1 to 4, wherein $FWHM1_{\{10\text{-}12\}}$ is 50 arcsecs or less.

Supplementary Note 6
A nitride semiconductor substrate that has a diameter of 2 inches or more and includes a main surface for which the closest low index crystal plane is a (0001) plane,
wherein $FWHM1_{\{10\text{-}12\}}$ is 50 arcsecs or less,
$FWHM1_{\{10\text{-}12\}}$ representing a full width at half maximum of {10–12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis, and
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction.

Supplementary Note 7
The nitride semiconductor substrate according to any one of Supplementary Notes 1 to 6,
wherein, when a dislocation density is determined based on a dark spot density by observing the main surface of the nitride semiconductor substrate using a multiphoton excitation microscope in a field of view that is 250 μm square, the main surface does not include a region that has a dislocation density of $1 \times 10^6$ cm$^{-2}$ or more, and regions that have a dislocation density lower than $7 \times 10^5$ cm$^{-2}$ constitute 80% or more of the main surface, and
the main surface includes dislocation-free regions that are 50 μm square and do not overlap each other at a density of 1000 regions/cm$^2$ or more.

Supplementary Note 8
A nitride semiconductor substrate that has a diameter of 2 inches or more and includes a main surface for which the closest low index crystal plane is a (0001) plane,
wherein, when a dislocation density is determined based on a dark spot density by observing the main surface of the nitride semiconductor substrate using a multiphoton excitation microscope in a field of view that is 250 μm square, the main surface does not include a region that has a dislocation density of $1 \times 10^6$ cm$^{-2}$ or more, and regions that have a dislocation density lower than $7 \times 10^5$ cm$^{-2}$ constitute 80% or more of the main surface, and
the main surface includes dislocation-free regions that are 50 μm square and do not overlap each other at a density of 1000 regions/cm$^2$ or more.

Supplementary Note 9
The nitride semiconductor substrate according to Supplementary Note 7 or 8,
wherein the number of dislocations that are present in a rectangular region that is sandwiched between mutually opposed sides of a pair of dislocation-free regions that are closest to each other among the dislocation-free regions is 90 or less.

Supplementary Note 10
The nitride semiconductor substrate according to any one of Supplementary Notes 7 to 9,
wherein the main surface includes dislocation-free regions that are 100 μm square and do not overlap each other at a density of 100 regions/cm$^2$ or more.

Supplementary Note 11
The nitride semiconductor substrate according to any one of Supplementary Notes 1 to 10,
wherein, when X-ray rocking curve measurement of (0002) plane diffraction is performed by irradiating the main surface with Cu Kα1 X-rays via a two-crystal monochromator of a Ge (220) plane and an incident side slit,
a full width at half maximum FWHMb of the (0002) plane diffraction when the width of the incident side slit in a ω direction is 0.1 mm is 32 arcsecs or less, and
a difference FWHMa–FWHMb obtained by subtracting FWHMb from FWHMa is 30% or less of FWHMa, FWHMa representing a full width at half maximum of the (0002) plane diffraction when the width of the incident side slit in the ω direction is 1 mm.

Supplementary Note 12
A nitride semiconductor substrate that has a diameter of 2 inches or more and includes a main surface for which the closest low index crystal plane is a (0001) plane,
wherein, when X-ray rocking curve measurement of (0002) plane diffraction is performed by irradiating the main surface with Cu Kα1 X-rays via a two-crystal monochromator of a Ge (220) plane and an incident side slit,
a full width at half maximum FWHMb of the (0002) plane diffraction when the width of the incident side slit in a ω direction is 0.1 mm is 32 arcsecs or less, and
a difference FWHMa–FWHMb obtained by subtracting FWHMb from FWHMa is 30% or less of FWHMa, FWHMa representing a full width at half maximum of the (0002) plane diffraction when the width of the incident side slit in the ω direction is 1 mm.

Supplementary Note 13
The nitride semiconductor substrate according to Supplementary Note 11 or 12,
wherein FWHMa–FWHMb is 30% or less of FWHMa at a plurality of measurement points that are set at predetermined intervals in a <1-100> axis direction and a <11-20> axis direction in the main surface.

Supplementary Note 14
The nitride semiconductor substrate according to any one of Supplementary Notes 11 to 13,
wherein, when the X-ray rocking curve measurement of (0002) plane diffraction is performed at a plurality of measurement points set at 5 mm intervals in the main surface with the width of the incident side slit in the ω direction set to 0.1 mm, the full width at half maximum FWHMb of the (0002) plane diffraction is 32 arcsecs or less at 90% or more of all the measurement points.

Supplementary Note 15
A laminated structure including:
a base substrate that is constituted by a single crystal of a group III nitride semiconductor, has a mirror-finished main surface, and in which a low index crystal plane closest to the main surface is a (0001) plane;
a laminated unit that includes a low oxygen concentration region and a high oxygen concentration region, the low oxygen concentration region being provided above the main surface of the base substrate and constituted by a single crystal of a group III nitride semiconductor, the high oxygen concentration region being provided on the low oxygen concentration region and constituted by a single crystal of a group III nitride semiconductor; and a top low oxygen concentration region that is provided above the laminated unit and is constituted by a single crystal of a group III nitride semiconductor, wherein the oxygen concentration in the high oxygen concentration region is higher than oxygen concentrations in the low oxygen concentration region and the top low oxygen concentration region, and a plurality of the laminated units are provided repeatedly in a thickness direction between the base substrate and the top low oxygen concentration region.

Supplementary Note 16

The laminated structure according to Supplementary Note 15, wherein an upper surface of the low oxygen concentration region in each of the plurality of laminated units includes a plurality of valleys and a plurality of mountains, and in the second and higher laminated units of the plurality of laminated units, when an arbitrary cross section perpendicular to the main surface is observed, an average distance between a pair of mountains is longer than that in the first laminated unit of the plurality of laminated units, the pair of mountains being spaced apart from each other in a direction extending along the main surface and closest to each other among the plurality of peaks with one of the plurality of valleys sandwiched between the pair of mountains.

Supplementary Note 17

The laminated structure according to Supplementary Note 15 or 16, wherein the average distance between the pair of closest mountains gradually increases toward an upper side of the plurality of laminated units such that a higher laminated unit has a longer average distance between the pair of closest mountains.

Aspects of a manufacturing method according to the present disclosure include those described in the following supplementary notes, for example.

Supplementary Note 18

A method for manufacturing a nitride semiconductor substrate using a vapor phase growth method, the method including:

a step (a) of preparing a base substrate that is constituted by a single crystal of a group III nitride semiconductor, has a mirror-finished main surface, and in which a low index crystal plane closest to the main surface is a (0001) plane;

a step (b) of growing a three-dimensional growth layer by epitaxially growing a single crystal of a group III nitride semiconductor that has a top surface at which a (0001) plane is exposed, above the main surface of the base substrate, generating a plurality of recessed portions formed by inclined interfaces other than the (0001) plane in the top surface, and gradually expanding the inclined interfaces toward an upper side of the main surface of the base substrate to make the (0001) plane disappear from the top surface at least once; and a step (c) of growing a flattening layer that has a mirror-finished surface by epitaxially growing a single crystal of a group III nitride semiconductor on the three-dimensional growth layer to make the inclined interfaces disappear, wherein a cycle that includes the step (b) and the step (c) is performed a plurality of times.

Supplementary Note 19

The method for manufacturing a nitride semiconductor substrate according to Supplementary Note 18, wherein, in the step (b) of each of the plurality of cycles, a plurality of valleys and a plurality of peaks are formed at a surface of the three-dimensional growth layer by generating the plurality of recessed portions in the top surface of the single crystal to make the (0001) plane disappear, and in the step (b) of the second and the following cycles of the plurality of cycles, when an arbitrary cross section perpendicular to the main surface is observed, an average distance between a pair of peaks is longer than that in the step (b) of the first cycle of the plurality of cycles, the pair of peaks being spaced apart from each other in a direction extending along the main surface and closest to each other among the plurality of peaks with one of the plurality of valleys sandwiched therebetween.

Supplementary Note 20

The method for manufacturing a nitride semiconductor substrate according to Supplementary Note 19, wherein, in the step (b) of each of the plurality of cycles, the average distance between the pair of closest peaks gradually increases as the number of repetitions of the cycle increases.

Supplementary Note 21

The method for manufacturing a nitride semiconductor substrate according to Supplementary Note 19 or 20, wherein, in the step (b) of each of the plurality of cycles, the average distance between the pair of closest peaks is more than 100 μm.

Supplementary Note 22

The method for manufacturing a nitride semiconductor substrate according to any one of Supplementary Notes 19 to 21, wherein, in the step (b) of at least the last cycle of the plurality of cycles, the average distance between the pair of closest peaks is more than 200 μm.

Supplementary Note 23

The method for manufacturing a nitride semiconductor substrate according to Supplementary Note 21 or 22, wherein, in the step (b) of each of the plurality of cycles, the average distance between the pair of closest peaks is less than 800 μm.

Supplementary Note 24

The method for manufacturing a nitride semiconductor substrate according to any one of Supplementary Notes 18 to 23, wherein, in the step (a), a root mean square roughness of the main surface of the base substrate is 1 nm or more.

Supplementary Note 25

The method for manufacturing a nitride semiconductor substrate according to any one of Supplementary Notes 18 to 24, wherein crystal strain that is introduced through processing of the base substrate is left on the main surface side of the base substrate in the step (a), and when X-ray rocking curve measurement is performed with an incident angle with respect to the main surface of the base substrate after the processing set to 2°, a full width at half maximum of (10-10) plane diffraction is larger than the full width at half maximum of the base substrate before the processing, and is 60 arcsecs or more and 200 arcsecs or less.

Supplementary Note 26

The method for manufacturing a nitride semiconductor substrate according to any one of Supplementary Notes 18 to 25,
- wherein, in the step (b) of each of the plurality of cycles, after the (0001) plane has disappeared from the surface, growth of the three-dimensional growth layer is continued over a predetermined thickness while a state in which the inclined interfaces occupy a larger area of the surface than the (0001) plane is maintained.

Supplementary Note 27

The method for manufacturing a nitride semiconductor substrate according to any one of Supplementary Notes 18 to 26, further including:
- a step (d) of forming a main growth layer with a predetermined thickness on the flattening layer having the mirror-finished surface after the step (c) of the last cycle of the plurality of cycles, the main growth layer being grown with the (0001) plane serving as a growth surface; and
- a step (e) of slicing at least one nitride semiconductor substrate from the main growth layer.

Supplementary Note 28

The method for manufacturing a nitride semiconductor substrate according to Supplementary Note 27,
- wherein, in the step (a), the base substrate in which the (0001) plane is curved in a concave spherical shape with respect to the main surface is prepared, and
- in the step (e), a radius of curvature of the (0001) plane in the nitride semiconductor substrate is made larger than a radius of curvature of the (0001) plane in the base substrate.

Supplementary Note 29

The method for manufacturing a nitride semiconductor substrate according to any one of Supplementary Notes 18 to 28,
- wherein, in the step (b) of each of the plurality of cycles, $\{11\text{-}2\ \mu m\}$ planes satisfying $m>3$ are generated as the inclined interfaces.

Other aspects of the manufacturing method according to the present disclosure may include those described in the following supplementary notes, for example.

Supplementary Note 30

A method for manufacturing a nitride semiconductor substrate using a vapor phase growth method, the method including:
- a step (a) of preparing a base substrate that is constituted by a single crystal of a group III nitride semiconductor, has a mirror-finished main surface, and in which a low index crystal plane closest to the main surface is a (0001) plane;
- a step (b) of homoepitaxially growing a single crystal of a group III nitride semiconductor above the main surface such that the crystal becomes flat;
- a step (c) of growing a three-dimensional growth layer by generating a plurality of recessed portions formed by inclined interfaces other than a (0001) plane in a surface of the homoepitaxially grown flat crystal, and gradually expanding the inclined interfaces as the crystal growth progresses to make the (0001) plane disappear at least once from crystal growth interfaces; and
- a step (d) of growing a flattening layer that includes a mirror-finished surface constituted by a (0001) plane by further epitaxially growing a single crystal of a group III nitride semiconductor on the three-dimensional growth layer to make inclined interfaces disappear,
- wherein a cycle that includes the step (c) and the step (d) is performed a plurality of times.

Supplementary Note 31

The method for manufacturing a nitride semiconductor substrate according to Supplementary Note 30,
- wherein, in the step (c) of the second and the following cycles of the plurality of cycles, when an arbitrary cross section perpendicular to the main surface is observed when the (0001) plane has disappeared from the crystal growth interfaces, an average distance between a pair of peaks that are present in a surface of the three-dimensional growth layer is longer than an average distance in the step (c) of a previous cycle, the pair of peaks being spaced apart from each other in a direction extending along the main surface and closest to each other among a plurality of peaks that are present in the surface of the three-dimensional growth layer, with one of a plurality of valleys present in the surface of the three-dimensional growth layer sandwiched between the pair of peaks.

It is possible to make Supplementary Notes 20 to 29 subordinate to Supplementary Note 30 or 31 by replacing (b) with (c), replacing (c) with (d), replacing (d) with (e), and replacing (e) with (f).

REFERENCE SIGNS LIST

10 Base substrate
30 First layer
40 Second layer
50 Nitride semiconductor substrate (substrate)

The invention claimed is:

1. A nitride semiconductor substrate that has a diameter of 2 inches or more and includes a main surface for which the closest low index crystal plane is a (0001) plane,
- wherein the ratio of $FWHM2_{\{10\text{-}12\}}$ to $FWHM1_{\{10\text{-}12\}}$ is 80% or more,
- $FWHM1_{\{10\text{-}12\}}$ and $FWHM2_{\{10\text{-}12\}}$ each representing a full width at half maximum of $\{10\text{-}12\}$ plane diffraction measured using X-ray rocking curve measurement,
- $FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis,
- $FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction,
- $FWHM2_{\{10\text{-}12\}}$ being measured under the same incident conditions as those in the measurement of $FWHM1_{\{10\text{-}12\}}$, and
- $FWHM2_{\{10\text{-}12\}}$ being measured under the following beam receiving conditions: X-rays are received by the detector via a 3-bounce Ge (220) analyzer crystal that includes an inlet aperture having a width of 6.54 mm in the ω direction.

2. The nitride semiconductor substrate according to claim 1,
wherein the ratio of $FWHM2_{\{10\text{-}12\}}$ to $FWHM1_{\{10\text{-}12\}}$ is 100% or less.

3. The nitride semiconductor substrate according to claim 1,
wherein, when diffractions are measured with respect to equivalent crystal planes that are represented as {10-12} planes from three directions rotated by 60° from each other in a circumferential direction about the normal at the center of the main surface, a difference between the largest value of $FWHM1_{\{10\text{-}12\}}$ and the smallest value of $FWHM1_{\{10\text{-}12\}}$ is 9 arcsecs or less.

4. A nitride semiconductor substrate that has a diameter of 2 inches or more and includes a main surface for which the closest low index crystal plane is a (0001) plane,
wherein, when diffractions are measured with respect to equivalent crystal planes that are represented as {10-12} planes from three directions rotated by 60° from each other in a circumferential direction about the normal at the center of the main surface, a difference between the largest value of $FWHM1_{\{10\text{-}12\}}$ and the smallest value of $FWHM1_{\{10\text{-}12\}}$ is 9 arcsecs or less,
$FWHM1_{\{10\text{-}12\}}$ representing a full width at half maximum of {10-12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis, and
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction.

5. The nitride semiconductor substrate according to claim 1,
wherein $FWHM1_{\{10\text{-}12\}}$ is 50 arcsecs or less.

6. A nitride semiconductor substrate that has a diameter of 2 inches or more and includes a main surface for which the closest low index crystal plane is a (0001) plane,
wherein $FWHM1_{\{10\text{-}12\}}$ is 50 arcsecs or less,
$FWHM1_{\{10\text{-}12\}}$ representing a full width at half maximum of {10-12} plane diffraction measured using X-ray rocking curve measurement,
$FWHM1_{\{10\text{-}12\}}$ being measured under the following incident conditions: the center of the main surface is irradiated with Cu Kα1 X-rays emitted from a Cu X-ray source via an X-ray mirror that makes X-rays into parallel beam, a 2-bounce Ge (220) monochromator, and an incident side aperture in this order, the incident side aperture having a width of 1.4 mm in a ω direction that is the direction of a rotation angle about a rotation axis of a goniometer, and a length of 12 mm in a direction parallel to the rotation axis, and
$FWHM1_{\{10\text{-}12\}}$ being measured under the following beam receiving conditions: X-rays are received by a detector not via an analyzer crystal in a state where a beam receiving side slit is open, the detector including an aperture that has a width of 14.025 mm in the ω direction.

7. A laminated structure comprising:
a base substrate that is constituted by a single crystal of a group III nitride semiconductor, has a mirror-finished main surface, and in which a low index crystal plane closest to the main surface is a (0001) plane;
a laminated unit that includes a low oxygen concentration region and a high oxygen concentration region, the low oxygen concentration region being provided above the main surface of the base substrate and constituted by a single crystal of a group III nitride semiconductor, the high oxygen concentration region being provided on the low oxygen concentration region and constituted by a single crystal of a group III nitride semiconductor; and
a top low oxygen concentration region that is provided above the laminated unit and is constituted by a single crystal of a group III nitride semiconductor,
wherein the oxygen concentration in the high oxygen concentration region is higher than oxygen concentrations in the low oxygen concentration region and the top low oxygen concentration region, and
a plurality of the laminated units are provided repeatedly in a thickness direction between the base substrate and the top low oxygen concentration region.

8. The laminated structure according to claim 7,
wherein an upper surface of the low oxygen concentration region in each of the plurality of laminated units includes a plurality of valleys and a plurality of mountains, and
in the second and higher laminated units of the plurality of laminated units, when an arbitrary cross section perpendicular to the main surface is observed, an average distance between a pair of mountains is longer than that in the first laminated unit of the plurality of laminated units, the pair of mountains being spaced apart from each other in a direction extending along the main surface and closest to each other among the plurality of peaks with one of the plurality of valleys sandwiched between the pair of mountains.

9. A method for manufacturing a nitride semiconductor substrate using a vapor phase growth method, the method comprising:
a step (a) of preparing a base substrate that is constituted by a single crystal of a group III nitride semiconductor, has a mirror-finished main surface, and in which a low index crystal plane closest to the main surface is a (0001) plane;
a step (b) of homoepitaxially growing a single crystal of a group III nitride semiconductor above the main surface such that the crystal becomes flat;
a step (c) of growing a three-dimensional growth layer by generating a plurality of recessed portions formed by inclined interfaces other than a (0001) plane in a surface of the homoepitaxially grown flat crystal, and gradually expanding the inclined interfaces as the crystal growth progresses to make the (0001) plane disappear at least once from crystal growth interfaces; and
a step (d) of growing a flattening layer that includes a mirror-finished surface constituted by a (0001) plane by further epitaxially growing a single crystal of a group III nitride semiconductor on the three-dimensional growth layer to make inclined interfaces disappear, wherein a cycle that includes the step (c) and the step (d) is performed a plurality of times.

* * * * *